United States Patent [19]
Isono et al.

[11] Patent Number: 5,164,761
[45] Date of Patent: Nov. 17, 1992

[54] BATTERY SYSTEM FOR CAMERA

[75] Inventors: Kenji Isono, Narashino; Tetsuro Goto, Funabashi, both of Japan

[73] Assignee: Nikon Corporation, Tokyo, Japan

[21] Appl. No.: 833,494

[22] Filed: Feb. 10, 1992

[30] Foreign Application Priority Data

Mar. 6, 1991 [JP] Japan .................................. 3-63803
Mar. 7, 1991 [JP] Japan .................................. 3-65367

[51] Int. Cl.[5] ........................ G03B 7/26; G03B 17/28
[52] U.S. Cl. .................................... 354/468; 354/484
[58] Field of Search ................................ 354/468, 484

[56] References Cited

U.S. PATENT DOCUMENTS

| | | | |
|---|---|---|---|
| 4,525,055 | 6/1985 | Yokoo | 354/468 |
| 4,662,736 | 5/1987 | Taniguchi et al. | 354/468 X |
| 5,006,881 | 4/1991 | Kodama | 354/484 |
| 5,081,483 | 1/1992 | Ishimura et al. | 354/468 X |

*Primary Examiner*—Michael L. Gellner
*Assistant Examiner*—Jae N. Noh
*Attorney, Agent, or Firm*—Shapiro and Shapiro

[57] ABSTRACT

There are disclosed a secondary battery detachably mountable on a camera body, a camera body on which such secondary battery is mountable, and a battery system including such secondary battery and such camera body. A system includes a battery pack equipped with a circuit for calculating the charge/discharge amount of the battery and a device for displaying the remaining capacity of the battery obtained from the calculation, the display device being so positioned as to be observable from the rear side of the camera. In another embodiment, a primary battery pack or a secondary battery pack is selectively mounted to the camera body, and a display device on the camera body indicates the remaining capacity of either pack mounted on the camera. In still another embodiment, the calculation of charge/discharge amount is made more precisely, by controlling the timing of calculation according to the on/off timing of loads in the camera such as motors. In another embodiment, the camera body is equipped with a circuit for calculating the charge/discharge amount of battery while the battery pack is provided with a memory for storing its remaining capacity, and information is exchanged between the calculating circuit and the memory. In this manner the remaining capacity can be exactly detected and displayed even when the battery pack is changed.

14 Claims, 40 Drawing Sheets

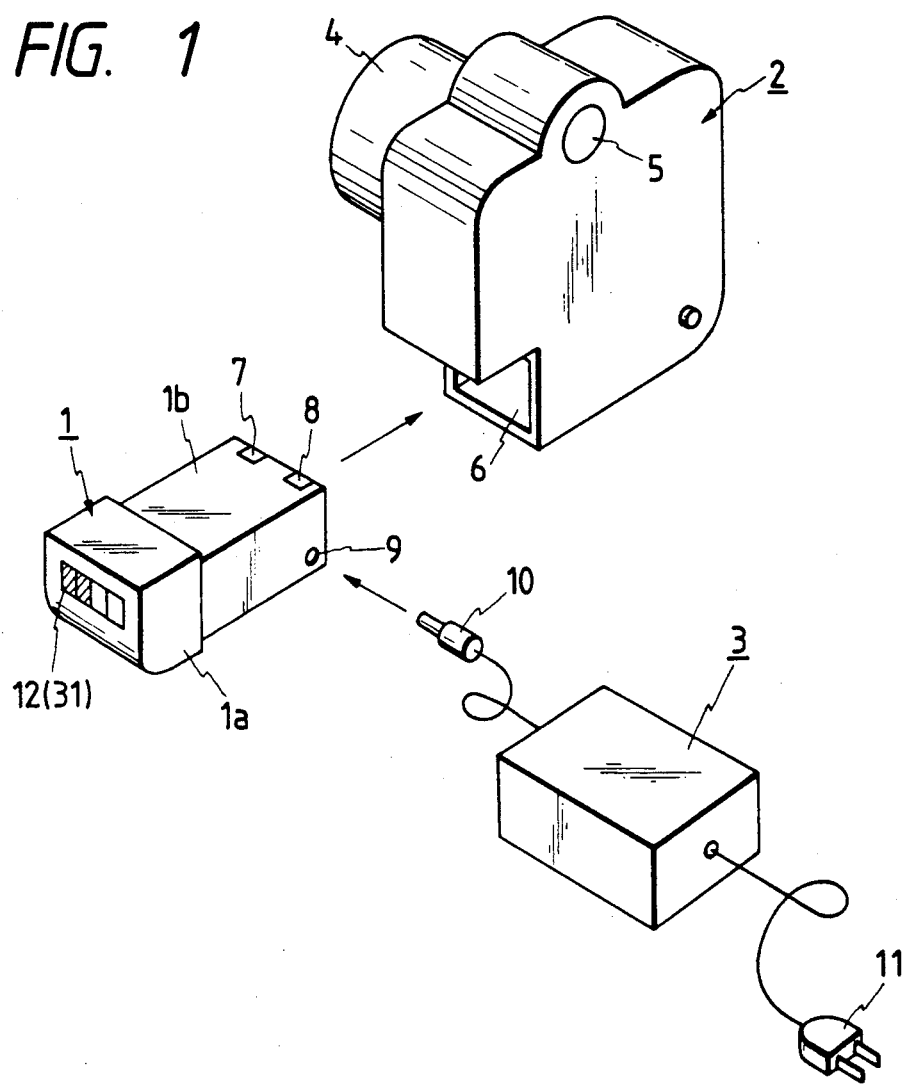
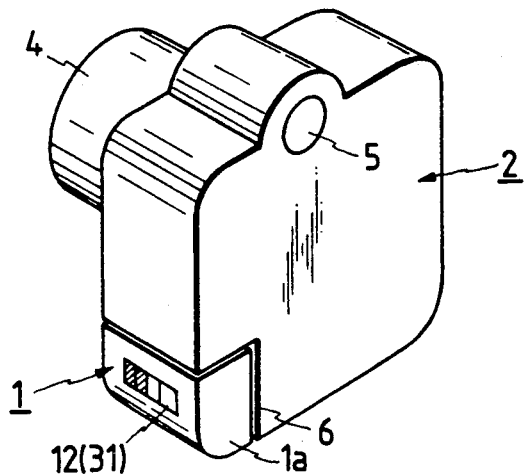

POWER SWITCH 36 ON    POWER SWITCH 36 OFF

POWER SWITCH 36 ON   POWER SWITCH 36 OFF   TIME

A/D VALUE

Tin

Tc Tc Tc Tc — — — — — Tc Tc   TIME

TIME

POWER SWITCH 36 ON

POWER SWITCH 36 OFF

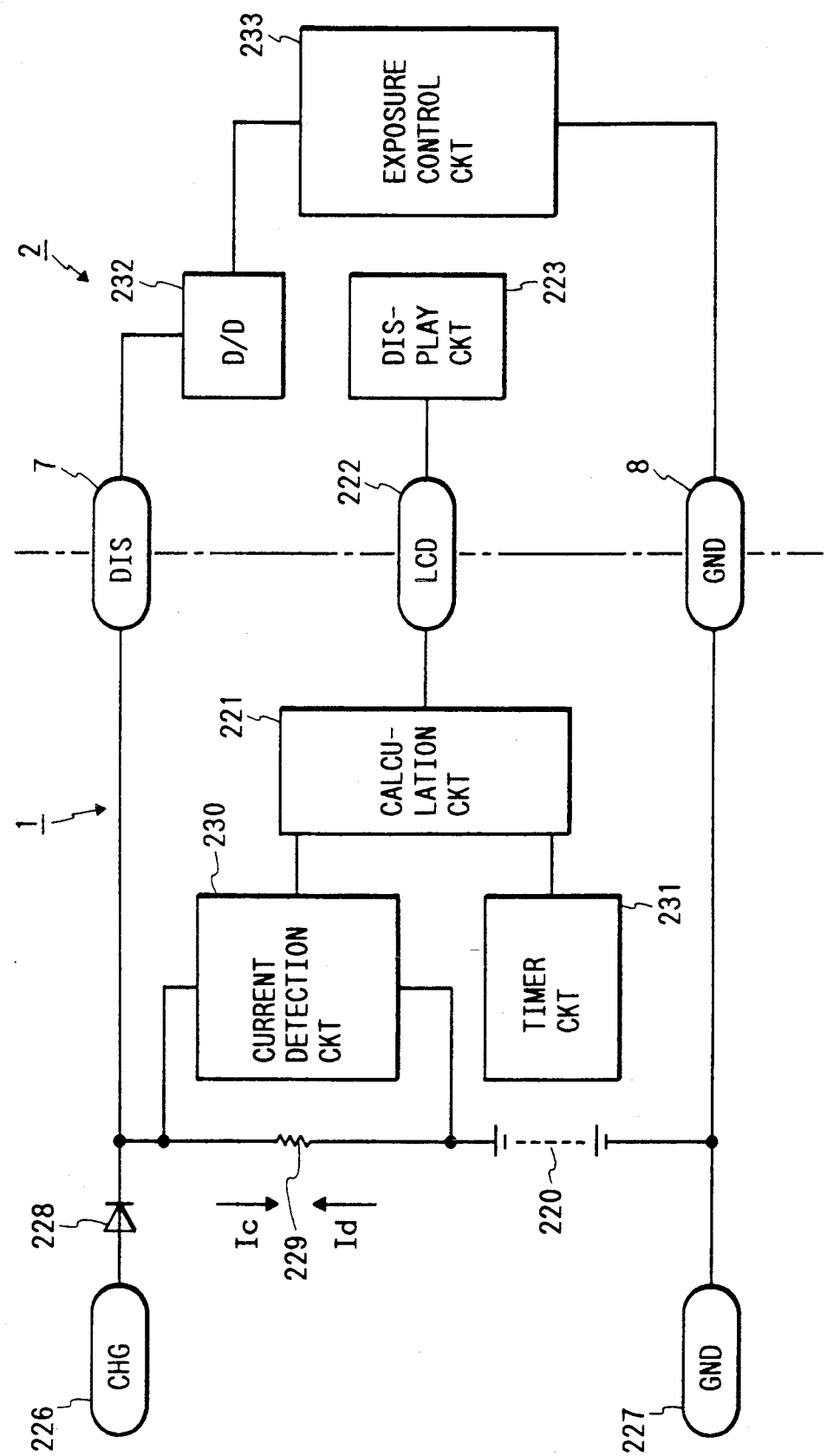

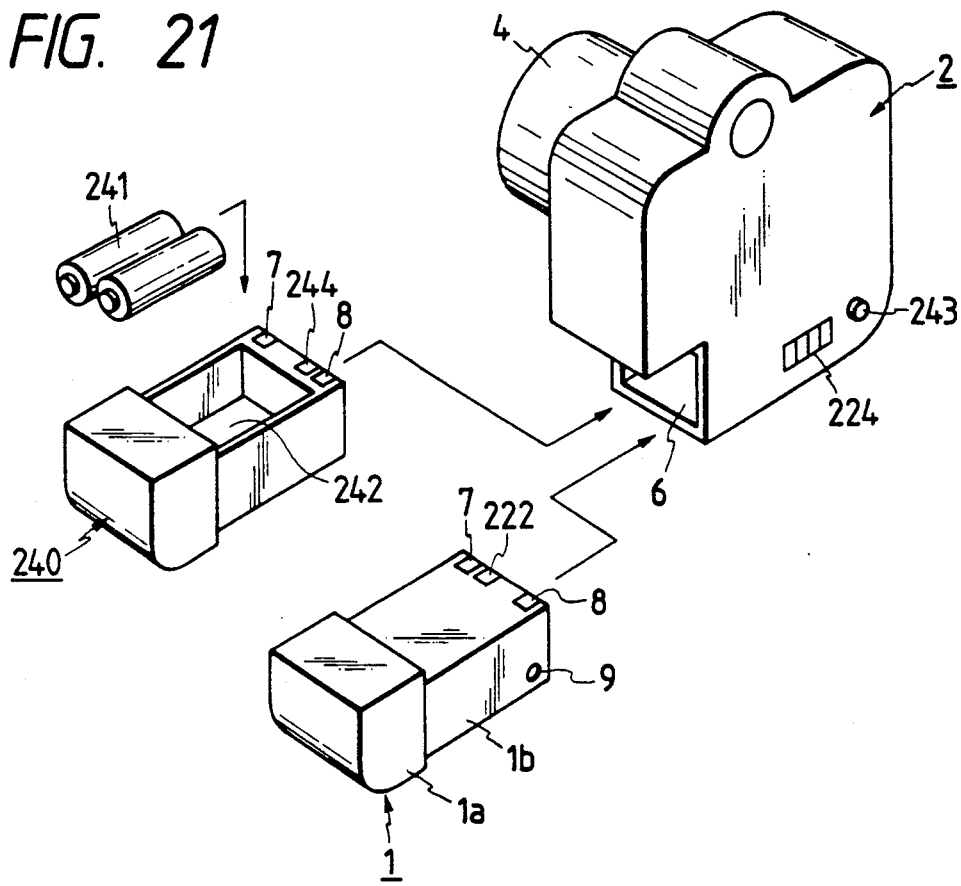
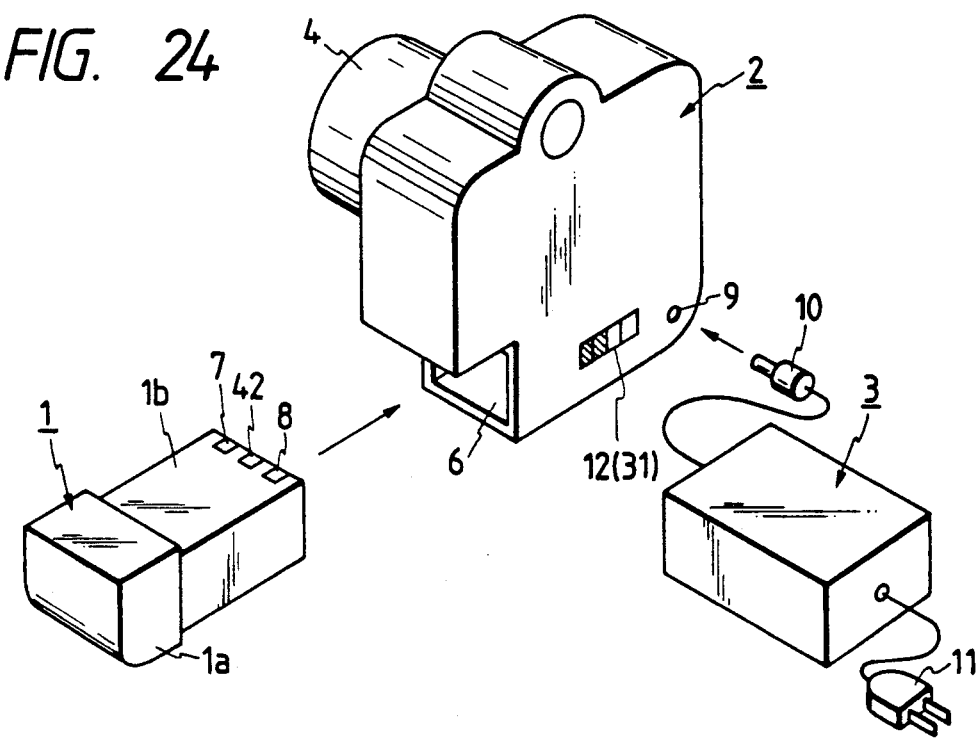

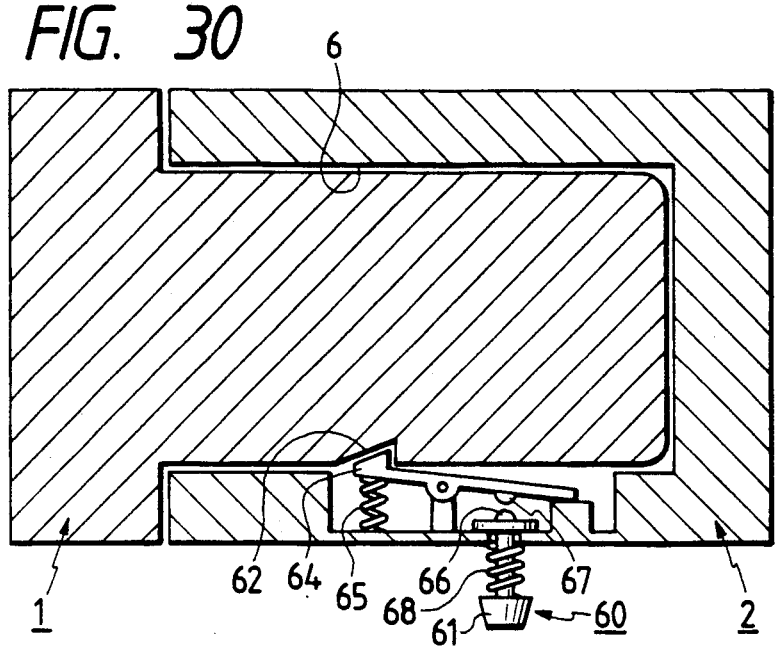
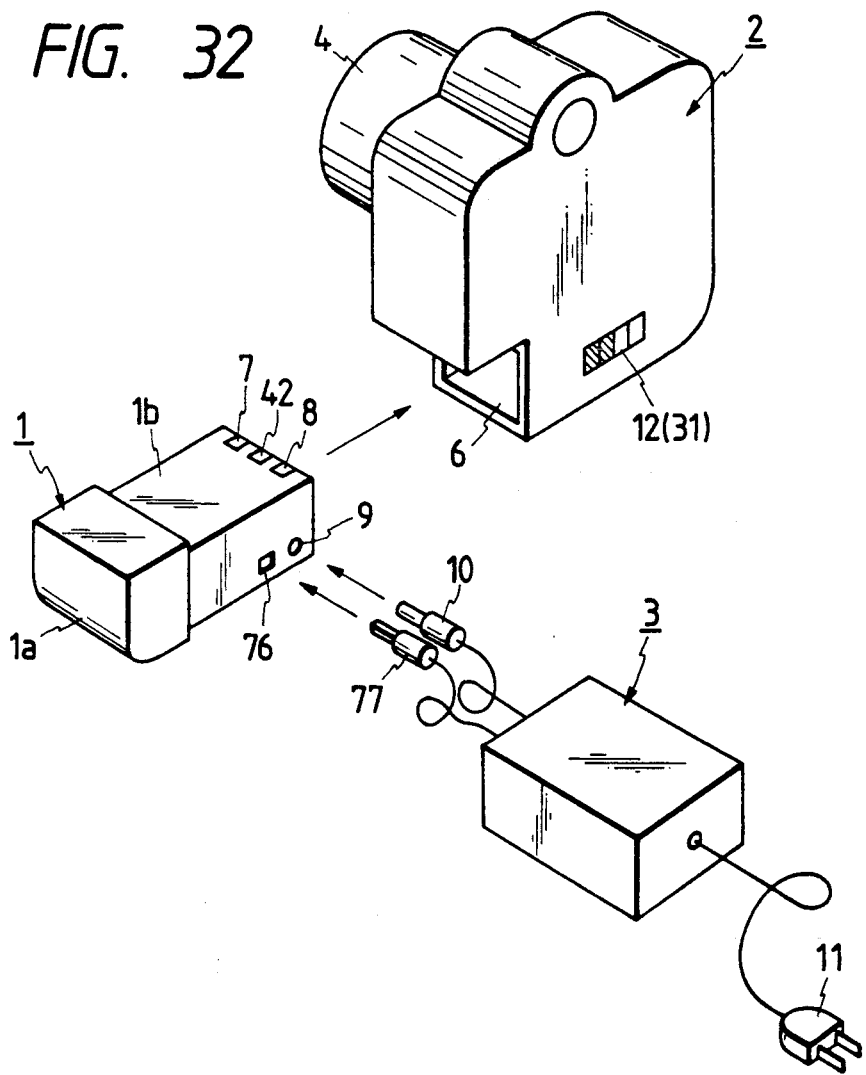

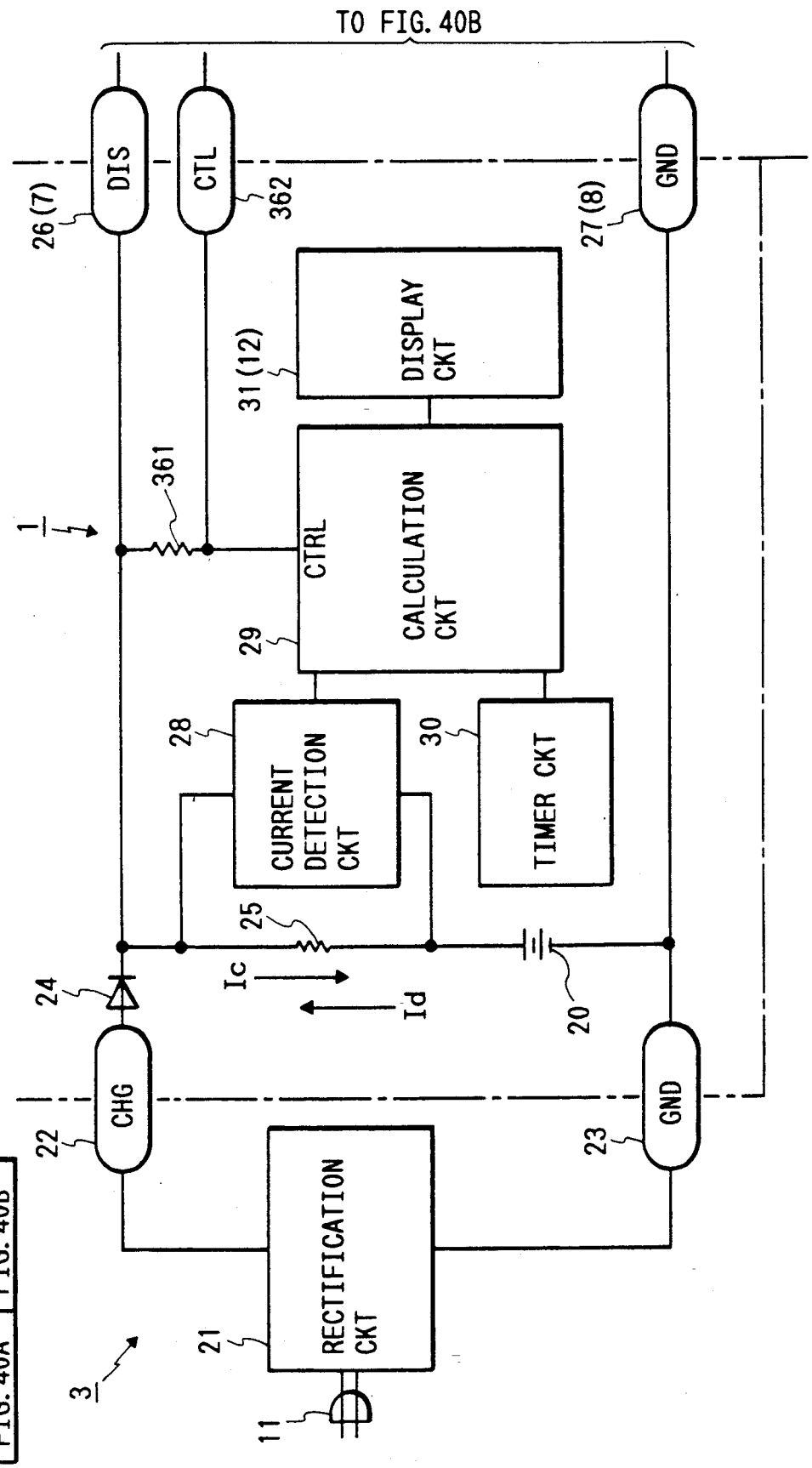

BATTERY SYSTEM FOR CAMERA

BACKGROUND OF THE INVENTION

1. Field of the Invention

The present invention relates to a battery system including a battery pack, for use in a camera for electric power supply to various electric and electronic components provided in the camera body of a still camera, and more particularly to such battery system provided with means for measuring the remaining capacity of the battery.

2. Related Background Art

Also in the field of still cameras, there have recently been marked introductions of electronic systems, as in the equipment of other fields. For this reason, various electric and electronic components, such as focal plane shutter, automatic exposure control mechanism, automatic film winding mechanism etc., are incorporated in the camera body as the loads for battery power source. Such transition toward the electronic systems is imposing various requirements on the battery to be incorporated in the camera body, such as a larger capacity, a lower cost, and a structure of easier use and better appearance.

The battery conventionally used in such still cameras has usually been UM-3 type which relatively easily available, and such battery is either directly loaded in a battery chamber formed in a part of the camera body or loaded in a battery pack that can be loaded into the camera body. The camera utilizing such battery is usually equipped with a simple battery check circuit for detecting the level of exhaustion of battery, and said circuit can be activated by the shutter release button of the camera or by an exclusive checking button and shows the result of checking in the view finder or in an indicator provided on the outside of the camera. The battery checking for detecting the level of exhaustion of UM-3 battery needs only to measure the open terminal voltage of the battery, because of discharge characteristics thereof, and requires only a simple circuit in the camera body.

In such still cameras, however, instead of primary battery that can only be used one time, such as UM-3 battery, there is desired the use of a rechargeable secondary battery pack, such as of nickel-cadmium batteries, because of a lower running cost, superior low temperature characteristics and preference by professional photographers.

SUMMARY OF THE INVENTION

FIGS. 1 and 2 illustrate a battery system of a camera, utilizing a secondary battery pack.

In these drawings, a phototaking lens 4 is mounted on the front face of a camera body 2. A view finder 5 is provided for confirming the object image. The photographer, while looking into said view finder, depresses an unrepresented shutter release button in order to expose the film to the object image.

In the lower part of the camera body 2, there is provided a battery pack chamber 6, in which a secondary battery pack 1 is detachably loaded.

Said secondary battery pack 1, having a resin case incorporating plural nickel-cadmium batteries therein, is provided at the external end thereof with a rectangular head portion 1a for facilitating the mounting into the camera body, also with two electrodes 7, 8 at the end of an insert portion 1b, and with a charging receptacle 9 on a side wall thereof.

Such secondary battery pack 1 is loaded in a lateral direction into a chamber 6 of the camera as shown in FIGS. 1 and 2, whereupon the electrodes 7, 8 contact unrepresented electrodes correspondingly provided in the camera, and various parts thereof are powered by the batteries in the secondary battery pack 1.

When the secondary batteries in said pack 1 are exhausted, the user can recharge said batteries by extracting the pack 1 in lateral direction from the chamber 6 by holding the head portion 1a and inserting a charging plug 10 of a charger 3 into the charging receptacle 9. An AC plug 11 connected to the charger can be inserted into a receptacle of a commercial power line.

Such secondary battery pack 1 is equipped with a circuit (not shown) for calculating the remaining capacity of the nickel-cadmium batteries therein and a display unit 12 for indicating the remaining capacity of said batteries, determined by said circuit. In such nickel-cadmium battery, the remaining capacity can be displayed by integrating the dimension of charging current of the charger 3 and the dimension of discharging current used for powering the internal mechanisms of the camera body. Such remaining capacity display unit 2 is usually composed of a liquid crystal display device including plural segments of so-called bar graph shape and is adapted to indicate the remaining capacity by the length of a bar, based on the result obtained by the remaining capacity detecting circuit. Said display unit 12 may also be composed of a light-emitting diode array, which can be activated by a button actuation. Such display unit 12 can most simply be provided, for example on the end face of the rectangular head portion 1a of the battery pack 1, as shown in FIGS. 1 and 2.

However, in such structure, the display unit 12 may not be readily recognizable while the camera is in use, since said unit is positioned at the side of the camera.

Therefore, in an embodiment of the present invention, the remaining capacity display unit is provided in a position observable from the back side of the camera, when the battery pack is loaded in the camera. Thus, according to one aspect of the present invention, there is provided a battery pack to be detachably mounted to a camera body, comprising:

a reusable secondary battery;

means for calculating the amount of charging and discharging of the battery; and display means for indicating the remaining capacity of the secondary battery based on the result of said calculation, wherein the display of said display means is observable from the rear side of the camera body when the battery pack is mounted on the camera body.

Also in case the display of the remaining capacity on said secondary battery pack 1 is conducted by a check button provided thereon, the checking operation may be hindered when the pack is mounted on the camera body, depending on the position of said button on the pack, though such difficulty will not arise when the pack is separated from the camera body. Such button depressing operation is inconvenient in case battery checking is desired urgently in the course of a phototaking operation or in the course of battery charging.

In order to avoid such drawbacks, in a preferred variation of the above-mentioned battery pack, there are added first control means for manually controlling the function of the display means, and second control means for controlling the function of the display means in relation to the connection of the battery pack to the camera or to the charger. Such battery pack does not display the remaining capacity when left alone, though the battery checking operation is possible in such state, and the pack always displays the remaining capacity when connected to the camera or to the charger.

In designing a camera utilizing such secondary battery pack, it is also necessary to consider the use of non-reusable primary batteries (for example UM-3 batteries) in the form of a battery pack, and, for this reason, there is conceived to incorporate an aforementioned battery check circuit for the primary battery in the camera body. The selection of such pack for the primary batteries and that for the secondary batteries is made in consideration of the balance of frequency of use of batteries and of cost acceptable in the camera. In fact, the battery checking circuit and the display unit for such primary battery pack can, in a necessary minimum structure, be best incorporated in the camera body. In such configuration, however, in case of using a secondary battery pack equipped with a remaining capacity display circuit, there will coexist said remaining capacity display circuit and the battery check circuit for the primary battery provided in the camera body, and there may result a drawback that the user may misjudge the remaining capacity by activating said battery check circuit of the camera body for the primary battery while using a secondary battery pack.

In consideration of the foregoing, according to another aspect of the present invention, there is provided a camera body to which first battery means, including a reusable secondary battery, calculation means for calculating the amount of charge and discharge of said secondary battery and display means for indicating the remaining capacity of said secondary battery based on the result of said calculation, and second battery means including a non-reusable primary battery are selectively mountable, said camera body comprising:

second display means adapted to the second battery means and capable of checking and displaying the remaining capacity of the primary battery;

detection means for detecting that the first battery means is mounted on the camera body; and control means for controlling the second display means according to the output of said detection means.

In the basic mode of use of this camera body and battery packs in which the primary battery pack is mounted, the battery check is conducted by the battery checking circuit incorporated in the camera body, but, in case of the secondary battery pack capable of displaying the remaining capacity, the circuit in the camera body is disabled and the remaining capacity is displayed on said pack.

The secondary battery, such as nickel-cadmium battery, employed in the above-mentioned secondary battery pack, is repeatedly usable by recharging, but becomes unusable after charge-discharge cycles of several hundred times. Consequently the liquid crystal display unit 14, provided on the secondary battery pack 1, increases the cost thereof, thus leading to an unnecessarily increased burden to the user.

Therefore, in another embodiment of the present invention, the display means is provided in the camera body. More specifically, according to another aspect of the present invention, there is provided a battery system of a camera body comprising:

a camera body; and a battery pack to be detachably mounted to the camera body, wherein:

said battery pack includes:

a reusable secondary battery;

calculation means for calculating the amount of charge and discharge of the secondary battery; and output means for releasing a signal indicating the remaining capacity of the secondary battery, based on the result of said calculation; and said camera body includes:

means for receiving the signal, indicating the remaining capacity, from the output means; and means for displaying the remaining capacity of the battery, based on the signal indicating the remaining capacity.

Also in the camera system of the embodiment immediately preceding the last one, in the selective use of the primary battery and the secondary battery pack, it will be convenient in simplifying the configuration and in preventing the misjudgment of the user if the result of battery check of the primary battery and the remaining capacity of the secondary battery can be indicated by same display means. Therefore, in a preferred variation of said embodiment, there is provided a battery system of a camera comprising:

a camera body;

first battery means including a reusable secondary battery, calculation means for calculating the amount of charge and discharge of said secondary battery, and output means for generating a signal indicating the remaining capacity of the secondary battery, based on the result of said calculation; and second battery means including a non-reusable primary battery;

the first battery means and the second battery means being selectively mountable to the camera body, the camera body including:

means for identifying the mounted battery means;

check means for checking the remaining capacity of the primary battery of the second battery means and generating a signal indicating said remaining capacity;

means for receiving the signal, indicating the remaining capacity of the secondary battery, from the output means; and display means for displaying the remaining capacity of the primary or secondary battery;

wherein said display means is adapted, when the first battery means is mounted on the camera body, to display the remaining capacity of the secondary battery based on the signal indicating said remaining capacity, and, when the second battery means is mounted on the camera body, to display the remaining capacity of the primary battery based on the signal indicating said remaining capacity.

In the following there will be given a brief explanation, with reference to FIG. 3, on an example of the electric circuit composed of a secondary battery pack 1, a camera body 2 on which said pack is mounted, and a charger 3. The left-hand portion in the drawing shows the internal circuits of the charger 3, in which AC power supplied from an AC plug 11 is supplied to a rectification circuit 21, and DC charging current therefrom is supplied to the secondary battery pack 1 through a charging terminal 22 (CHG) and a ground terminal 23 (GND), formed in the charging plug 10 and the receptacle 9 (see FIG. 1). Said rectification circuit 21 can be so constructed as to merely provide the secondary battery 20 with an appropriate current or may include a known charging circuit for automatically terminating the charging current by monitoring the terminal voltage.

The central part in FIG. 3 shows the internal circuits of the secondary battery pack 1. The current supplied from the charger 3 through said terminals 22, 23 charges a secondary battery (nickel-cadmium battery) 20, through a diode 24 and a resistor 25. The diode 24 is provided for protecting the secondary battery 20 from damage, in case a voltage different in polarity from that of the charger 3 is erroneously applied to the terminals 22, 23. The current from said secondary battery 20 is supplied to the internal circuits of the camera body 2, through a discharge terminal (DIS) 26 and a ground terminal (GND) 27, which correspond to the aforementioned electrodes 7, 8 formed on the insert end of the pack 1.

The aforementioned resistor 25 is provided for converting the current between the terminals 22, 23 into a voltage, thus converting the current in a direction Ic or Id respectively in charging or discharging state, into a voltage for supply to a current detection circuit 28, which detects the direction and amount of thus generated current and sends the results of said detection to the aforementioned calculation circuit 29.

Also receiving the output of a timer circuit 30, said calculation circuit 29 determines the dimension of current of the secondary battery 20 at each time, based on the above-mentioned charging or discharging current. More specifically, in the charging state, the amount of charging of the secondary battery 20 is determined by the product of the charging current and the charging time, while, in the discharging state, the amount of discharge is determined by the product of the discharge current and the discharge time, and the remaining capacity of the secondary battery 20 is determined from the difference of the two. The remaining capacity thus determined is displayed, through a display circuit 31, on a display unit 12, whereby the photographer can recognize the remaining capacity of the secondary battery 20 in the pack 1.

The right-hand portion in FIG. 3 shows a part of the internal circuits of the camera body 2, wherein the power supplied from the secondary battery 20 through the discharge terminals 26, 27 is given to loads 35 such as motors and resistors through a power switch 36. Thus, the power supply from the secondary battery 20 to said loads 35 is conducted only when the power switch 36 is closed.

However, the above-explained battery system consisting of a secondary battery pack 1 including for example a nickel-cadmium battery, a camera body 2 to which said pack is mountable, and a charger 3 for said pack, has been associated with following drawbacks in the practical use.

Most of the recent cameras incorporating electronic circuits do not function at all if the battery has no remaining capacity. The secondary battery pack 1 needs to be charged when the remaining capacity runs out, and the camera cannot be used during such charging, which usually requires several tens of minutes to several hours. It is therefore customary to prepare plural secondary battery packs and to charge one while another is used.

Also in the outdoor use where the AC power supply is not available, it is mandatory to prepare pre-charged plural packs as the charger cannot be used.

However, in case of using plural secondary battery packs 1 for each camera as mentioned above, the presence of the resistor 25, current detection circuit 28, timer circuit 30, calculation circuit 29 and display circuit 31 including the display member for the display unit 12 in each secondary battery pack 1 is undesirable in terms of the cost of said pack 1 and also in terms of the space of the entire system.

For avoiding such drawback, it is conceivable to incorporate all of said resistor 25, current detection circuit 28, timer circuit 30, calculation circuit 29 and display circuit 31 into the camera body 2, but such configuration results in other drawbacks explained in the following:

(1) The system functions satisfactorily while the secondary battery pack 1 is charged and discharged in the camera body 2, but one of the drawbacks arises once said pack is detached from the camera body 2. Once the battery pack 1 is detached, the power supply to the camera body 2 is terminated, so that the information on the remaining capacity of the secondary battery pack 1, stored for example in the calculation circuit 29, is lost.

Naturally such drawback may be prevented by providing the camera body with a back-up power source for maintaining the power supply to the calculation circuit 29 or with a non-volatile memory such as an EEPROM (electrically erasable programmable read-only memory) thereby retaining the information on the remaining capacity, but such configuration results in another drawback explained in the following:

(2) Said drawback arises when a secondary battery pack (hereinafter called pack A) is detached from the camera body and another pack (called pack B) is mounted thereto.

The above-mentioned solution, relying on a back-up power source or a non-volatile memory, allows to retain, in the calculation circuit or the non-volatile memory in the camera body 2, the information on the remaining capacity of the pack A at the point when said pack A is detached from the camera body 2.

However, such information on the remaining capacity stored in the camera becomes entirely meaningless when another pack B is mounted on the camera body 2, since said information retained in the camera body is only related to the pack A.

Consequently, the calculation circuit in the camera body 2 is unable to know the remaining capacity of the pack B when it is mounted on the camera body, so that the calculation of the remaining capacity thereafter becomes impossible or totally meaningless.

Therefore, in constructing a secondary battery pack system consisting of a secondary battery pack 1, a camera body 2 on which said pack is mountable and a charger 3 for said pack, it is necessary to take the above-mentioned points into consideration and is desired to incorporate certain measures for avoiding the above-mentioned drawbacks in the structure of the entire system, and in the cost and space thereof.

In consideration of the foregoing, according to another aspect of the present invention, there is provided a battery system of a camera comprising:

a camera body; and a battery pack detachably mountable to the camera body and including a reusable secondary battery and information memory means;

the camera body including:

communication means for communicating with said information memory means;

calculation means for calculating the amount of charge and discharge of said secondary battery; and display means for displaying the remaining capacity of the secondary battery, based on the result of said calculation;

wherein, when the battery pack is mounted on the camera body, the information stored in said information memory means and indicating the remaining capacity of the secondary battery is transmitted through said communication means to said calculation means, and the information indicating the remaining capacity of the secondary battery, obtained in said calculation means, is transmitted through said communication means to said information memory means.

In said battery system, the circuitry for detecting the remaining capacity of the secondary battery pack is provided in the camera body and in the charger, while the secondary battery pack is equipped with information memory means in a necessary minimum configuration, whereby the remaining capacity of the secondary battery pack can be adequately and securely confirmed. Besides, since each battery pack only requires the information memory means, the system avoids the drawbacks in the cost and space of said pack, and provides improved convenience in the use of plural secondary battery packs.

FIG. 4 shows the structure of the current detection circuit 28, timer circuit 30, display circuit 31 (12) and calculation circuit 29 mentioned above. The current detection circuit 28 in FIG. 3 is composed of a differential amplifier 40. The calculation circuit 29 in FIG. 3 is composed of an A/D conversion circuit 41 and a microcomputer 42, and the timer circuit 30 in FIG. 3 is incorporated as a timer (not shown) in the microcomputer 42. The display circuit 31 is same as that shown in FIG. 3.

In this structure, the differential amplifier 40 converts the voltage across the resistor 25, shown in FIG. 3, into a voltage referenced to the ground level. The output of said differential amplifier 40 is supplied to an input terminal of the A/D converter 41, of which output is supplied to an input port of the microcomputer 42. Between said A/D converter 41 and the microcomputer 42, there are provided several unrepresented signal lines for command transmission. Said microcomputer 42 displays the remaining capacity of said secondary battery 20, utilizing the display circuit 31.

FIG. 5 is a flow chart, showing the calculation sequence of the remaining capacity of the secondary battery 20, by the microcomputer 42 shown in FIG. 4.

At first a step S101 reads the initial value of the remaining capacity from an unrepresented internal memory, and a step 102 sends an A/D conversion start command to the A/D converter 41 through an unrepresented command transmission line. A step 103 discriminates whether the A/D converter 41 has completed the A/D conversion, by monitoring an unrepresented command transmission line, and this step is repeated until the completion of the A/D conversion. Then a step 104 transfers the A/D converted value, obtained in the A/D converter 41, to the microcomputer 42, and a step 105 calculates the current remaining capacity of the secondary battery 20 by subtracting a product (dimension of current) of said A/D converted value and a time obtained from an unrepresented internal timer from the aforementioned initial value. A step 106 stores thus obtained remaining capacity in an unrepresented internal memory, and a step 107 displays said remaining capacity on the display circuit 31 constituting the aforementioned display unit 12. Thereafter the steps 101-107 are repeated.

However, the above-explained calculation and display of the remaining capacity of the secondary battery mounted on the camera body are still associated, in the practical use, with the following drawbacks.

The calculation circuit 29 has a period in which the signal obtained by conversion of the charge-discharge current of the secondary battery 20 with the resistor 25 and current detection circuit 28 (hereinafter called charge/discharge converted signal) is actually fetched (hereinafter called signal intake time Tin) and a period in which said signal is not fetched (hereinafter called signal non-intake time Tno). For this reason the calculation circuit 29 is incapable of continuously fetching the charged-discharge current, thus being unable to calculate exact dimension of current and remaining capacity, so that an error in the calculated remaining capacity is unavoidable. Such error is particularly marked in case the charge-discharge current varies significantly in time.

An incorrect calculation of remaining capacity, resulting from such error, may lead to a situation in which the remaining capacity is very low and is incapable of driving the loads 35 through the display circuit 31 provides a display "the secondary battery 20 still has a sufficiently high remaining capacity", or a situation in which the display circuit indicates zero capacity while the remaining capacity of the battery 20 is still high.

These drawbacks are based on the following reasons.

The A/D converting circuit 41 shown in FIG. 4 can be composed, for example, of double integral type A/D converter or successive approximation type A/D converter both of which are already well known.

Such A/D converting circuit 41, regardless of the type thereof, is basically unable to fetch the signal applied to the input terminal. For example, in the double integral type A/D converter, there exist a signal integration time T1 in which the signal supplied to the input terminal is fetched and integrated, and a reference integration time T2 during which the signal supplied to the input terminal is not fetched.

Also there are required periods for the transmission of the A/D converted value from the A/D converting circuit 41 to the microcomputer 42, and for the predetermined processings in said microcomputer 42.

More specifically, as shown in FIG. 5, there are required a time T4 for the transfer of the A/D converted value from the A/D converter 41 to the microcomputer 42 (step 104), a time T5 for the calculation of remaining capacity by the microcomputer 42 (step 105), a time T6 for the data storage in the memory by the microcomputer (step 106), a time T7 required for the microcomputer 42 to cause the display circuit 31 to display said remaining capacity (step 107), and a time T3 for reading of the initial value from the memory to the microcomputer 42 (step 101).

Thus, if the microcomputer 42 is not effecting may parallel processing, the sampling cycle Tc of the A/D converting circuit 41 is represented by $\{T1+T2+T3+T4+T5+T6+T7\}$, in which the signal supplied to the input terminal of the A/D converting circuit 41 is actually fetched only in the period T1 but disregarded in other periods.

Thus:

signal intake period Tin=T1;

signal non-intake period
Tno=Tc−T1=T2+T3+T4+T5+T6+T7.

Although the foregoing explanation is limited to the double integration type A/D converter, the signal intake time Tin and signal non-intake also exist in the successive-approximation type A/D converter.

In the circuit shown in FIGS. 3 and 4, such successive approximation type A/D converter 41 fetches the charge-discharge converted signal during the signal intake time Tin but does not fetch it during the non-intake time Tno. The fact that a part of the signal is not fetched and disregarded is not a major problem in case the charge-discharge current is almost constant, but may constitute a significant difficulty in case said current varies considerably in time.

FIGS. 6A to 6C show, as an example of a substantially constant charge-discharge current, a case in which a resistor constitutes the load 35 for the secondary battery 20 shown in FIGS. 3 and 4. Also FIGS. 7A to 7C and FIGS. 8A to 8C show, as examples of a charge-discharge current significantly varying in time, a case in which a motor constitutes said load 35.

FIG. 6A shows the wave form of the charge-discharge converted signal, from the closing to the opening of the power switch 36 in case the load 35 consists of a resistor. Said signal is naturally proportional to the charge-discharge current. The dimension of current is represented by the product of the charge-discharge current and the time (or the charge-discharge current integrated in time), and corresponds to the area surrounded by said wave form mentioned above.

FIG. 6B shows the wave form actually fetched (hereinafter called sampling signal wave form) by the A/D converter 41 in FIG. 4 from said charge-discharge converted signal. Among each cycle time Tc, the charge-discharge converted signal is fetched only in the period Tin. Said sampling signal wave form is transmitted from the A/D converter 41 to the microcomputer 42. Though said sampling signal wave form is in fact digital signals, it is shown in analog form for the purpose of comparison with other wave forms.

FIG. 6C shows said sampling signal wave form, after a first-order interpolation by the microcomputer 42 (hereinafter called interpolated signal form). The area of said signal form corresponds to the calculated dimension of current.

Comparison of FIGS. 6A and 6C indicates that the interpolated signal wave form is approximately equal to the charge-discharge converted signal wave form. Therefore the remaining capacity can be calculated correctly.

FIG. 7A shows the wave form of the charge-discharge converted signal from the closing to the opening of the power switch 36, in case a motor constitutes the load 35 shown in FIGS. 3 and 4. As already well known, a motor under a mechanical load shows a large surge current at the start of rotation, but consumes only a small stationary current (usually less than 1/10 of said surge current) in the constant rotation state, as shown in this chart.

FIG. 7B shows a first example of the charge-discharge converted signal actually fetched by the A/D converter 41 shown in FIG. 4 (hereinafter called first sampling signal wave form). In this example, a period Tin coincides with the period of said surge current. Within each cycle time Tc, said charge-discharge converted signal is fetched only in the period Tin. Said first sampling signal wave form (though in digital form in practice as explained before) is transmitted from the A/D converter 41 to the microcomputer 42.

FIG. 7C shows the first sampling signal wave form, after a first-order interpolation by the microcomputer 42 (hereinafter called first interpolated signal form), and the area of said signal corresponds to the calculated dimension of current.

FIG. 8A is same as FIG. 7A. FIG. 8B shows a second example of the charge-discharge converted signal actually fetched by the A/D converter 41 (hereinafter called second sampling signal wave form). The timing of signal fetching is slightly different from the foregoing first example, so that the period Tin does not coincide with the period of surge current. As explained before, within each cycle time Tc, the charge-discharge converted signal is fetched only in the period Tin. Said second sampling signal wave form (though in digital form in practice as explained before) is transmitted from the A/D converter 41 to the microcomputer 42.

FIG. 8C shows said second sampling signal wave form, after a first-order interpolation by the microcomputer 42 (hereinafter called second interpolated signal wave form), and the area of said signal form corresponds to the dimension of current.

In these charts, the wave forms shown in FIGS. 7A and 7C are approximately same, so that the remaining capacity can be calculated in approximately correct manner. On the other hand, those in FIGS. 8A and 8C are completely different, without proper fetching of the charge-discharge converted signal corresponding to the surge current. Consequently the calculation of remaining capacity cannot be conducted correctly and involves a significant error.

Naturally such problem does not arise if the sampling cycle time Tc is sufficiently shorter than the duration of surge current. However, in practice, reduction in Tc is limited because the A/D conversion of the A/D converter 41 and the processing of the microcomputer 42 require certain time.

The calculational error in the remaining capacity will be limited if the duration of the surge current is comparable to or longer than the sampling cycle time Tc and if the dimension of surge current is sufficiently smaller than the dimension of current during stationary rotation state. However, these conditions are not met in an automatic winding camera, because the rotating time of motor is relatively short, and the dimension of surge current represents a relatively large proportion in the entire dimension of current.

Also such camera often contains 3 to 4 motors, and such fact may increase the calculational error of the remaining capacity.

In the foregoing there has been explained an increased calculational error for the remaining capacity in case the load consists of a motor, but a similar error will result also in case of a capacitative load. Also even a resistance load will involve a large calculational error if it is turned on and off within a short time in comparison with the sampling period Ts. It is therefore desired, in a camera utilizing such secondary battery pack and incorporating loads therefor, to provide certain measures for enabling to correctly evaluate the remaining capacity regardless of the difference specifications and other conditions.

In consideration of the foregoing, according to another aspect of the present invention, there is provided a camera system comprising:

a camera body; and a battery pack detachably mountable to the camera and including a reusable secondary battery, measuring means for measuring the amount of charge and discharge of said secondary battery, calculation means for calculating the remaining capacity of the secondary battery, based on the result of measurement by said measuring means, and display means for displaying the remaining capacity of said secondary battery;

the camera body including:

load means consuming the current supplied from said secondary battery;

control means for effecting on-off control of said load means; and signal generating means for generating a timing signal indicating the control timing of said control means;

wherein the function timing of said measuring means and said calculation means is controlled according to said timing signal.

In said battery pack, the means for calculating the remaining capacity of the secondary battery controls, by a load control timing signal from the signal generating means, the start timing of detection of the charge-discharge amount detecting means or the start timing of calculation of the charge-discharge amount calculating means, or the duration of detection of said detecting means, thereby controlling the timing of fetching, detection and processing of the charge-discharge converted signal. The control by said timing signal can be realized in following two methods:

(1) Fetch start timing control method

In this method, the start timing of fetching of the charge-discharge converted signal is controlled by the load control timing signal.

It is assumed that said timing signal is active in the low level state. The fetching of said converted signal is started at the shift of the load control timing signal from the high to low level state, and is terminated after the lapse of a normal signal intake time Tin. The next signal intake time $T_{in}$ is started after the lapse of a normal signal non-intake time Tno, during which signal processing etc. is conducted.

Thus the signal intake time $T_{in}$, signal non-intake time Tno, and sampling cycle time Tc are same as those in the conventional method, while the start timing of signal fetching alone is controlled by said load control timing signal.

(2) Fetch duration control method

In this method, the start and end timings of fetching of the charge-discharge converted signal are controlled by the load control timing signal.

The fetching of the charge-discharge converted signal is initiated at the shift of the load control timing signal from the high to low level state, and is continued during the low level state of said timing signal. Thus, said converted signal continues to be integrated during the low level state of said timing signal. The duration of said low level state constitutes the signal integrating period in the aforementioned double-integration A/D converter, or also in the successive-comparison A/D converter if an input capacitor is provided.

Said fetching is terminated at the shift of the load control timing signal from the low to high level state, whereupon a normal signal non-intake time $T_{no}$ is started.

Therefore, the signal non-intake time Tno is same as in the conventional method, but the signal intake time Tin is variable and corresponds to the low level state of the load control timing signal. Consequently, the sampling cycle time Tc is also determined by the low level state of said timing signal.

BRIEF DESCRIPTION OF THE DRAWINGS

FIG. 1 is a schematic exploded perspective view of a camera utilizing a secondary battery pack;

FIG. 2 is a schematic perspective view of the secondary battery pack shown in FIG. 1, in a state mounted to the camera;

FIG. 20 is a block diagram of the battery system shown in FIGS. 18 and 19;

FIG. 21 is a schematic exploded perspective view of a 5th embodiment of the present invention;

FIG. 24 is a schematic exploded perspective view of a 6th embodiment of the battery system of the present invention, for use in a camera;

FIG. 30 is a magnified partial cross-sectional view of the embodiment shown in FIG. 29;

FIG. 32 is a schematic exploded perspective view of a 10th embodiment of the battery system, for use in a camera, of the present invention;

FIGS. 40A and 40B are block diagrams of the battery system shown in FIG. 38;

DETAILED DESCRIPTION OF THE PREFERRED EMBODIMENTS

Now the present invention will be clarified in detail by preferred embodiments thereof shown in the attached drawings.

1st Embodiment

Figure 9:
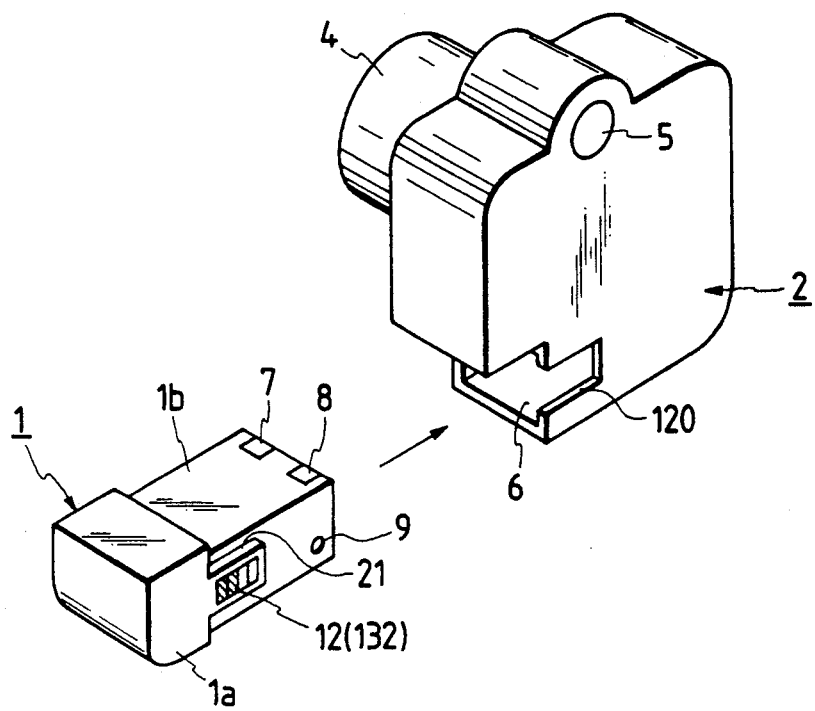
FIGS. 9 and 10 are respectively a schematic exploded perspective view and a schematic perspective view, with a mounted secondary battery pack, of an embodiment of the battery system of the present invention, for use in a camera.
Figure 10:
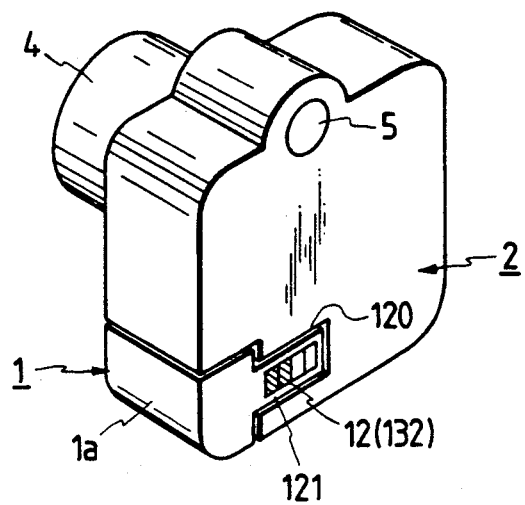
Figure 11:
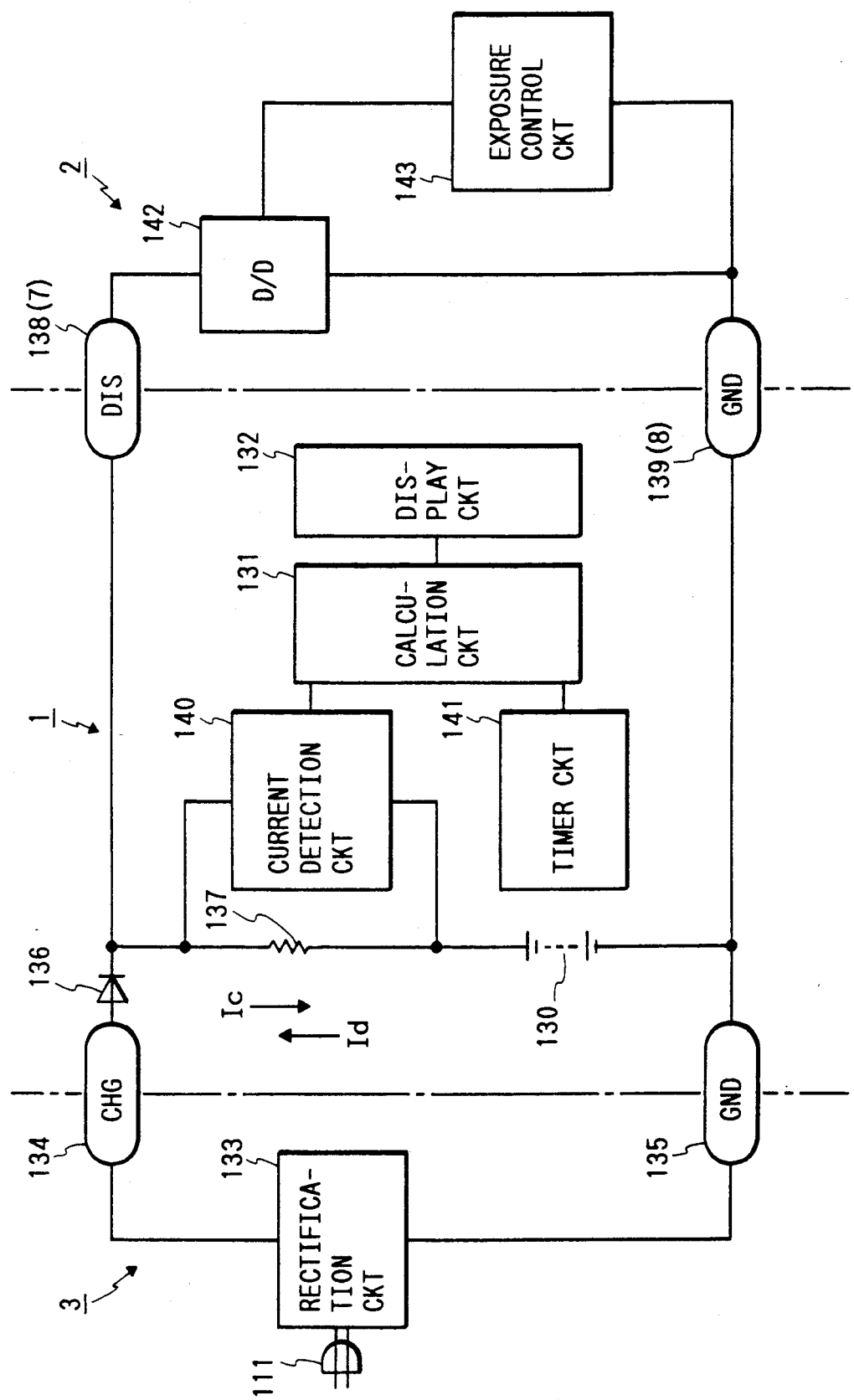
FIG. 11 is a block diagram of the battery system shown in FIGS. 9 and 10.

FIGS. 9 to 11 illustrate an embodiment of the battery system, for use in a camera, of the present invention, wherein components same as or equivalent to those in FIGS. 1 and 2 are represented by same numbers and will not be explained further.

In the present embodiment, a battery pack 1, to be detachably mounted in a chamber 6 of a camera body 2, is provided, as shown in FIG. 11, with a reusable secondary (nickel-cadmium) battery 130, means (calculation circuit) 131 for calculating the amount of charge and discharge of said battery 130, and means for displaying the remaining capacity of the secondary battery 130 (display circuit 132 including the aforementioned display unit 120, and is featured by a fact that the display unit 12 is provided in a position easily recognizable from the rear side of the camera even when the camera is held in a phototaking position, in the mounted state to said camera body, as shown in FIGS. 9 and 10.

In the present embodiment, a substantially rectangular notch 120 is provided on the rear face of the camera body adjacent to said chamber 6 thereof, and the battery pack 1 is also provided, on a lateral face thereof facing the rear side, with a protruding portion 121 which engages with said notch 120 and is exposed on the rear face of the camera body. The display unit 12 for displaying the remaining capacity for example by a liquid crystal display is provided on said protruding portion 121.

In such configuration, the remaining capacity of the secondary battery pack 1 can be displayed in easily recognizable manner, on the display unit 12 positioned on the rear face of the camera body 2.

Figure 12:
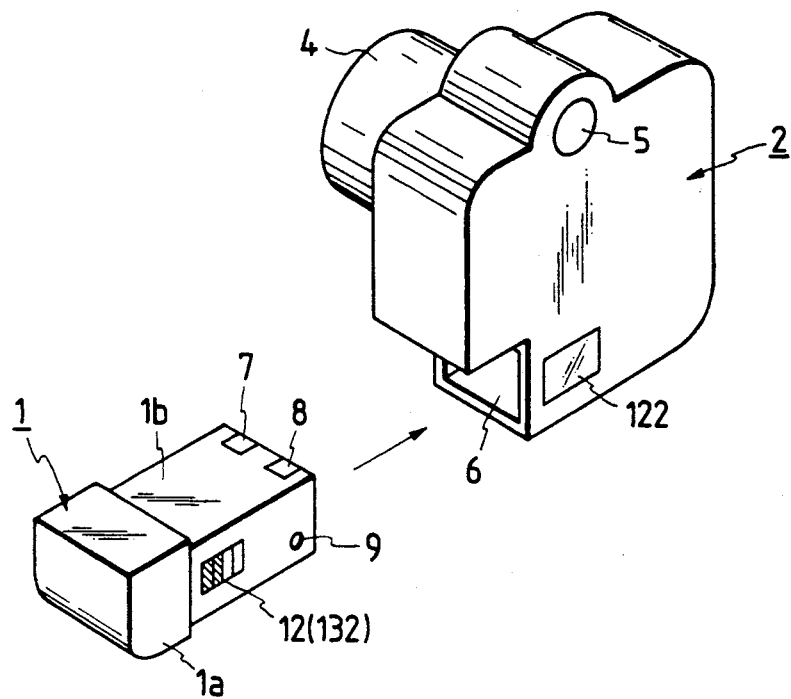
FIGS. 12 and 13 are respectively a schematic exploded perspective view and a schematic perspective view in mounted state of a variation of the battery system shown in FIGS. 9 to 11.
Figure 13:
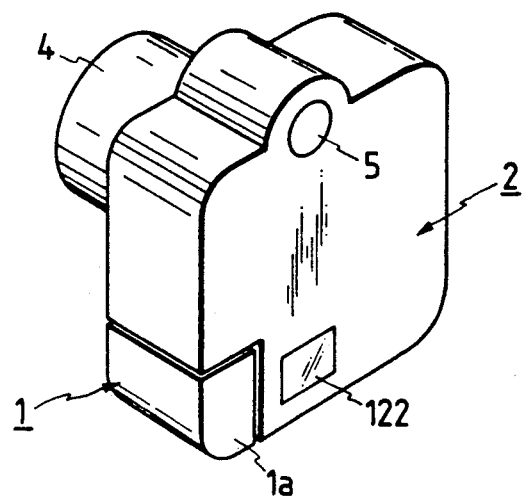

In the present embodiment, the display of remaining capacity by the display unit 12 on the pack 1 is enabled by the formation of a notch 120 on the rear face of the camera body 2, but such display can also be realized, in a variation shown in FIGS. 12 and 13, by forming a transparent window 122, composed of a transparent plastic plate integrally incorporated in the rear face of the camera body 2, thereby enabling to observe the display unit 12, formed on a corresponding position of the pack 1, through said window. Such configuration not only allows to observe the display unit 12 from the rear side of the camera body through said transparent window 122 but also provides an advantage of protecting the display unit 12, composed for example of a liquid crystal display, from external force by the presence of said window.

An electric circuit including said secondary battery pack 1, a camera body 2 to which said pack 1 is mountable, and a charger 3 is shown in FIG. 11. The left-hand portion shows the internal circuits of the charger 3, in which an AC power supplied from an AC plug 11 is supplied to a rectification circuit 133, and a DC charging current obtained therefrom is supplied to the secondary battery pack 1 through a charging terminal (CHG) 134 and a ground terminal (GND) 135, representing the charging plug 10 and receptacle 9 (see FIG. 1). Said rectification circuit 133 can be so constructed as to merely provide the secondary battery 130 with an appropriate current or may include a known charging circuit for automatically terminating the charging current by monitoring the terminal voltage.

The central part in FIG. 11 shows the internal circuits of the secondary battery pack 1, constituting the essential part of the present invention. The current supplied from the charger 3 through said terminals 134, 135 charges the secondary battery (nickel-cadmium battery) 130, through a diode 136 and a resistor 137. The diode 136 is provided for protecting the secondary battery 130 from damage, in case a voltage different in polarity from that of the charger 3 is erroneously applied to the terminals 134, 135. The current from said secondary battery 130 is supplied to the internal circuits of the camera body 2, through a discharge terminal (DIS) 138 and a ground terminal (GND) 139, which correspond to the aforementioned electrodes 7, 8 formed on the inserted end of the pack 1.

The aforementioned resistor 137 is provided for converting the current between the terminals 134, 135 into a voltage, thus converting the current in a direction Ic or Id respectively in charging or discharging state, into a voltage for supply to a current detection circuit 140, which detects the direction and amount of thus generated current and sends the results of said detection to the aforementioned calculation circuit 131.

Also receiving the output of a timer circuit 141, said calculation circuit 131 determines the dimension of current of the secondary battery 130 at each time, based on the above-mentioned charging or discharging current.

More specifically, in the charging state, the amount of charging of the secondary battery 130 is determined by the product of the charging current and the charging time, while, in the discharging state, the amount of discharge is determined by the product of the discharge current and the discharge time, and the remaining capacity of the secondary battery 130 is determined from the difference of the two. The remaining capacity thus determined is displayed, through a display circuit 132, on a display unit 12, whereby the photographer can recognize the remaining capacity of the secondary battery 130 in the pack 1.

The right-hand portion in FIG. 11 shows the internal circuits of the camera body 2, wherein the power supplied from the secondary battery 130 through the discharge terminals 138, 139 is firstly given to a DC-DC converter 142 which is activated by an unrepresented power switch, thereby supplying a constant voltage for example to an exposure control circuit 143. Included in said circuit 143 is a control system for measuring the brightness of an object, controlling the functions of a shutter and a diaphragm according to the result of said measurement, and advancing the film.

Although not shown in FIG. 11, said calculation circuit 131 and display circuit 312 are naturally connected to a power supply system which is continuously powered.

2nd Embodiment

Figure 14:
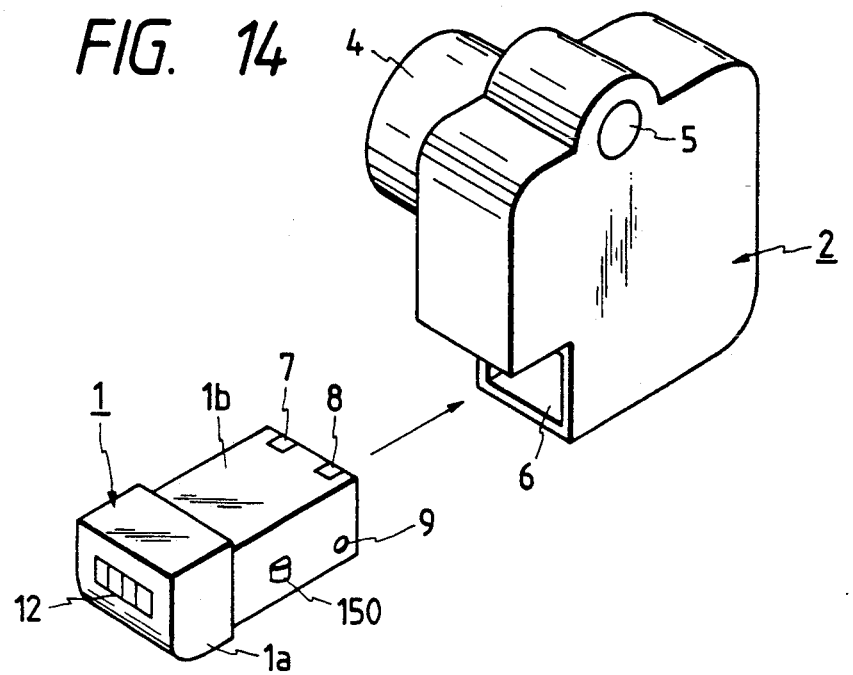
FIG. 14 is a schematic exploded perspective view of a second embodiment of the present invention.
Figure 15:
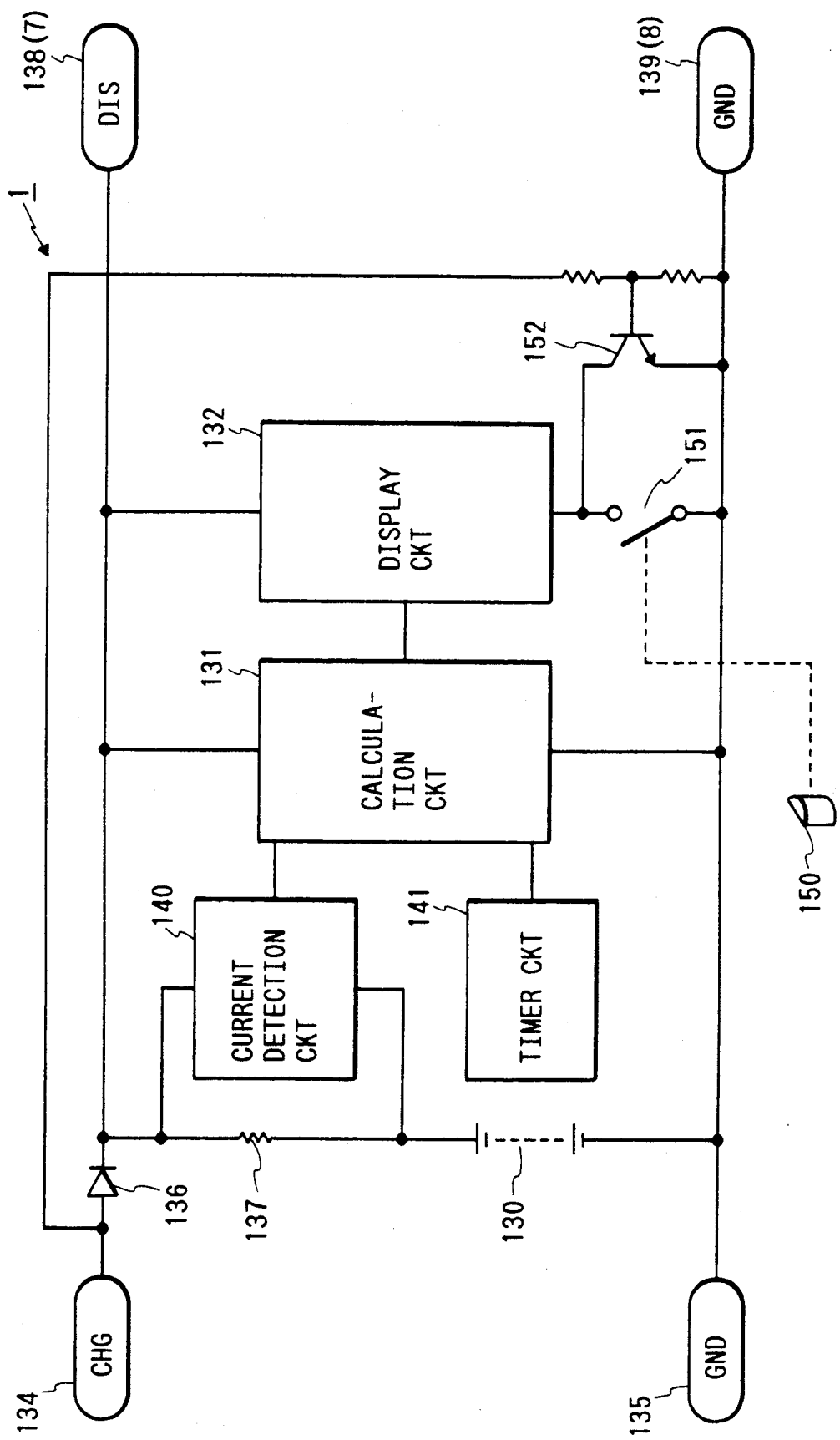
FIG. 15 is a block diagram of a secondary battery pack employed in the system shown in FIG. 14.

FIGS. 14 and 15 illustrate a 2nd embodiment of the present invention, in which the secondary battery pack 1 is provided, in a part thereof, with a battery check button 150 for manually activating the display unit 12 for the remaining capacity, and does not indicate the remaining capacity by the display unit in case said check button is not depressed, for example when the pack is left alone. Such configuration allows to reduce the consumption of battery power by the current consumed in the display circuit 132 etc. when the battery checking is not required, and is particularly suitable when the display unit 12 is composed of light-emitting diodes.

In the present embodiment, the remaining capacity of the battery can be confirmed by the depression of the check button 150 provided on the external surface of the pack 1, and the display unit 12 is activated during said depression.

In the use of such secondary battery back 1 with control means such as the battery check button 150 for controlling the display of the remaining capacity, the present embodiment is featured by the presence of means for actuating said control means, in linkage with the connecting operation of the secondary battery pack 1 to the camera body 2 or the charger 3.

More specifically, in the present embodiment, said check button 150 is provided protruding from a lateral wall of the inserted portion 1b of the pack 1 and is automatically depressed by an internal wall of the chamber 6 of the camera body 2 when said pack 1 is inserted thereinto, whereby the remaining capacity is continuously displayed when the pack 1 is mounted to the camera. Also when the charger 3 is connected to the secondary battery pack 1 by inserting the charging plug 10 into the receptacle 9, said connected state is sensed by a circuit in the pack 1 whereupon the display circuit 132 is activated to display the remaining capacity.

The internal circuits of the secondary battery pack 1, for achieving the above-mentioned functions, is illustrated in FIG. 15. In said circuits, the calculation circuit 131 is constantly powered because the calculation of dimension of current is always necessary, but the power supply circuit for the display circuit 132 is provided, at the ground side thereof, with a contact 151 which is on-off controlled by said battery check button 150, whereby said display circuit 132 is powered only when said check button 150 is depressed manually or by mounting to the camera, thus displaying the remaining capacity obtained from said calculation circuit 131.

Also the power supplied from the charging terminal (CHG) 134 is supplied to a transistor 152, which can connect the display circuit 132 to the ground in parallel with said contact 151. In such configuration, when the charger 3 is connected to the charging receptacle 9, the charging current charges the battery 130 and also turns on the transistor 152, thereby activating the display circuit 132 to display the remaining capacity of the battery.

Consequently, when the secondary battery pack 1 is left alone, the remaining capacity is normally not displayed but can be confirmed by the depression of the battery check button 150 when required. Also the remaining capacity is always displayed when the camera or the charger 3 is used.

In the present embodiment, the display by the display unit 12 is conducted, in the connection with the camera body 2, by mechanical depression of the check button 150 by the internal wall of the chamber 6 when the secondary battery pack 1 is inserted thereinto, while, in the connection with the charger 3, by an electrical signal, but such mechanical and electrical controls may be inverted for respective connections, or either control may be employed for both connections, as long as the display of the remaining capacity is not conducted when the secondary battery pack 1 is left alone but continuously conducted when said pack 1 is connected to the camera body 2 or the charger 3.

3rd Embodiment

Figure 16:
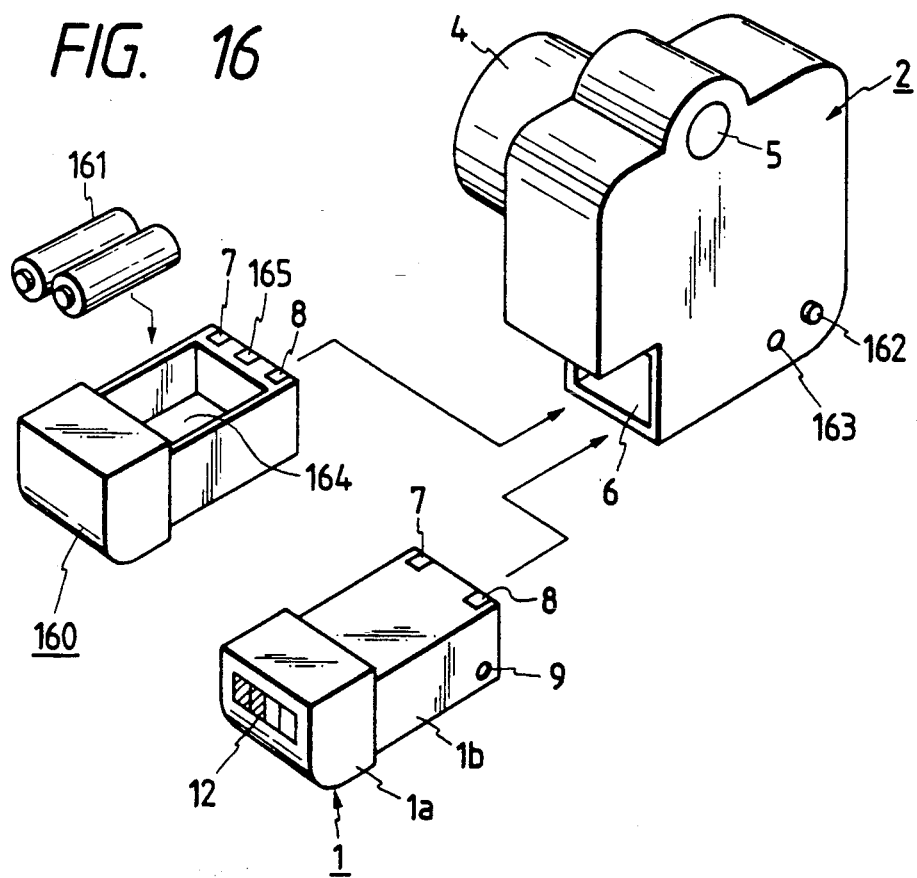
FIG. 16 is a schematic exploded perspective view of a 3rd embodiment of the present invention.
Figure 17:
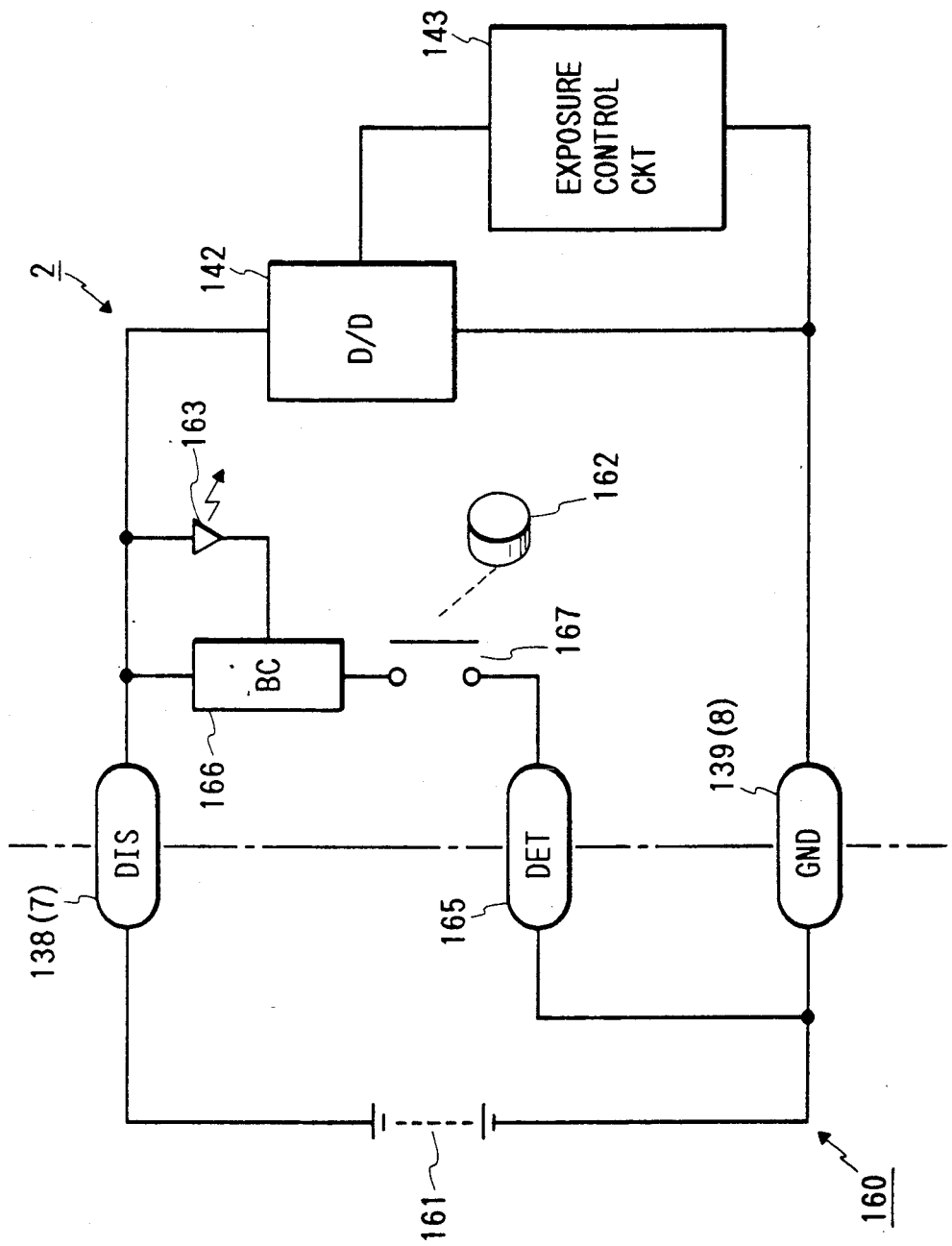
FIG. 17 is a circuit diagram of a primary battery pack and a battery checking circuit in the camera body.

FIGS. 16 and 17 illustrate a 3rd embodiment of the present invention, in which the camera body 2 can be selectively loaded with a secondary battery pack 1 including a reusable secondary battery 30 as mentioned above, or a primary battery pack 160 including a non-reusable primary battery 161, such as an ordinary UM-3 battery or a lithium battery.

As shown in FIG. 16, such camera is provided, for the primary battery pack 160, with a battery check button 162, an indicator lamp 163 composed for example of a light-emitting diode, and an internal battery check circuit for the primary battery. Said internal circuit is activated by the depression of the check button 162, to light the indicator 163 continuously in case the remaining capacity is sufficient, or intermittently in case said capacity is insufficient.

Such battery check circuit provided in the camera body 2 is exclusively designed for the primary battery such as UM-3, and is incapable of proper evaluation of the secondary battery, as the chances of use of the secondary battery are limited in comparison with those of the primary battery 161.

The primary battery pack 160, to be loaded in the chamber 6 of the camera body 2, is provided, as shown in FIG. 16, with a battery chamber 164 for detachably loading batteries 161. Also on the inserted end of a case constituting said pack 160, there are provided discharge terminals 7, 8 similar to those in the aforementioned secondary battery pack 1, and a pack detecting electrode (DET) 165 for identifying the pack.

In the above-explained configuration, the battery check is conducted in the following manner when the pack 1 or 160 is used in combination with the camera body 2.

When the primary battery pack 160 is used, the battery check button 162 on the camera body 2 is depressed to activate the circuit for the primary battery incorporated in said camera body, whereby the indicator 163 is lighted continuously or intermittently respectively if the remaining capacity of the battery is sufficient or insufficient.

On the other hand, when the secondary battery pack 1 is mounted, the remaining capacity thereof can be confirmed by the display unit 12 provided on said pack 1.

However, if the camera body is equipped with the checking means for the primary battery while the secondary battery pack is equipped with exclusive checking means therefor, there may result a drawback that, in case the photographer mistakes the mounted battery pack, he merely dpresses the check button 162 of the camera body and obtains erroneous information on the remaining capacity by looking at the state of the indicator 163.

For this reason, the present embodiment is featured by the presence, on the camera body 2 equipped with a battery check circuit 166 and an indicator 163 for checking and displaying the remaining capacity of the primary battery 161 in the pack 160, of means for detecting the mounting of the secondary battery pack 1 (in the present embodiment by the presence or absence of the electrode 65 on the battery pack), and means for controlling the display means (battery check circuit 166 and indicator 163) according to the output of said detection means.

Referring to FIG. 17, a contact 167 controlled by said check button 162 connects the battery check circuit 166, connected with said indicator 163, to the ground when the mounted battery pack contains the primary battery and has said electrode 165, thereby activating the circuit in the camera body 2.

In the absence of said electrode 165, the checking circuit 166 does not function despite of the depression of the check button 162, so that the indicator 163 is not lighted continuously nor intermittently. Consequently, in this configuration, in case the primary battery pack 160 is mounted as the basic mode of use, the remaining capacity can be checked with the battery check circuit 166 provided in the camera body 2. On the other hand, when the secondary battery pack 1 capable of displaying the remaining capacity is mounted, the circuit 166 etc. in the camera body are disabled, and the remaining capacity is displayed by the circuits of the pack 1.

In the foregoing embodiment, the primary batteries are loaded in a primary battery pack, but they may be directly loaded in a loading portion of the camera body. In such case said primary battery may be formed same as said primary battery pack, or said loading portion may be formed same as the primary battery.

4th Embodiment

Figure 18:
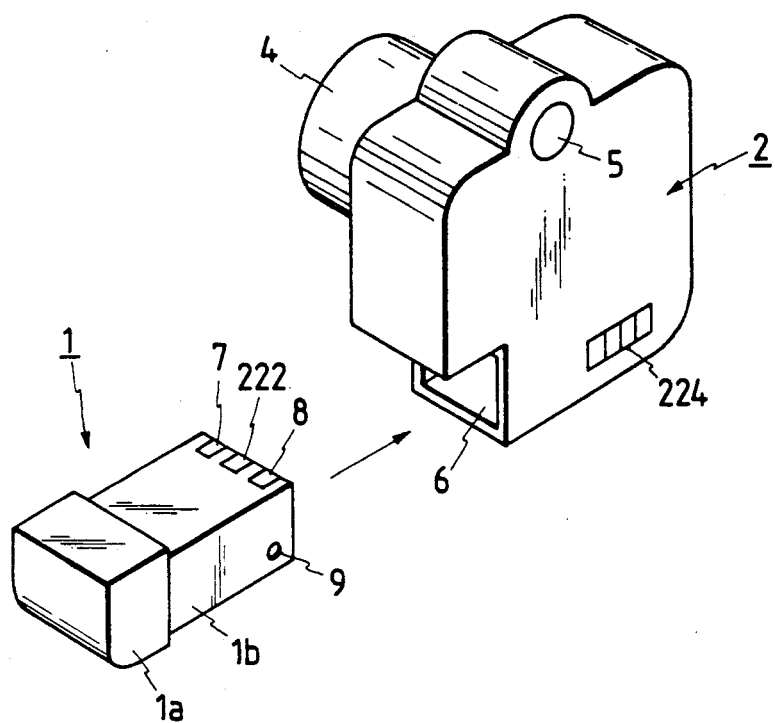
FIGS. 18 and 19 are respectively a schematic exploded perspective view and a schematic perspective view, with a mounted secondary battery pack, of a 4th embodiment of the battery system of the present invention for use in a camera.
Figure 19:
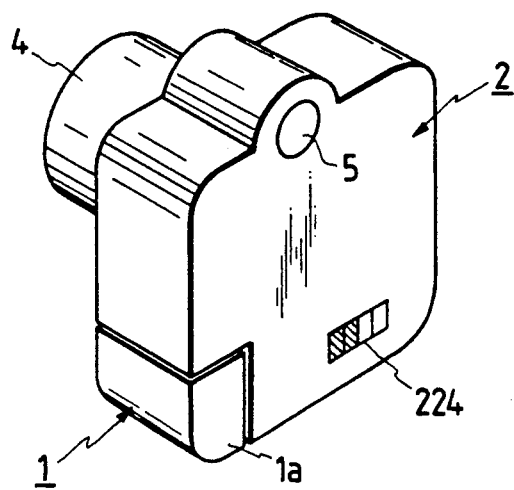

FIGS. 18 to 20 illustrate another embodiment of the battery system, for use in a camera, of the present invention, wherein components same as or equivalent to those in FIGS. 1 and 2 are represented by same numbers and will not be explained further.

The present embodiment is featured by a fact that a battery pack 1, detachably mountable in a chamber 6 of a camera body 2, is provided, as shown in FIG. 20, with a reusable secondary (nickel-cadmium) battery 220, means for calculating the amount of charge and discharge of said battery 220 (calculation circuit 221), and means for releasing the remaining capacity of the secondary battery 220 obtained by said calculation means (a signal transmission terminal 222 shown in FIGS. 18 and 20), and that the camera body 2 is provided with means for receiving the signal, indicating the remaining capacity, from said terminal 222 (said means being commonly represented as the terminal 222 in FIG. 18), and means for displaying said remaining capacity, based on said signal (a display circuit 223 including a display unit 224).

In the present embodiment, as shown in FIG. 18, the signal transmitting terminal 222 is exposed at the end of the inserted portion 1b, next to the electrodes 7, 8. Also as shown in FIGS. 18 and 19, said display unit 224 is for example composed of a liquid crystal display device positioned on the rear face of the camera body 2, in easily recognizable manner even when the camera is held in the phototaking position.

Such configuration provides the display of the remaining capacity of the secondary battery pack 1 in an easily recognizable manner on the display unit 224 provided on the rear face of the camera body 2, so that the photographer can promptly confirm the remaining capacity while holding the camera body in the phototaking position, and without missing the optimum timing of phototaking.

An electric circuit including said secondary battery pack 1 and the camera body to which said pack 1 is mountable is shown in FIG. 20. The left-hand portion shows the internal circuit of the secondary battery pack 1, and said circuit is provided with a charging terminal (CHG) 226 and a ground terminal (GND) 227, for receiving a charging current obtained from an AC current in an unrepresented charger through the charging plug 10 (see FIG. 1) and the receptacle 9. Said charging current charges a secondary (nickel-cadmium) battery 220 through a diode 228 and a resistor 229. Said diode 228 is provided for protecting the secondary battery 220 from damage, in case a voltage different in polarity from that of the charger 3 is erroneously applied to the terminals 226, 227. The current from said secondary battery 220 is supplied to the internal circuit of the camera body 2, through a discharge terminal (DIS) 7 and a ground terminal (GND) 8. Said resistor 229 is provided for converting the current between the terminals 226, 227 into a voltage, thus converting the current in a direction Ic or Id respectively in charging or discharging state, into a voltage for supply to a current detection circuit 230, which detects the direction and amount of thus generated current and sends the results of said detection to the aforementioned calculation circuit 221.

Also receiving the output of a timer circuit 231, said calculation circuit 221 determines the dimension of current of the secondary battery 220 at each time, based on the above-mentioned charging or discharging current.

More specifically, in the charging state, the amount of charging of the secondary battery 220 is determined by the product of the charging current and the charging time, while, in the discharging state, the amount of discharge is determined by the product of the discharge current and the discharge time, and the remaining capacity of the secondary battery 220 is determined from the difference of the two. The remaining capacity thus determined is transmitted, through the terminal 222, to the camera body 2.

The right-hand portion in FIG. 20 shows the internal circuit of the camera body 2, wherein the power supplied from the secondary battery 220 through the terminals 7, 8 is firstly given to a DC-DC converter 232 which is activated by an unrepresented power switch, thereby supplying a constant voltage for example to an exposure control circuit 233. Included in said circuit 233 is a control system for measuring the brightness of an object, controlling the functions of a shutter and a diaphragm according to the result of said measurement, and advancing the film.

Also in the present embodiment, the camera body 2 is equipped with a display circuit 223 for receiving the signal indicating the remaining capacity through said terminal 222 and a display unit 224 therefor, whereby the remaining capacity of the secondary battery 220 in the pack 1 as shown in FIG. 18 can be displayed on the camera body 2 when said pack 1 is mounted thereon as shown in FIG. 19. The signal transmitted from the terminal 222 is preferably a segment drive signal capable of directly driving the display unit 224 consisting of a liquid crystal display unit. Also FIG. 20 shows only one terminal 222, but there may be provided plural terminals if such segment drive signal requires plural terminals. Also there may be employed a clock signal terminal and a data terminal, involving the known signal processing, if the calculation circuit 221 and the display circuit 223 are connected by serial communication.

5th Embodiment

Figure 22:
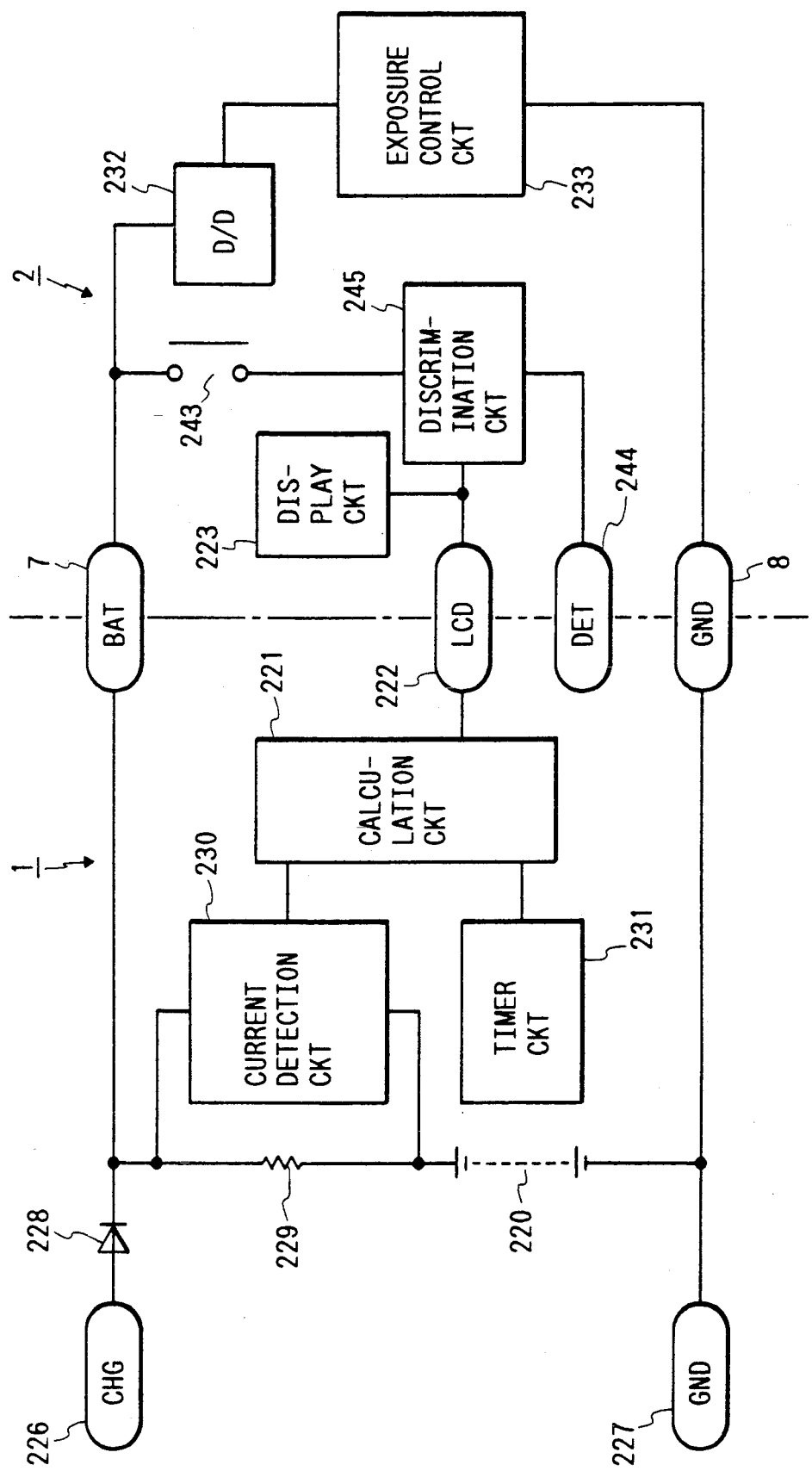
FIGS. 22 and 23 are circuit diagrams showing the circuit structure respectively in the use of a secondary battery pack and a primary battery pack.
Figure 23:
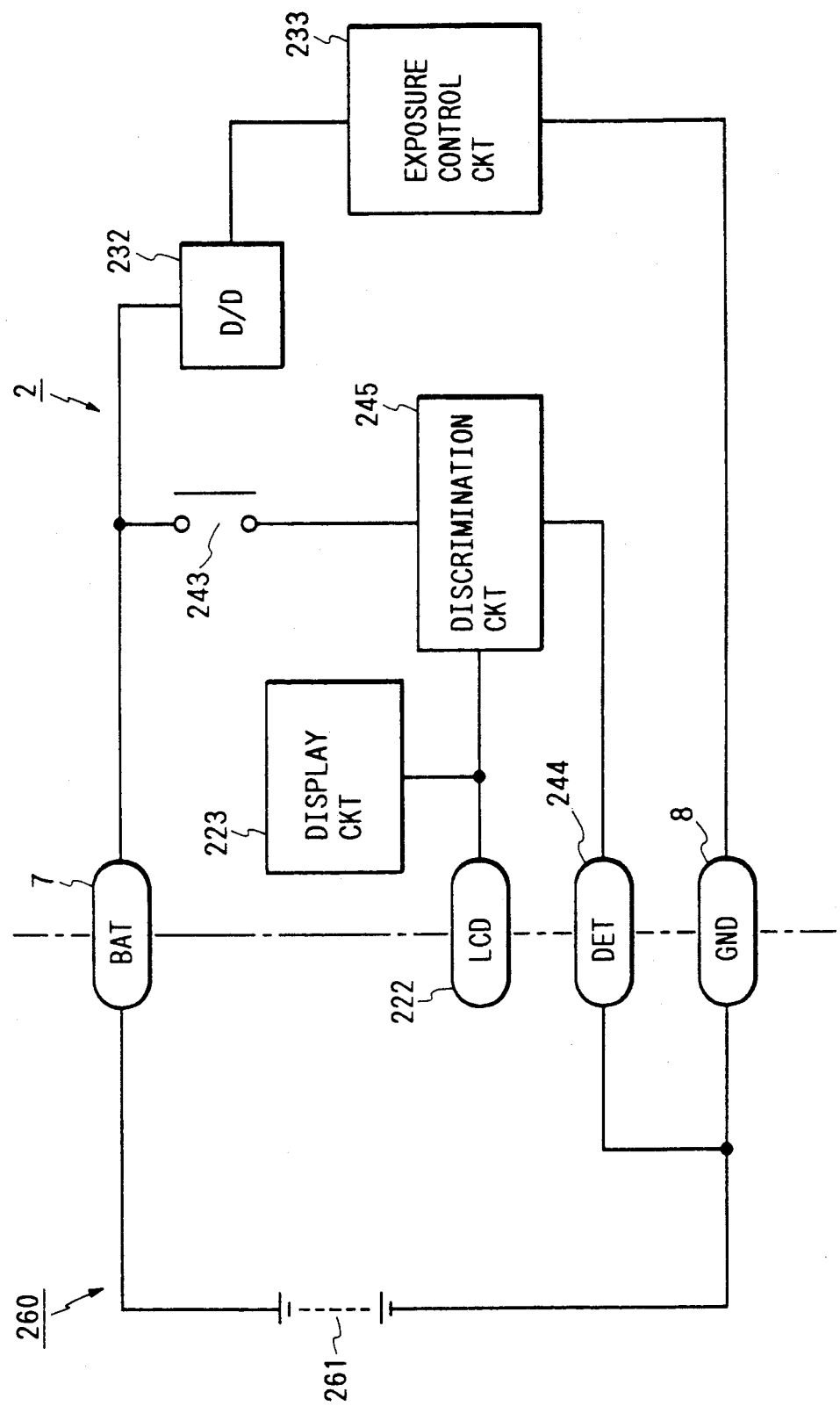

FIGS. 21 to 23 illustrate a 5th embodiment of the present invention, in which the camera body 2 can be selectively loaded with a secondary battery pack 1 including a reusable secondary battery 220 as mentioned above, or a primary battery pack 240 including a non-reusable primary battery such as an ordinary UM-3 battery or a lithium battery.

As shown in FIG. 21, such camera is provided, for the primary battery pack 240, with a battery check button 243, a display unit 224 therefor, and an internal battery check circuit for the primary battery. Said internal circuit is activated by the depression of the check button 243, to turn on the display unit 224 in case the remaining capacity is sufficient, or to turn on said unit intermittently or to extinguish the display in case the remaining capacity is insufficient.

The configuration of this embodiment is featured by a fact that the remaining capacity of the battery is displayed on the display unit 224 provided on the rear face of the camera body 2, regardless whether the pack 1 or 240 is mounted. When the primary battery pack 240 is mounted, said display is given in response to the depression of the check button 243, but, when the secondary battery pack 1 is mounted, said display is always given on the display unit 224.

The primary battery pack 240, to be loaded in a chamber 6 of the camera body 2, is provided, as shown in FIG. 21, with a battery chamber 242 for detachably accommodating batteries 241. Also on the inserted end of said pack 240, there are provided discharging terminals 7, 8 similar to those in the aforementioned secondary battery pack 1, and a pack detecting terminal 244. Said secondary battery pack 1 and primary battery pack 240 are formed in a substantially same shape, and have said discharging terminals 7, 8 in mutually corresponding positions on the inserted end. However, as shown in FIG. 21, the signal transmitting terminal 222 in the secondary battery pack 1 and the identifying terminal 244 in the primary battery pack 240 are provided in different positions, and, in the connection to the camera body 2, form respectively different wiring states with the display unit 224 (display circuit 223) as shown in FIGS. 22 and 23, thereby functioning as means for identifying the mounted pack.

In the camera body 2, as shown in the right-hand portion in FIGS. 22 and 23, the terminal 222 receiving the signal, indicating the remaining capacity of the secondary battery 220, from the pack 1 is connected to the display circuit 223 including the display unit 224. On the other hand, when the primary battery pack 240 is mounted, the identifying terminal 244 functions as a ground terminal for a discrimination circuit 245 of which input is connected to said terminal 222 and the display circuit 223, and said discrimination circuit can be activated by a contact linked with the aforementioned battery check button 243.

When the secondary battery pack 1 is mounted to the camera body 2 in the above-explained configuration, the display circuit 223 and the display unit 224 are connected through the terminal 222 to said pack while the descrimination circuit 245, identifying terminal 244 and check button 243 are excluded from the circuit, whereby the remaining capacity of the secondary battery 220 can be displayed by the signal from the calculation circuit 221 of the pack 1, as shown in FIG. 22.

On the other hand, when the primary battery pack 240 is mounted, the above-mentioned terminal 222 for the secondary battery is unconnected as shown in FIG. 23 and the display circuit 223 is grounded through the discrimination circuit 245. In such state, the depression of the check button 243 selectively activates the discrimination circuit 245, whereby the remaining capacity of the battery at this point can be displayed on the display unit 224. Said discrimination circuit 245, activated by the closing of the battery check button 243, is designed to measure the battery voltage when a current is given to an unrepresented resistor in said circuit. Since said resistor has to have a low resistance, said circuit cannot be operated continuously but is to be activated only in response to the depression of the check button 243.

In the foregoing there has been explained a case of loading primary batteries in the primary battery pack, but such primary batteries may be directly loaded in a loading chamber of the camera body. In such case, the primary batteries may be formed similar to the primary battery pack, or said loading chamber may be formed similar to the primary battery.

6th Embodiment

Figures 3, 4:
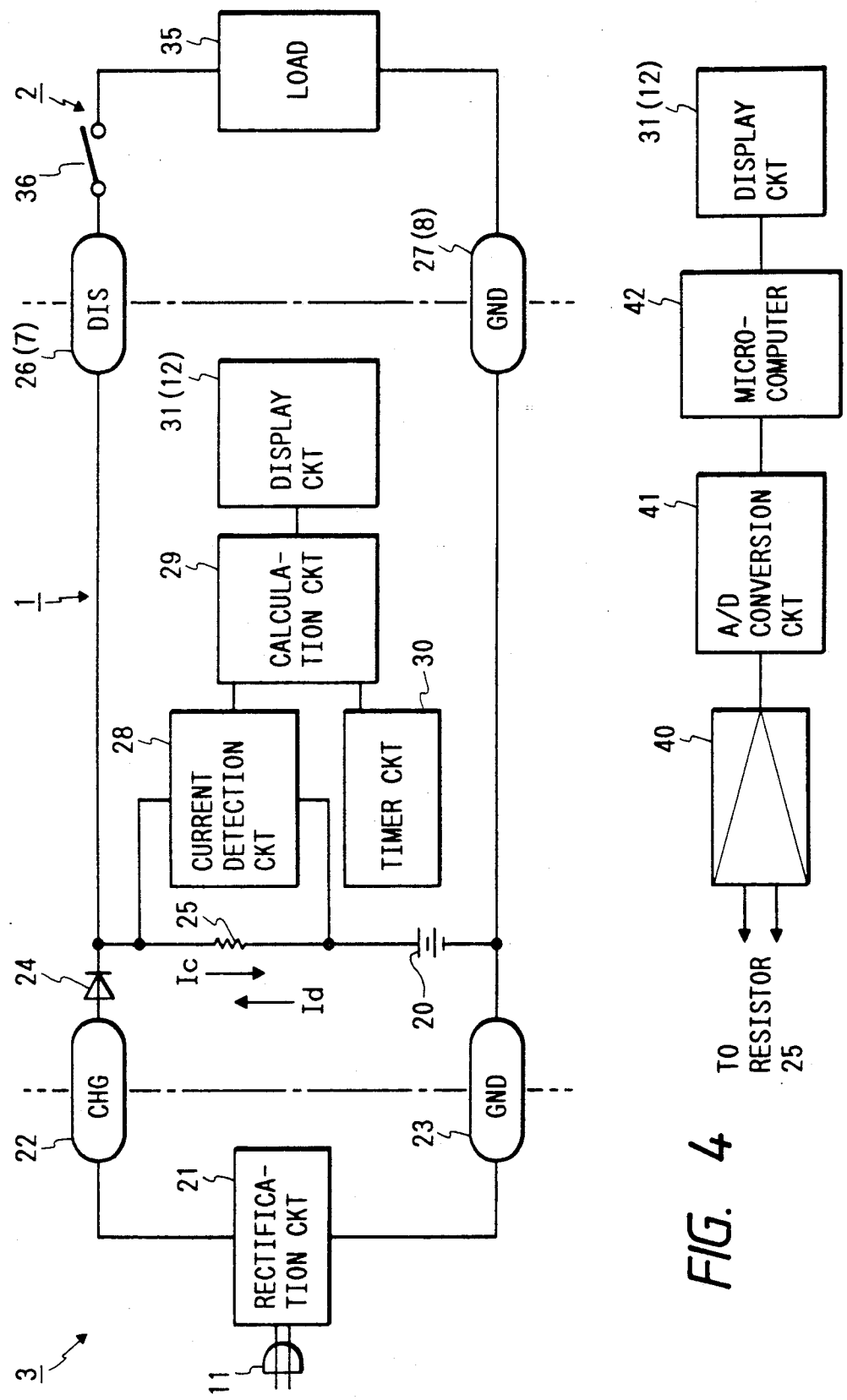
FIG. 3 is a block diagram of the secondary battery pack shown in FIG. 1 and the camera to which said pack is mountable.
FIG. 4 is a block diagram of a current detection circuit, a timer circuit, a display circuit and a calculation circuit in a secondary battery pack, equipped with remaining capacity display means, for use in the camera shown in FIG. 3.
Figure 25:
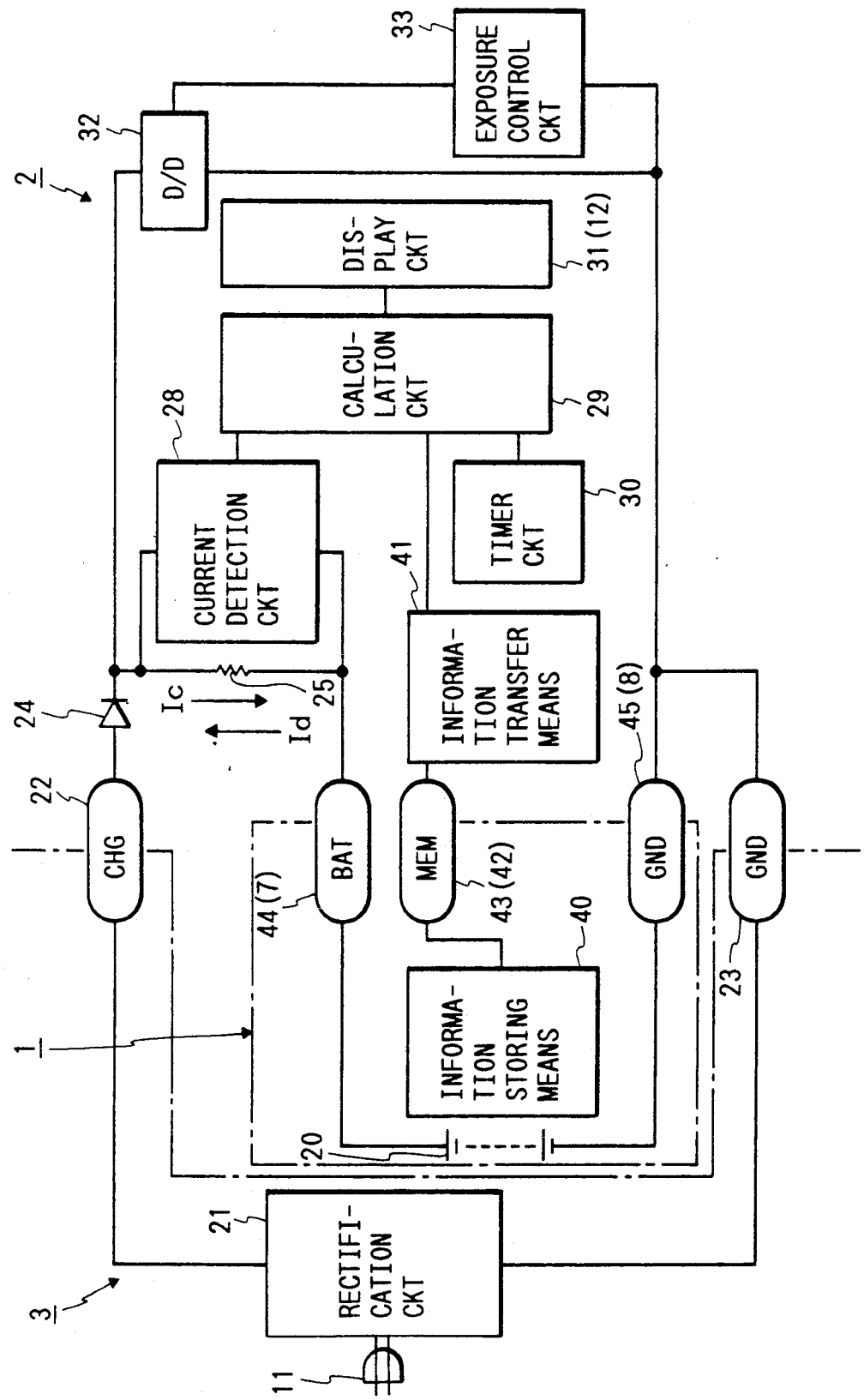
FIG. 25 is a block diagram of the embodiment shown in FIG. 24.

FIGS. 24 and 25 illustrate another embodiment of the present invention, wherein components same as or equivalent to those in FIGS. 1 to 3 are represented by same numbers and will not be explained further.

In the present embodiment, as shown in FIG. 25, a secondary battery pack 1, to be detachably mounted in a chamber 6 of a camera body 2, is provided with a reusable secondary (nickel-cadmium) battery 20 and information memory means 40 for memorizing the remaining capacity thereof, and the camera body 2 is provided with information transmission means 41 for effecting information exchange with said memory means 40, means for calculating the amount of charge and discharge of the secondary battery 20 (calculation circuit 29), and means (display circuit 31 including a display unit 12) for displaying the remaining capacity of the secondary battery 20, determined by said calculation circuit 29. A terminal MEM 43 shown in FIG. 25 is composed of a data line contact 42 formed on the inserted end of the secondary battery pack 1, independently from the electrodes 7, 8, and an unrepresented electrode formed in the camera body 2 in opposed relationship to said contact 42. Said information memory means 40 stores a value indicating the remaining capacity of the secondary battery pack 1 (hereinafter called remaining capacity data). Said data becomes zero for example in case the battery is entirely discharged. Said memory means 40 can be composed, for example, of an EEPROM (electrically erasable programmable read-only memory) or a RAM.

In the present embodiment, the display unit 12 is provided in a part of the rear face of the camera body 2.

Also a charging receptacle 9, for receiving a charging plug 10 of a charger 3 for charging when the secondary battery in said pack 1 is exhausted, is also provided on the camera body 2, and the charging of the exhausted battery can be conducted, while the secondary battery pack 1 is loaded in the chamber 6 of the camera body 2, by inserting the plug 10 of the charger 3 into said receptacle 9 on the camera body 2. The charging current from the charger 3 flows, through terminals 22 (CHG) and 33 (GND) corresponding to the plug 10 and receptacle 9 and also through a diode 24 and a resistor 25 provided in the camera body 2, to a terminal (BAT) 44 composed of the electrode 7 of the pack 1 and the unrepresented electrode of the camera body and to terminal (GND) 45 composed of the electrode 8 of the pack 1 and the unrepresented electrode of the camera body, thereby charging the secondary (nickel-cadmium) battery 20. Also in the camera body 2, a current detection circuit 28 for detecting the direction and dimension of current for supply to the calculation circuit 29 is connected parallel to the resistor 25.

In the present embodiment, various circuits and components for determining the remaining capacity of the secondary battery pack 1 are provided in the camera body 2, but the circuit structure thereof is similar to that shown in FIG. 3 so that the detailed functions of these circuits will be omitted.

When the secondary battery pack 1 is mounted to the camera body 2 in the above-explained configuration, the camera body is powered and the information transmission means 41 is activated to read the remaining capacity data of the secondary battery 20, stored in said memory means 40 through the terminal 43. Said data is transferred from the transmission means 41 to the calculation circuit 29, which thereafter continuously calculates the remaining capacity of the secondary battery 20 by detecting the charging and discharging current thereof and utilizing said data as the initial value, until the secondary battery pack 1 is detached. The remaining capacity data obtained in said calculation circuit 29 is constantly recorded, as new data, in the memory means 40 through the transmission means 41 and the terminal 43. Consequently, even when the secondary battery pack 1 is disconnected from the camera body 2, the remaining capacity data immediately before said disconnection is stored in said pack 1 itself.

Therefore, for example in case a secondary battery pack A connected to the camera body 2 is replaced by another pack B, which is afterwards replaced again by the original pack A, the remaining capacity thereof can be correctly calculated, because the information on the remaining capacity of the pack A is not lost but is maintained in said pack A itself.

In the secondary battery pack 1 has no remaining capacity, the calculation circuit 29 does not function until the power supply voltage therefor reaches a minimum function voltage after the starting of charging by the charger 3.

7th Embodiment

Figure 26:
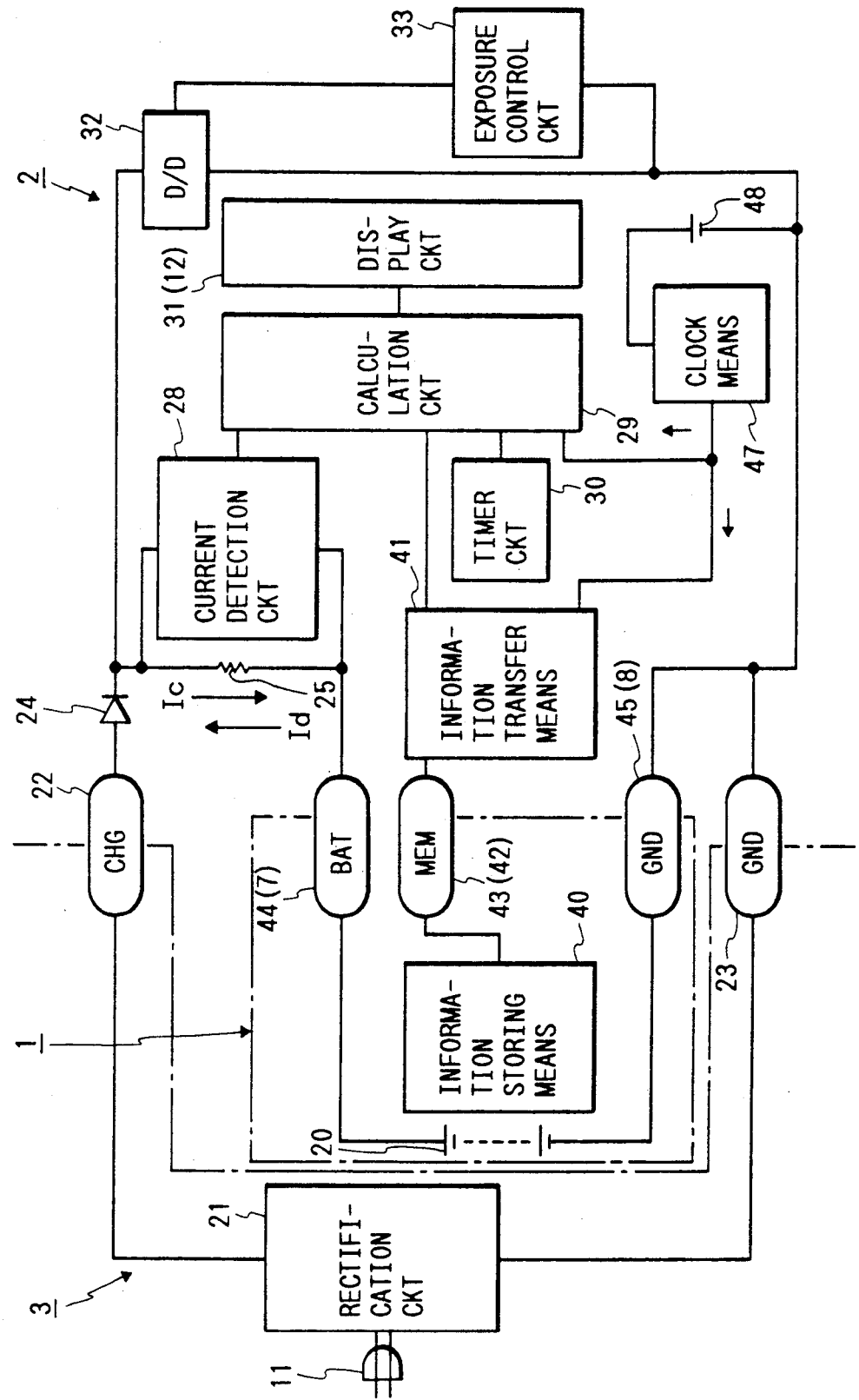
FIG. 26 is a block diagram of a 7th embodiment of the battery system, for use in a camera, of the present invention.

FIG. 26 shows a 7th embodiment of the present invention, wherein the information memory means 40 provided in the secondary battery pack 1 stores not only the remaining capacity data of the secondary battery 20 as in the 6th embodiment but also time data, indicating the time when the pack 1 is disconnected from the camera body 2.

In such configuration, the calculation circuit 29 can also calculate the decrease of the remaining capacity by self discharge (spontaneous discharge in time) of the secondary battery 20, so that the remaining capacity can be determined in more precise manner.

In this embodiment, a clock means 47 is formed by an electronic circuit connected to said information transmission means 41 and calculation circuit 29 in a part of the circuit in the camera body 2, and is provided with a back-up timer battery 48 for maintaining the function of said clock means 47 when the pack 1 is detached from the camera body 2. The clock means 47 may be constantly powered by said timer battery 48, or may be powered by the secondary battery pack when it is mounted to the camera body and by said timer battery 48 when said pack 1 is detached.

The configuration shown in FIG. 26 is same as that shown in FIG. 25 except for the clock means 47 and timer battery 28 mentioned above, and will not, therefore, be explained further.

When the secondary battery pack 1 is mounted to the camera body 2 in this embodiment, the camera body 2 is powered and the information transmission means 41 is activated to read, through the terminal 43, the remaining capacity data and time data stored in the memory means 40 of the pack 1. Said remaining capacity data and time data are transferred, from said transmission means 41, to the calculation circuit 29.

On the other hand, the calculation circuit 29 can know the current time (time data indicating the current time) from the clock means, and calculates the time (hereinafter called battery left-alone time) elapsed from the disconnection of the secondary battery pack 1 from the camera body 2 to the present, based on said current time and the time data obtained from the memory means 40.

Then the calculation circuit 29 calculates the capacity (self discharged capacity) lost by self discharge (spontaneous discharge) in said battery left-alone time), in consideration of the remaining capacity if necessary, and determines an initial value of remaining capacity by subtracting said self discharged capacity from the remaining capacity data read from the memory means 40.

On the other hand, the calculation circuit 29 determines the remaining capacity of the secondary battery 20 utilizing the current detection circuit 28 and timer circuit 30 as explained before and displays said remaining capacity on the display unit 12 of the display circuit 31.

The remaining capacity calculated in the calculation circuit 29 and the current time obtained from the clock means 47 are constantly stored, respectively as new remaining capacity data and new time data, in the memory means 40 of the pack 1 through the transmission means 41 and the terminal 43.

Consequently, even when the secondary battery pack 1 is disconnected from the camera body 2, the remaining capacity data of said pack 1 immediately before said disconnection and the time data indicating the time of said disconnection are stored in said pack 1 itself.

Therefore, for example in case a secondary battery pack A connected to the camera body 2 is replaced by another pack B, which is afterwards replaced again by the original pack A, the remaining capacity data thereof and the time data indicating the detachment of said pack A from the camera body are not lost.

In the above-explained configuration, either one of the timer circuit 30 and the clock means 47 may be used for both functions, as their functions are alike.

8th Embodiment

Figure 27:
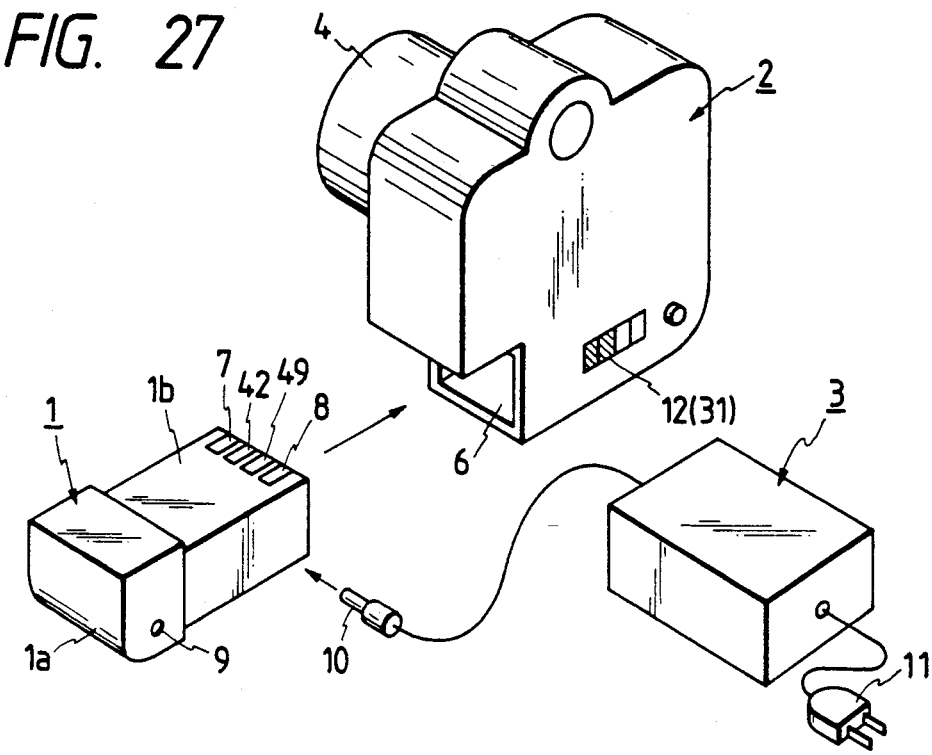
FIG. 27 is a schematic exploded perspective view of an 8th embodiment of the battery system, for use in a camera, of the present invention.
Figure 28:
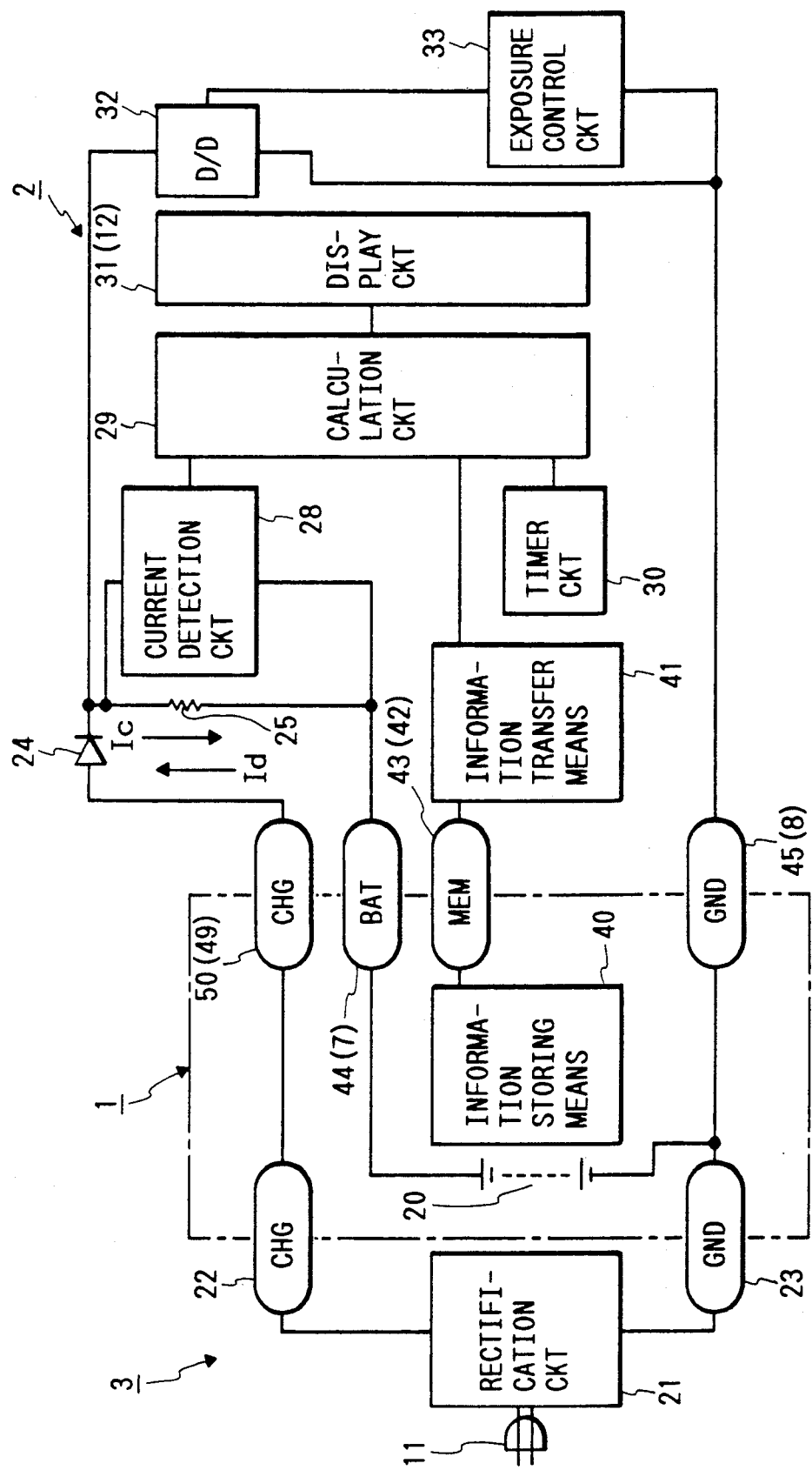
FIG. 28 is a block diagram of the embodiment shown in FIG. 27.

FIGS. 27 and 28 illustrate an 8th embodiment of the present invention, wherein the charging receptacle 9, provided on the camera body 2 in the foregoing 6th embodiment, is provided on the rectangular head portion 1a of the secondary battery pack 1, so that it is not concealed even when the pack 1 is mounted in the chamber 6 of the camera body 2.

On an end of said second battery pack 1, there are formed two electrodes 7, 8, a battery capacity data line contact 42 and a contact 49 for a charging line.

When the pack 1 is loaded in the chamber 6 of the camera body 2, the electrodes 7, 8 come into contact with unrepresented electrodes correspondingly formed in the camera body 2, thereby effecting power supply from the secondary battery in the pack 1 to the camera body 2.

At the same time, the contact 42 for battery capacity data line and the contact 49 for the charging line come into contact with unrepresented electrodes correspondingly formed in the camera body 2.

When the secondary battery in the pack 1 is exhausted, it can be charged by insertion of the plug 10 of the charger 3 into the receptacle 9 provided on the pack 1 while it is mounted on the camera body 2.

In FIG. 28, a circuit in the left-hand portion belongs to the charger 3, wherein terminals 22 (CHG), 23 (GND) correspond to the plug 10 of said charger 3 and the receptacle 9 of the secondary battery pack 1.

A circuit in the right-hand portion is a part of the internal circuits of the camera body 2. In the charging state, the current from the aforementioned rectification circuit 21 charges the secondary battery 20 through the terminal 22, a terminal 50 (CHG) consisting of the charging line contact 49 and the unrepresented contact of the camera body 2, a diode 24, a resistor 25 and terminals 44, 23. In the discharging state (when the camera body 2 is in use), the current from the secondary battery 20 is supplied, through the terminals 44 (BAT) and 45 (GND), to the camera body 2 for effecting the calculation of remaining capacity and reading and storage of remaining capacity data as in the foregoing 6th embodiment, but the explanation of these operations will be omitted.

In such configuration, though the charging receptacle 9 is provided on the pack 1, the charging and discharging current passes through the current detection circuit 28 in the camera body 2, so that the remaining capacity of the secondary battery 20 can be determined. Though not explained in this embodiment, it is also possible to include the time data by the addition of clock means 47 as in the 7th embodiment, thereby achieving detection of remaining capacity with higher reliability.

9th Embodiment

Figure 29:
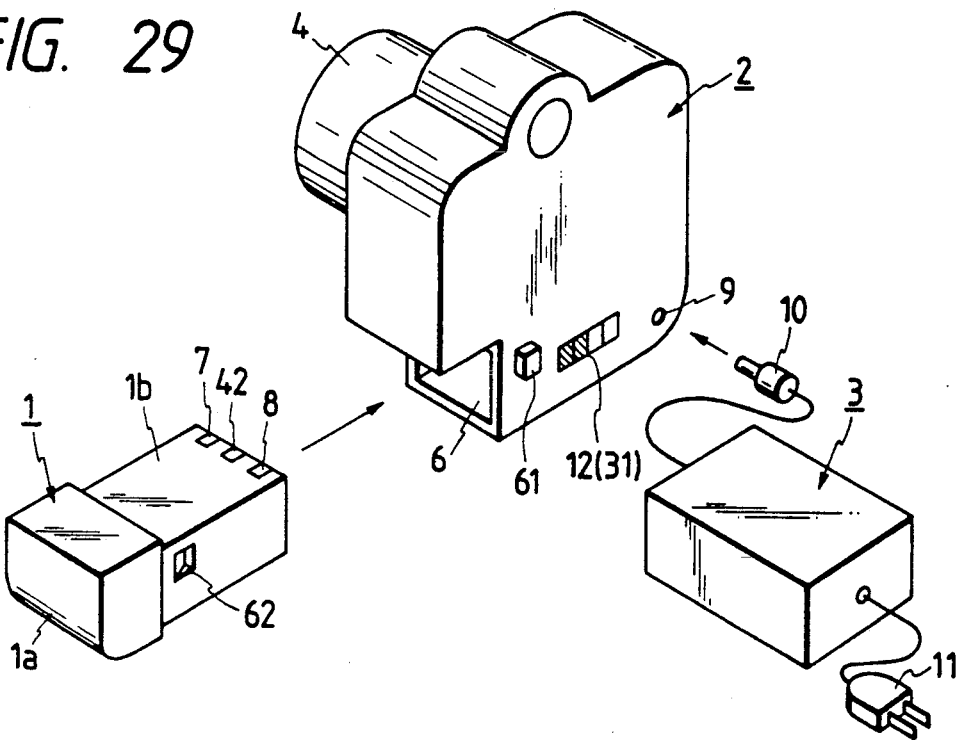
FIG. 29 is a schematic exploded perspective view of a 9th embodiment of the battery system, for use in a camera, of the present invention.
Figure 31:
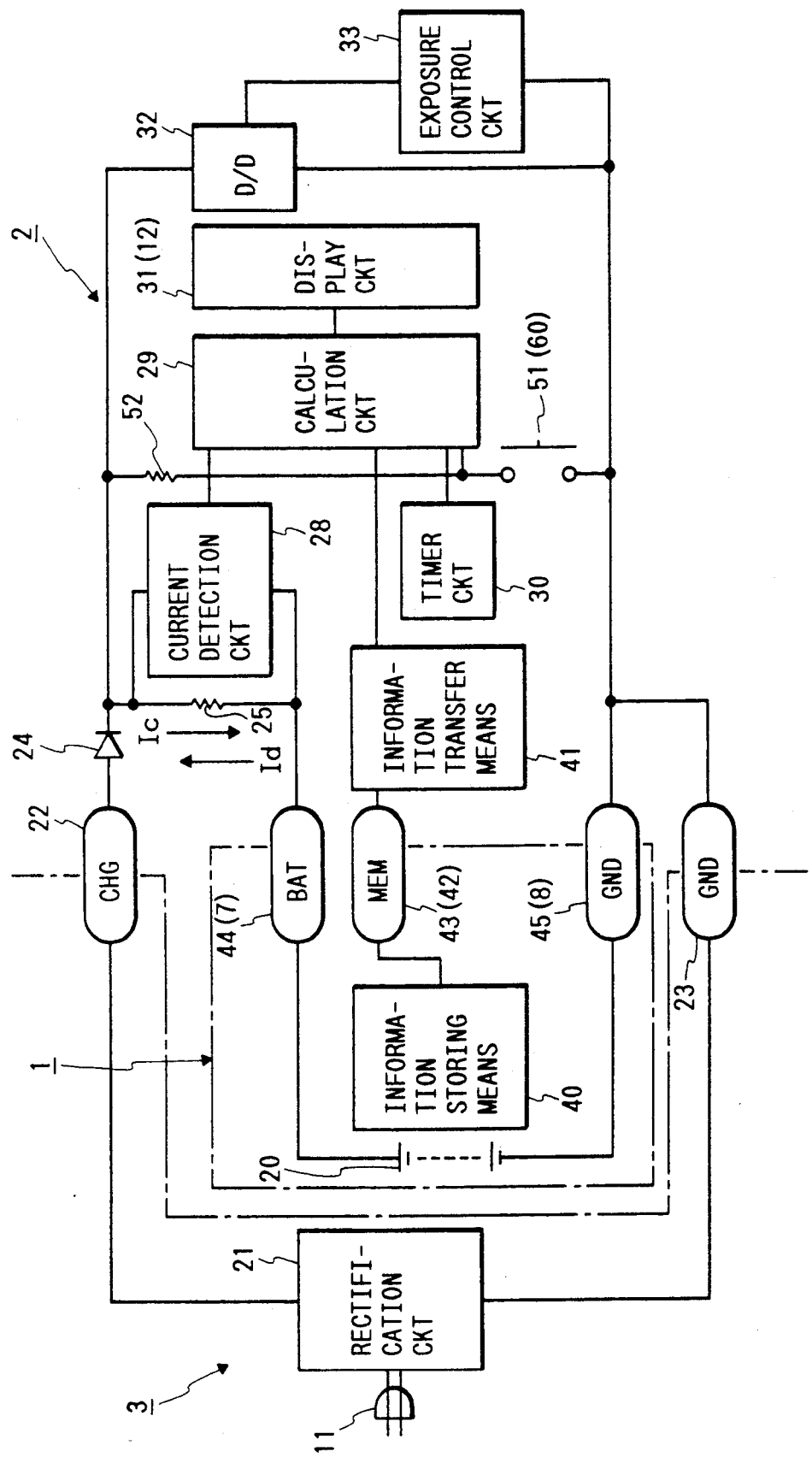
FIG. 31 is a block diagram of the embodiment shown in FIG. 29.

FIGS. 29 to 31 illustrate a 9th embodiment of the present invention, which avoids the drawback in the foregoing 6th or 8th embodiment, resulting from a fact that the remaining capacity data have to be constantly written into the memory means 40 of the pack 1 as it may be detached from the camera body 2 any time. Such frequent information transmission is a heavy burden to the transmission means 41 and the calculation circuit 29, and the remaining capacity data may be destructed in the worst case, if the pack 1 is detached from the camera body 2 in the course of recording of said data. In the present embodiment, in order to avoid such drawback, the camera body 2 is provided with a detection switch 60 for detecting the loading and unloading of the secondary battery pack 1.

FIG. 30 shows the detailed structure of said pack detecting switch 60 provided on the camera body 2. In the present embodiment, said switch 60 is combined with an unlocking button 61 for the secondary battery pack.

Contacts 66, 67 constituting the detection switch 60 are connected, by unrepresented lead wires, to the calculation circuit 29 (not shown). When the pack 1 is loaded in the camera body 2, a claw 64 provided on the camera body 2 is pressed, by means of a spring 65, to a recess 62 formed on the pack 1, whereby said pack 1 is supported in the camera body 2 and does not drop therefrom.

In such state, where the unlocking button 61 is not depressed, the contacts 66, 67 are mutually separated by the force of a spring 68, so that the switch 60 is open.

In case of detaching the pack 1 from the camera body 2, the unlocking button 61 is depressed, whereby the claw 64 disengages from the recess 62 and the pack 1 becomes detachable from the camera body 2.

Because of said depression of the unlocking button 61, the contacts 66, 67 come into mutual contact, thus closing the switch 60.

A circuit shown in FIG. 31 corresponds to that of the 6th embodiment, but also includes a detection switch 51, which corresponds to the pack detection switch 60 explained above. A terminal of said switch is grounded while the other is connected to the input terminal of the calculation circuit 29 and also pulled up by a resistor 52.

When the secondary battery pack 1 is loaded into the camera body 2 in the above-explained configuration, the camera body 2 is powered as in the 6th embodiment whereby the transmission means 41 is activated to read, through the terminal 43, the remaining capacity data of the pack 1 stored in the memory means 40 and to transmit said data to the calculation circuit 29, which effects calculation and display of the remaining capacity of the secondary battery 20, utilizing said data as the initial value.

In this embodiment, however, in contrast to the 6th embodiment, the remaining capacity data calculated by the calculation circuit 29 is not constantly transmitted to the memory means 40 for recording therein.

As already explained in relation to FIGS. 29 and 30, the unlocking button 61 has to be depressed at first, in order to detach the pack 1 from the camera body 2. Said depression closes the detection switch 60, thereby grounding the input terminal of the calculation circuit 29.

Upon detecting said grounding of the input terminal, the calculation circuit 29 stores the remaining capacity data at this point, as new data, in the memory means 40 of the pack 1 through the transmission means 41 and the terminal 43. Thus, when the pack 1 is detached from the camera body 2, the remaining capacity data of the pack 1 immediately before said detaching is stored in said pack 1 itself.

In the foregoing there has been explained the detection of detachment of the secondary battery pack 1 from the camera body 2 by means of a detection switch 60 provided thereof, but a pack mounting detection switch, for detecting the loading of the pack 1 in the camera body 2, may be additionally provided thereon. A detection signal from said pack mounting detection switch can be utilized for causing the transmission means 41 to read the remaining capacity data of the pack 1 from the memory means 40 and to transmit said data to the calculation circuit 29.

The present embodiment is formed by adding the detection switch 60 to the configuration of the 6th embodiment, but said detection switch may also be added to that of the 8th embodiment. Also in this case, there may be added the clock means and time data, as in the 7th embodiment. In such configuration, the remaining capacity data and time data need not be constantly recorded in the memory means, but can only be recorded when the detachment of the pack 1 from the camera body 2 is detected by the detection switch 60.

10th Embodiment

Figure 33:
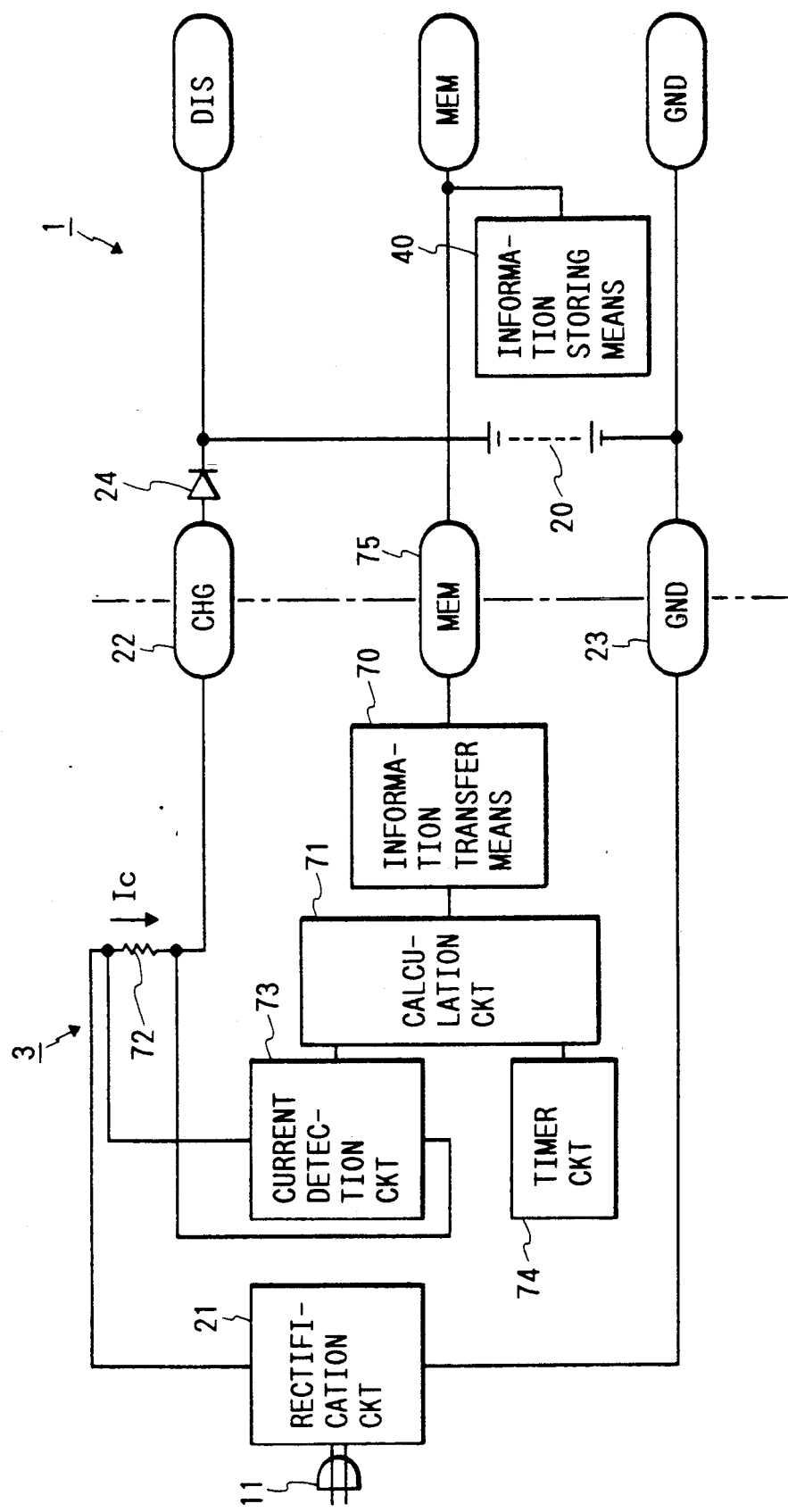
FIG. 33 is a block diagram showing the circuit structure between a charger and a secondary battery pack in the embodiment shown in FIG. 32.
Figure 34:
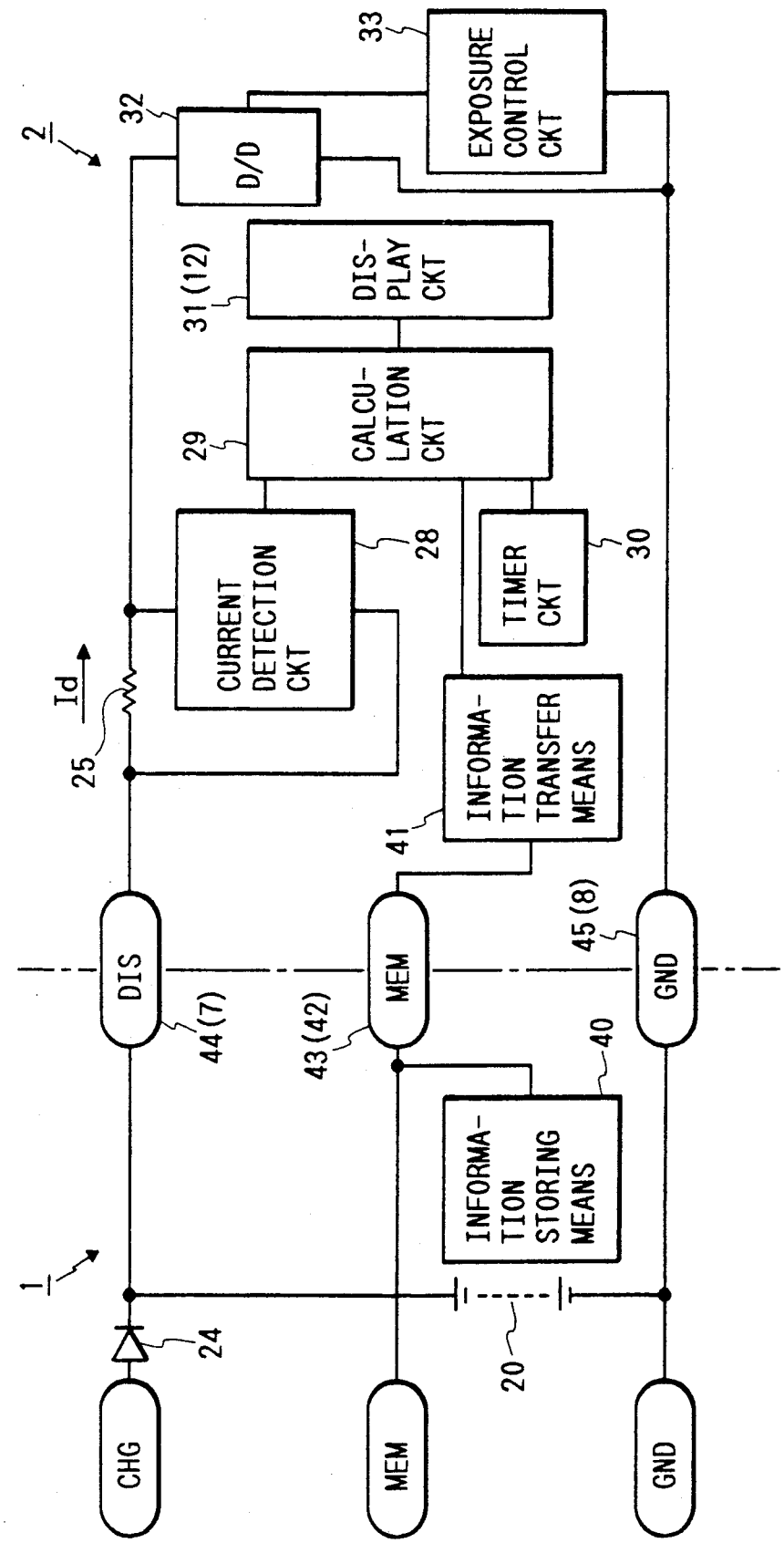
FIG. 34 is a block diagram showing the circuit structure between the secondary battery pack and the camera body in the embodiment shown in FIG. 32.

FIGS. 32 to 34 illustrate a 10th embodiment of the present invention, wherein the charger 3 for charging the secondary battery pack 1 is provided with information transmission means 70 for communicating with the memory means 40 of the pack 1 and means 71 for calculating the amount of charging of the secondary battery 20, whereby, upon connection of the charge 3 to the pack 1, the remaining capacity of the secondary battery 20 stored in the memory 40 is transmitted through the transmission means 70 to the calculation circuit 71 of the charger 3 and the remaining capacity after charging, obtained in said calculation circuit 71, is transmitted to the memory means 40 of the pack 1.

In the battery system of a camera, as already explained in the foregoing, the resistor 25, current detection circuit 28, calculation circuit 29, timer circuit 30 and information transmission circuit 41 have to be connected to the secondary battery 20 both in the charging and discharging states. In the foregoing 6th to 9th embodiments, since these circuits are provided in the camera body 2, the pack 1 has to be connected to the camera body 2 during the charging operation, so that the camera cannot be used during said operation (even if the camera can be used, the phototaking operation is hindered by the connection of the charger 3 and the AC plug 11).

In order to avoid such drawback, the present embodiment is featured by a fact that the camera body 2 is provided, as shown in FIG. 34, with the resistor 25, current detection circuit 28, timer circuit 30, calculation circuit 29 and information transmission means 41, and that the charger 3 is also provided, as shown in FIG. 33, with a resistor 72, a current detection circuit 73, a timer circuit 74, a calculation circuit 71 and information transmission means 70.

In FIG. 33, a terminal 75 (MEM) for connecting the memory means 40 of the pack 1 with the transmission means 70 of the charger 3, is composed, as shown in FIG. 32, of a receptacle 76 for the capacity data line of the pack 1 and a plug 77 of the capacity data line of the charger 3.

As shown in FIG. 32, the secondary battery pack 1 is provided with the charging receptacle 9, and a receptacle 76 for the capacity data line in the vicinity thereof. When the secondary battery 20 is exhausted, the pack 1 is detached from the camera body 2, and it can be charged by insertion of the plug 10 of the charger 3 into the receptacle 9 provided on the pack 1 and insertion of the capacity data line plug 77 of the charger 3 into the data line receptacle 76 of the pack 1. In this embodiment, the remaining capacity display means 12 is provided on the camera body 2.

In the above-explained configuration, the charging operation of the secondary battery pack 1 by the charger 3 and the discharging operation when said pack 1 is loaded in the camera body are conducted in the following manner:

(1) Charging operation

FIG. 33 shows an electrical circuit when the pack 1 is connected to the charger 3, wherein a left-hand portion indicates the circuit of the charger 3. An AC current is supplied from a plug 11 to a rectification circuit 21, which supplies a DC charging current.

Terminals 22 (CHG), 23 (GND) are composed of the charging plug 10 of the charger 3 and the receptacle 9 on the pack 1.

The current from the rectification circuit 21 charges the secondary battery 20, through the resistor 72, terminal 22, diode 24 (incorporated in the pack 1) and terminal 23.

Said diode 24 is provided for preventing damage in the secondary battery 20 and in the circuits of the camera body 2 shown in FIG. 34, when a voltage of a different polarity from that of the charger 3 is erroneously applied to the terminals 22, 23.

The remaining capacity data of the secondary battery 20, stored in the memory means 41, is read by the transmission means 70 through a terminal 75 (MEM), consisting of the data line receptacle 76 of the pack 1 and the data line plug 77 of the charger 3, and is transmitted to the calculation circuit 71, which utilizes said data as the initial value. The resistor 72, provided for converting the current between the terminals 22, 23 into a voltage, converts the charging current in a direction Ic into a voltage for supply to the current detection circuit 73, which thereby detects thus generated current and sends the amount thereof to the calculation circuit 71. Also receiving the output of the timer circuit 74, the calculation circuit 71 determines the dimension of current of the secondary battery 70 at each time, through the calculation based on the charging current as already explained before. Said calculation circuit 71 calculates the remaining capacity from said dimension of current and the initial value obtained from said memory means 40.

Also the remaining capacity calculated by the calculation circuit 71 is stored, as new data, constantly in the memory means 40 through the transmission means 70 and the terminal 75. Consequently, when the secondary battery pack 1 is detached from the charger 3, the remaining capacity data of the secondary battery 20 immediately before said detachment is stored in the pack 1 itself.

(2) Discharging operation

FIG. 34 shows the electric circuit when the secondary battery pack 1 is loaded in the camera body 2. Upon said loading, the current from the secondary battery 20 is supplied through the terminals 44 (DIS) and 45 (GND) to the camera body 2, whereby the transmission means 41 thereof is activated to read, through the terminal 43, the remaining capacity data of the pack 1, stored in the memory means 40, and to transmit said data to the calculation circuit 29, which utilizes said data as the initial value of the remaining capacity. The resistor 25 is provided for converting the current between the terminals 44, 45 into a voltage, and converts, in the discharging state, the current in the direction Id into a voltage for supply to the current detection circuit 28, which detects and sends the amount of thus generated current to the calculation circuit 29.

Also receiving the output of the timer circuit 30, the calculation circuit 29 calculates the dimension of current of the secondary battery 20 at this point, through calculation with said current amount, also determines the remaining capacity from said dimension of current and the initial value obtained from the memory means 40 and displays said remaining capacity by the display circuit 31.

The remaining capacity data calculated by the calculation circuit 29 is also recorded, as new data, constantly in the memory means 40 through the transmission means 41 and the terminal 43. Consequently, when the secondary battery pack 1 is disconnected from the camera body 2, the remaining capacity data of the pack 1 immediately before said disconnection is stored in the pack 1 itself, as in the foregoing embodiments. In this embodiment, as explained above, the camera body 2 determines only the amount of discharge of the secondary battery 20.

This embodiment provides an advantage that the camera can be used while a spare battery pack is charged, since the secondary battery pack needs not be connected to the camera body during the charging operation.

In the present embodiment, the charger 3 is provided with the resistor 72, current detection circuit 73, timer circuit 74, and calculation circuit 71, but it may also be provided with a display circuit for displaying the remaining capacity of the secondary battery 20 during the charging operation. Also in FIG. 32 the charging plug 10 and the data line plug 77 are formed as two independent plugs, but they may be formed in an integral structure so that they may be connected or disconnected at the same time.

Furthermore, in the present embodiment, there may be added the clock means and time data as in the foregoing 7th embodiment, and the structure of the camera body 2 may be based on the 9th embodiment, which consists of the pack detection switch added to the structure of the 6th embodiment.

11th Embodiment

Figure 35:
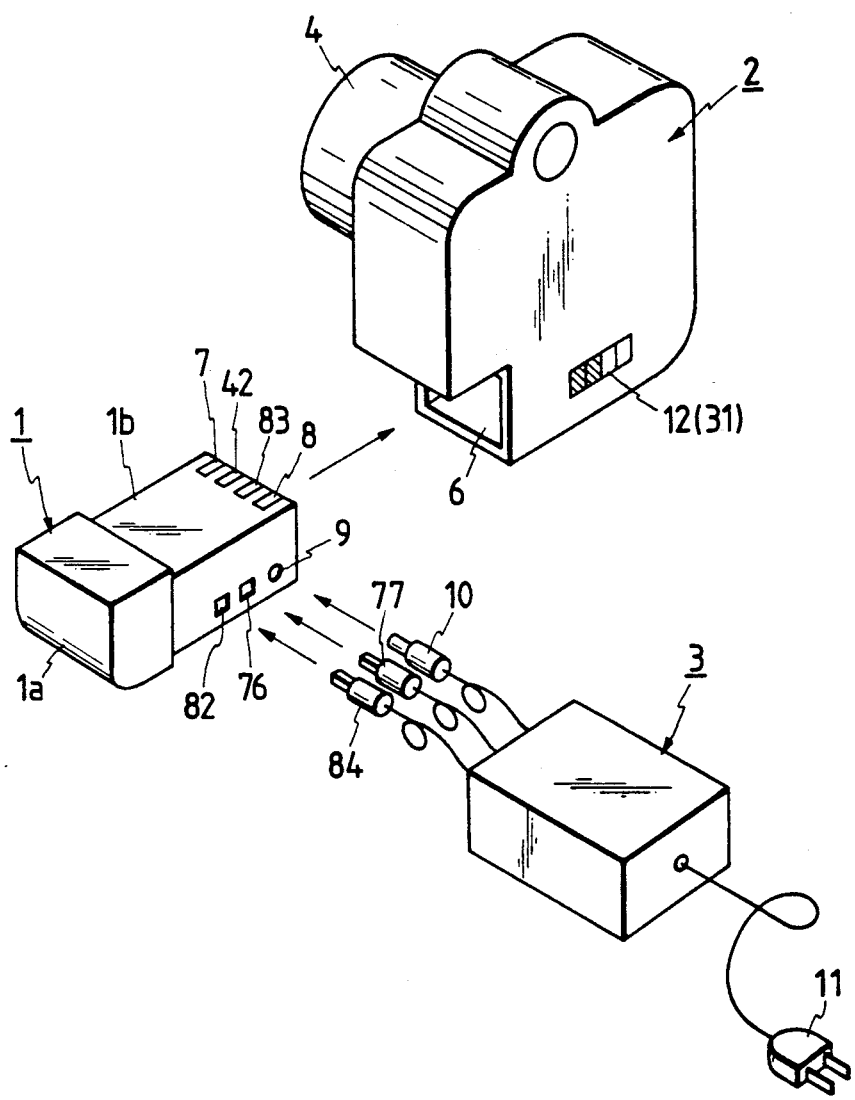
FIG. 35 is a schematic exploded perspective view of an 11th embodiment of the battery system, for use in a camera, of the present invention.
Figure 36:
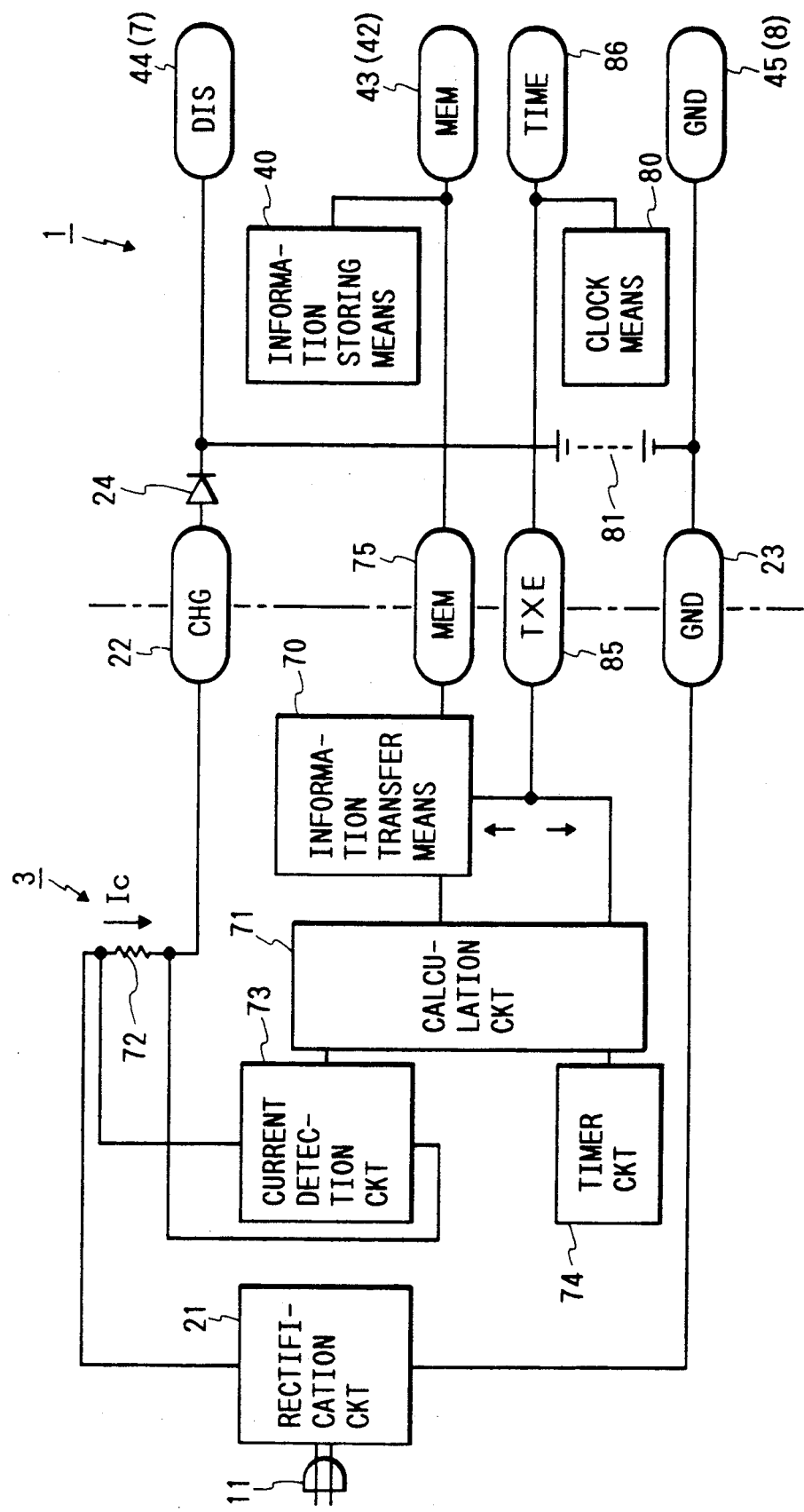
FIG. 36 is a block diagram showing the circuit structure between a charger and a secondary battery pack in the embodiment shown in FIG. 35.
Figure 37:
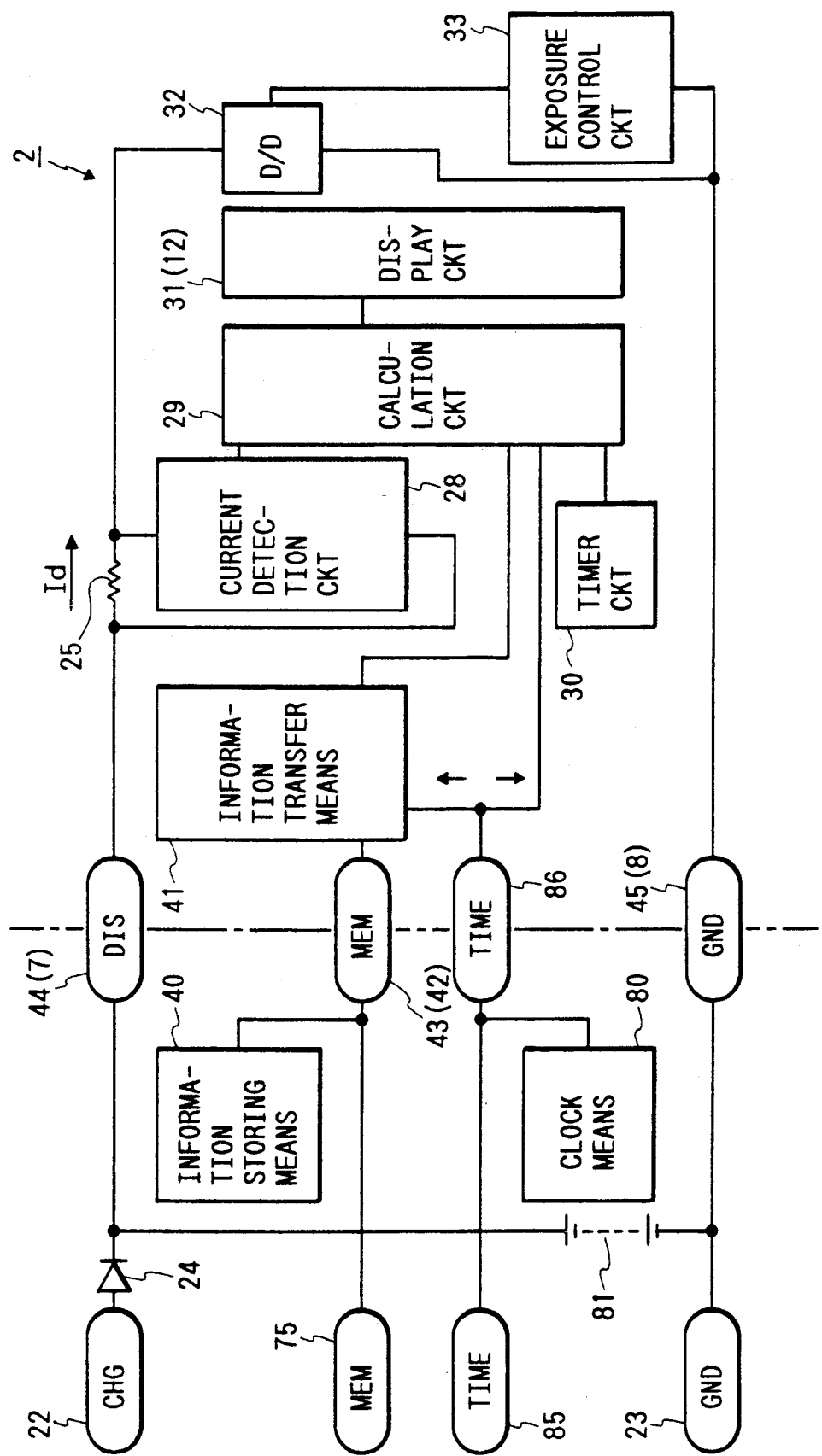
FIG. 37 is a block diagram showing the circuit structure between the secondary battery pack and the camera body in the embodiment shown in FIG. 35.

FIGS. 35 to 37 illustrate an 11th embodiment of the present invention, which is featured, in a configuration of the foregoing 10th embodiment having the resistors 25, 72, current detection circuits 28, 73, timer circuits 30, 74 and calculation circuits 29, 71 in the camera body 2 and the charger 3, by a simplified structure in adding the clock means and timer data for adding the function of calculating the capacity decrease by self discharge.

It is conceivable, in a simplest way, to add such clock means in the camera body (hereinafter called clock means E) and in the charger 3 (hereinafter called clock means F).

In such case, upon loading of the secondary battery pack 1 into the camera body 2, the calculation circuit 29 of the camera body calculates the battery left-alone time and the self discharged capacity, based on the time data (also remaining capacity data if necessary) read from the memory means 40 of the pack 1 through the transmission means 41 of the camera body and the current time obtained from the clock means E of the camera body. Said current time data from the clock means E is constantly recorded as new time data, together with the remaining capacity data calculated by the calculation circuit 29 of the camera body, into the memory means 40 of the pack 1.

Also upon connection of the charger 3 to the secondary battery pack 1, the calculation circuit 71 of the charger 3 calculates the battery left-along time and the self discharged capacity, based on the time data (also remaining capacity data if necessary) read from the memory means 40 of the pack 1 through the transmission means 70 of the charger 3 and the current time obtained from the clock means F of the charger 3. Said current time data from the clock means F is constantly recorded as new time data, together with the remaining capacity data calculated by the calculation circuit 71 of the charger 3, into the memory means 40 of the pack 1 through the transmission means 70 of the charger 3.

When the clock means E, F are respectively provided in the camera body 2 and the charger 3, they have to exactly match each other in the indicated time. For example, they should not be such that the clock means E indicates 13:01 hours on Jan. 1, 1990 when the clock means F indicates 12:01 hours on Jan. 1, 1990.

This is because of the following reason. The time data indicating the time of disconnection of the pack 1 from the charger 3 is based on the clock means of said charger 3, while that indicating current time when the pack 1 is loaded in the camera body 2 is based on the clock means thereof. Therefore, if the clock means of the camera body 2 and that of the charger 3 indicate different times, the elapsed time (battery left-along time) from the disconnection of the pack 1 from the charger 3 to the connection to the camera body 2 cannot be known exactly.

Also, as already explained in the 7th embodiment, each of the clock means in the camera body and in the charger requires a clock battery.

In the present embodiment, in order to avoid the above-mentioned drawbacks, the clock means in the camera body 2 and the charger 3 are replaced by clock means 80 in the secondary battery pack 1, and time data obtained therefrom is transmitted to the camera body 2 and the charger 3 through exclusive contacts.

More specifically, as shown in FIG. 35, a receptacle 76 for battery capacity data line and a receptacle 82 for a clock signal are provided on the pack 1, in the vicinity of the charging receptacle 9. Also on an end of the pack 1, there are provided two electrodes 7, 8, a data line contact 42 and a clock signal contact 83. When said pack 1 is mounted in the chamber 6 of the camera body 2, the electrodes 7, 8 come into contact with unrepresented corresponding electrodes provided in the camera body 2, thereby effecting power supply thereto. At the same time, the data line contact 42 and the clock signal contact 83 also come into contact with unrepresented corresponding contacts provided in the camera body 2.

When the secondary battery 20 in the pack 1 is exhausted, said pack 1 is extracted from the camera body 2 and can be charged by insertions of the charging plug 10, data line plug 77 and clock signal plug 84, all connected to the charger 3, into the receptacles 9, 76, 82 of the pack 1. In the present embodiment, the display unit 12 for the remaining capacity is provided on the camera body 2.

The above-explained configuration functions in the following manner:

(1) Charging operation

FIG. 36 shows the electrical circuit when the charger 3 is connected to the secondary battery pack 1. Since said circuit is basically same as that of the 10th embodiment shown in FIG. 33, the following description will be concentrated only on the different points.

As in the 10th embodiment, the memory means 40 stores the remaining capacity data of the pack 1 and the time data indicating the time when the pack 1 is disconnected from the camera body 2 or the charger 3. Clock means 80 is provided, not in the camera body 2 nor the charger 3, but in the secondary battery pack 1.

A terminal 75 (MEM) is composed of the data line receptacle 76 of the pack 1 and the data line plug 77 of the charger 3 shown in FIG. 35, while a terminal 85 (TIME) is composed of the clock signal receptacle 82 on the pack 1 and the clock signal plug 84 of the charger 3, shown in FIG. 35.

The information transmission means 70 reads, through the terminal 75, the remaining capacity data of the pack 1 and the time data, stored in the memory means 40, and sends said data to the calculation circuit 71, which can know the current time from the clock means 80 through the terminal 85, and calculates the battery left-alone time from said current time data and the time data obtained from the memory means 40. The self discharged capacity, namely a capacity lost by self (spontaneous) discharge, can be calculated from said battery left alone time, also in consideration of the remaining capacity if necessary. The calculation circuit 71 determines the initial value of the remaining capacity by subtracting said self discharged capacity from the remaining capacity data read from the memory means 40.

Also the dimension of current can be determined by the resistor 72, current detection circuit 73, timer circuit 74 and calculation circuit 71, which calculates the remaining capacity from said dimension of current and said initial value of the remaining capacity.

The remaining capacity data calculated by the calculation circuit 71 and the current time data obtained from the clock means 80 through the terminal are constantly recorded, as new data, into the memory means 40 through the transmission means 70 and the terminal 75.

Consequently, when the secondary battery pack 1 is disconnected from the charger 3, the remaining capacity data of the secondary battery 20 immediate before said disconnection and the time data indicating the time of said disconnection are stored in the secondary battery pack 1 itself.

(2) Discharging operations

FIG. 37 shows the electrical circuit when the secondary battery pack 1 is mounted on the camera body 2. Since said circuit is basically same as that of the 7th embodiment shown in FIG. 26, the following description will be concentrated only on the different points.

A terminal 44 (DIS) corresponds to the electrode 7 in FIG. 35 and the unrepresented corresponding electrode of the camera body 2, while a terminal 45 (GND) corresponds to the electrode 8 in FIG. 35 and an unrepresented corresponding electrode of the camera body 2.

Also a terminal 43 (MEM) is composed of the data line contact 42 in FIG. 35 and the unrepresented corresponding contact of the camera body 2, while a terminal 86 (TIME) is composed of the clock signal contact 83 in FIG. 35 and the unrepresented corresponding contact of the camera body 2.

In the above-explained configuration, the information transmission means 41 reads, through the terminal 43, the remaining capacity data of the pack 1 and the time data from the memory means 40, and sends said data to the calculation circuit 29, which can also receive the current time data from the clock means 80 through the terminal 86. The calculation circuit 29 calculates the battery left-alone time from said current time data and the time data obtained from the memory means 40, then calculates the self discharged capacity, namely the capacity lost by self (spontaneous) discharge based on said battery left-alone time, and determines the initial value of the remaining capacity by subtracting said self discharged capacity from the remaining capacity data read from the memory means 40.

Also the dimension of current is determined by the resistor 25, current detection circuit 28, timer circuit 30, and calculation circuit 29, which then calculates the remaining capacity from said dimension of current and said initial value of remaining capacity.

The remaining capacity data, calculated by the calculation circuit 29, and the current time data obtained from the clock means 80 through the terminal 86 are constantly recorded, as new data, into the memory means 40 through the transmission means 41 and the terminal 43.

Consequently, when the pack 1 is disconnected from the camera body 2, the remaining capacity data of the secondary battery 20 immediate before said disconnection and the data indicating the time of said disconnection are stored in the secondary battery pack 1 itself.

As the timer circuits 30, 74 are similar in function to the clock means 80 as explained before, it is possible to dispense with the timer circuits 30 of the camera body and that 74 of the charger 3, and to achieve the functions of said timer circuits with the clock means 80 of the pack 1. As shown in FIGS. 36 and 37, the clock means 80 is provided with a back-up clock battery 81.

Also in FIG. 35, the charging plug 10, data line plug 77 and clock signal plug 84 are constructed as three independent plugs, but they may also be constructed as an integrated structure to enable simultaneous connection and disconnection of the three.

Also in the foregoing 6th to 11th embodiments, the information transmission means 41, 70 are provided independently from the calculation circuits 29, 71, but the functions of said transmission means may be achieved by the calculation circuits. For example if the calculation circuits 29, 71 are composed of MCU's (microcomputer units) and the memory means 40 is composed of an EEPROM, the functions of the transmission means are often included in those of MCU's.

Said information transmission means 40 can be composed, for example, of a RAM or an EEPROM (electrically erasable programmable read-only memory).

In the battery systems of the foregoing 6th to 11th embodiments, the camera body is provided with circuit means for detecting and displaying the remaining capacity of the secondary battery pack, including a resistor, a current detection circuit, a timer circuit, a calculation circuit and a display circuit, while the secondary battery pack is provided with information memory means for storing the information on said remaining capacity etc., and information transmission means for effecting information exchange between said memory means and said calculation circuit is provided in the camera body, and such configuration provides various excellent effects as described below:

(1) Since the current detection circuit, timer circuit, calculation circuit and display circuit are all incorporated in the camera body, they need not be provided in each secondary battery pack, the cost and the space of the entire apparatus can be saved.

Also as a subsidiary effect, the display unit, composed for example of a liquid crystal display device, need not be provided on the secondary battery pack but in a position of the camera body, which can be easily observed during the phototaking operation.

(2) The remaining capacity data, calculated by the current detection circuit, timer circuit, and calculation circuit of the camera body, is constantly recorded in the memory means of the secondary battery pack, so that, even when the secondary battery pack is detached from the camera body, the data on the remaining capacity of the secondary battery pack immediately before said detachment is stored in said pack itself.

Therefore, even in case a secondary battery pack mounted on the camera body is replaced by another pack, which is afterwards replaced again by the original pack, the remaining capacity thereof can be correctly calculated because the information of the remaining capacity thereof is not lost.

(3) The charging receptacle on the camera body can be dispensed with by providing the secondary battery pack with a contact for the charging line. Thus the charging receptacle can be provided on said pack.

(4) Use of a switch for detecting the secondary battery pack avoids the necessity of constantly recording the new remaining capacity data from the calculation circuit of the camera body to the memory means of the pack, thereby reducing the burden on said calculation circuit and avoiding the possibility of destruction of the remaining capacity data, depending on the timing of disconnection of the secondary battery pack from the camera body.

(5) A configuration including the resistor, current detection circuit, timer circuit and calculation circuit also on the charger avoids the necessity of connection the secondary battery pack to the camera body during the charging operation, whereby the camera can be used even during the charging operation.

(6) The decrease of the remaining capacity, resulting from self discharge (spontaneous discharge of battery in time), can also be calculated by providing the camera body with clock means and recording the time data in addition to the remaining capacity data, in the memory means of the secondary battery pack.

(7) A configuration provided with a resistor, a current detection circuit, a timer circuit and a calculation circuit in each of the camera body and the charger, also with clock means in the secondary battery pack, wherein the time data obtained from said clock means is transmitted, through exclusive contacts, to the calculation circuits of the camera body and of the charger, avoids the drawback encountered in case the clock means is provided in each of the camera body and the charger, namely the incorrect calculation of the battery left-alone time resulting from the difference of time indicated by the clock means of the camera body and time indicated by that of the charger.

12th Embodiment

FIGS. 38 to 43 illustrate another embodiment of the battery system of the present invention, wherein components same as or equivalent to those in FIGS. 1 to 8 are represented by same numbers and will not be explained further.

The basic structure of the camera of the present embodiment, powered by a secondary battery 20 and incorporating and automatic film winding motor etc. as the load, is same as already explained in relation to FIGS. 1 and 2, but the present embodiment is featured by a contact 50, provided at an end of the inserted portion 1b of the aforementioned secondary battery pack 1 and between the electrodes 7, 8, for transmitting a timing signal for controlling the load means, said contact being brought into contact with an unrepresented contact of the camera body thereby connected to the electric circuit therein when said secondary battery pack 1 is mounted on the camera body 2.

The above-mentioned battery system, consisting of secondary battery pack 1, equipped with means for calculating and displaying the remaining capacity of the secondary battery including a resistor 25, a current detection circuit 28, a timer circuit 30, a calculation circuit 29, a display circuit 31 etc., and a camera body equipped with load means such as motors, resistors etc. and load control means for effecting on/off control of each of the load means, is featured by a load control timing signal generating circuit 360 which generates a load control timing signal, indicating the control state of the load means, in response to a signal from said load means, wherein said timing signal is transmitted to the calculation circuit 29 thereby controlling the timing of detection and fetching of the charge-discharge converted signal and of data calculation in said calculation circuit 29.

Figure 38:
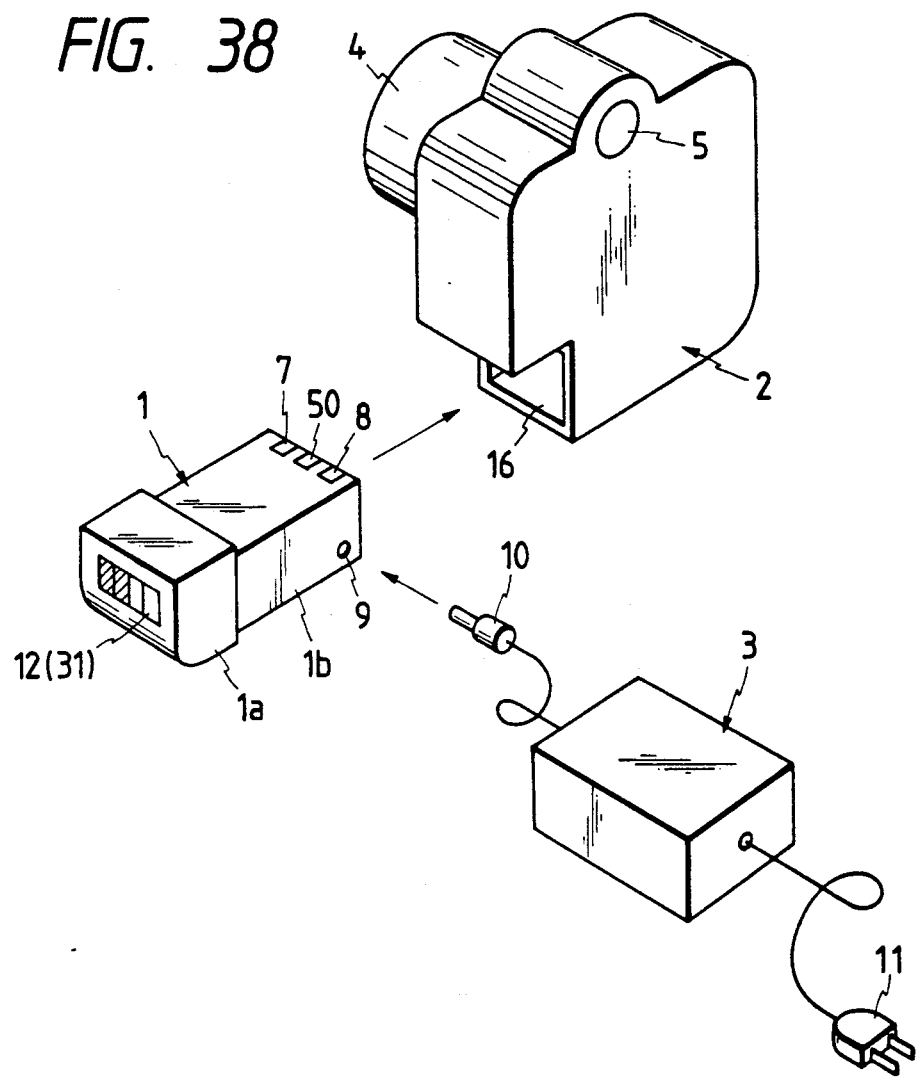
FIG. 38 is a schematic exploded perspective view of 12th to 15th embodiments of the battery system, for use in a camera, of the present invention.
Figure 40B:
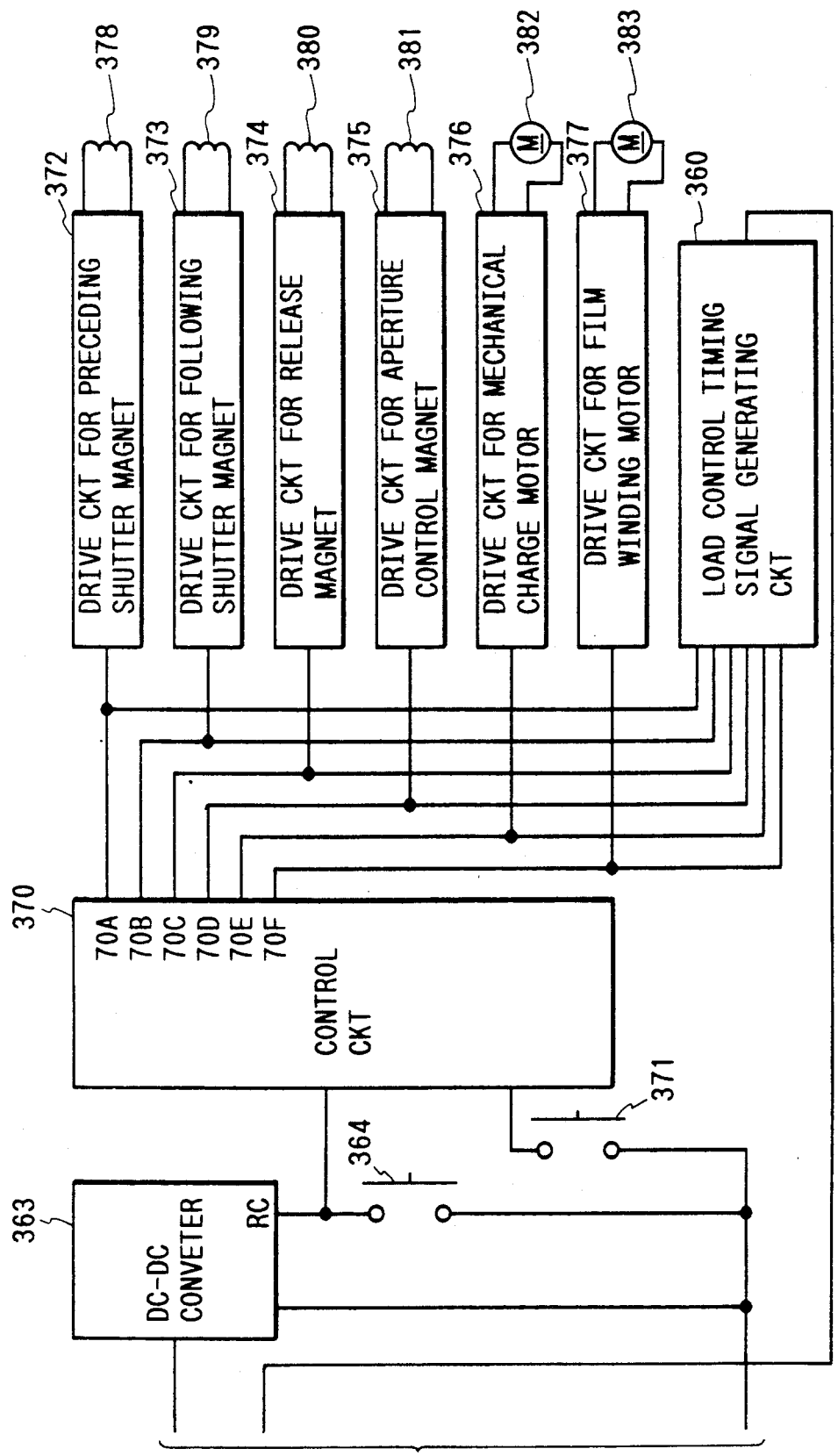

The circuit of this battery system shown in FIG. 40 is different from that shown in FIG. 3 in that the calculation circuit 29 is provided with a control terminal CTRL, which is pulled up by a resistor 361 to a power supply line Vcc connected to the positive terminal of the secondary battery 20 and is also connected to a terminal 362 (CTL), corresponding to the contact 50 shown in FIG. 38. As will be explained later in detail, the timing of fetching of the charge-discharge signal, and of calculation in the calculation circuit 29 is controlled by the load control timing signal supplied from said terminal 362.

In FIG. 40, the lower portion indicates a part of the internal circuit of the camera body 2.

The power from the secondary battery 20 is supplied, through terminals 26, 27, to a DC-DC converter 363, of which a control terminal RC is connected to a half-stroke switch 364. Said DC-DC converter 363 is activated when said control terminal RC is shifted to the low level state, thereby supplying a constant voltage Vdd to a control circuit 370 and an unrepresented light metering circuit. Said control terminal of the DC-DC converter 363 is also connected to an output terminal (power supply hold terminal) of the control circuit 370, whereby said control circuit 370 can force the DC-DC converter 363 to continue the supply of Vdd. When a switch 371 is closed by the depression of a shutter release button, the control circuit 370 sends control signals, according to a predetermined sequence to be explained in relation to FIG. 41, to a drive circuit 372 for a shutter leading curtain controlling solenoid, a drive circuit 373 for a shutter trailing curtain controlling solenoid, a drive circuit 374 for a shutter releasing solenoid, a drive circuit 375 for a diaphragm controlling solenoid, a drive circuit 376 for a charging motor; and a drive circuit 377 for a film winding motor (said six drive circuits being collectively called load drive circuits).

The drive circuit 372 for the shutter leading curtain controlling solenoid controls a leading curtain controlling solenoid when the control signal (leading curtain solenoid control signal 370A) from the control circuit 370 is shifted to the low level state.

The drive circuit 373 for the shutter trailing curtain controlling solenoid controls a trailing curtain controlling solenoid when the control signal (trailing curtain solenoid control signal 370B) from the control circuit 370 is shifted to the low level state.

The release solenoid drive circuit 374 controls a release solenoid 380 when the control signal (release solenoid control signal 370C) from the control circuit 370 is shifted to the low level state.

The drive circuit 375 for the diaphragm control solenoid controls a diaphragm controlling solenoid 381 when the control signal diaphragm solenoid control signal 370D) from the control circuit 370 is shifted to the low level state.

The drive circuit 376 for the charging motor controls a charging motor 382 when the control signal (charging motor control signal 370E) from the control circuit 370 is shifted to the low level state.

The drive circuit 377 for the film winding motor controls a film winding motor 383 when the control signal (film winding motor control signal 370F) from the control circuit 370 is shifted to the low level state.

The leading curtain control signal 370A, trailing curtain control signal 370B, release solenoid control signal 370C, diaphragm control signal 370D, charging motor control signal 370E and film winding motor control signal 370F mentioned above are collectively called load control signals.

Also the leading curtain control solenoid 378, trailing curtain control solenoid 379, release solenoid 380, diaphragm control solenoid 381, charging motor 382 and film winding motor 383 mentioned above are collectively called load elements.

Said timing signal generating circuit 360 generates signals indicating the start and end of load controls (hereinafter called load control timing signal) in response to said load control signals supplied from the control circuit 370 to said load drive circuits, and said load control timing signals are supplied, through the terminal 362, to the control input terminal CTRL of the calculation circuit 29.

While said load control timing signal is in the high level state, the calculation circuit 29 effects fetching and processing of the charge-discharge converted signal with a predetermined sampling time Tc, as in the aforementioned conventional system. However the function of said calculation circuit 29, after the load control timing signal is shifted to the low level state, is different in the "fetch start timing control method" and the "fetch period control method" mentioned before. The function in each case will be explained later.

Figure 41:
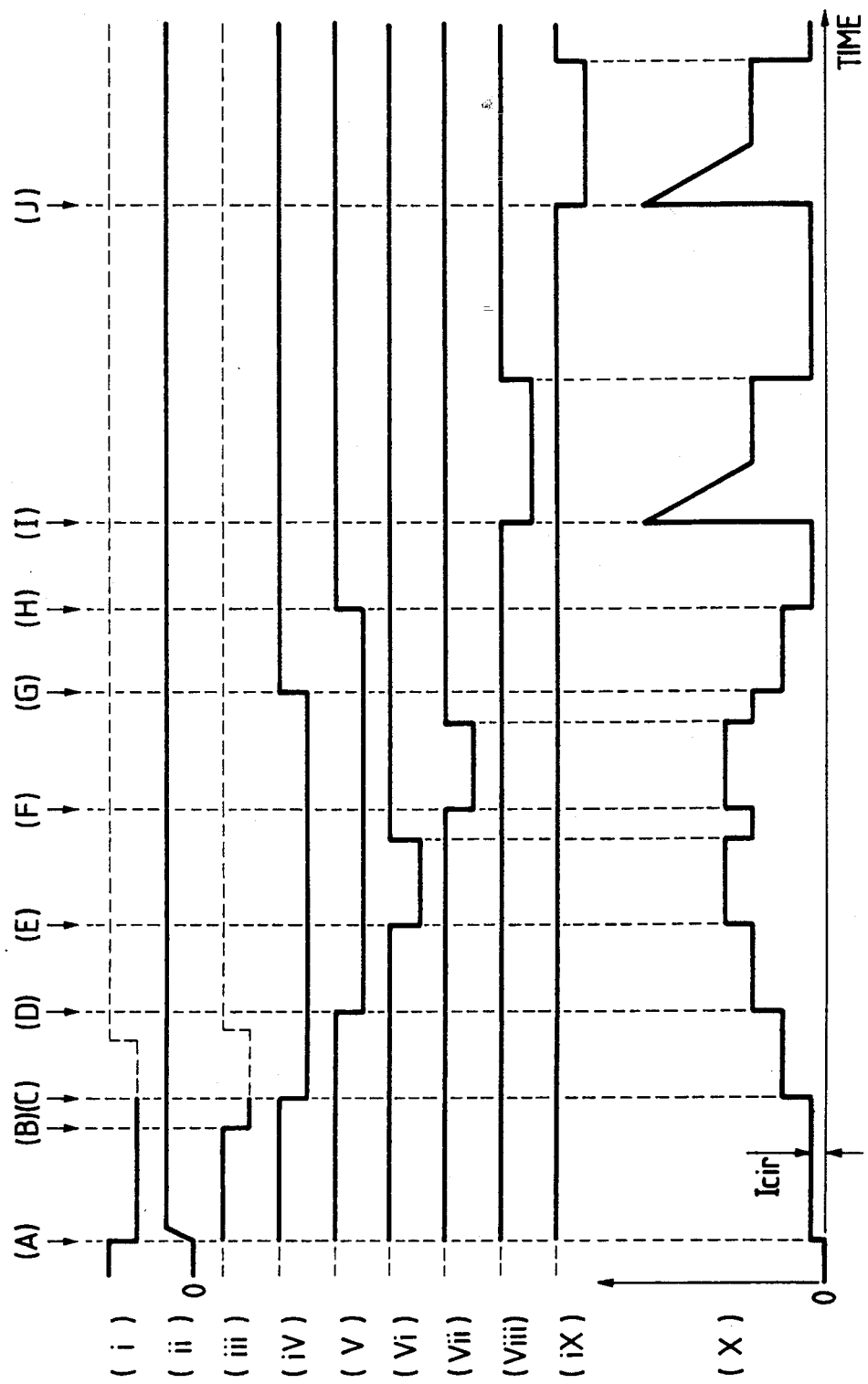
FIG. 41 is a wave form chart showing the timing of control sequence and the charge-discharge converted signal (discharge current form of the secondary battery) in the 12th to 15th embodiments of the battery system of the present invention.

FIG. 41 is a timing chart showing the control sequence of the camera body 2, wherein (i) indicates a half-stroke signal generated by the half-stroke switch 364. This is a low-active signal serving also for controlling the DC-DC converter 363.

(ii) indicated the output voltage Vdd of the DC-DC converter 363, supplied for example to the control circuit 370.

iii) indicates the low-active release switch signal explained before.

(iv), (v), (vi), (vii) and (viii) respectively indicate the leading curtain solenoid control signal 370A, trailing curtain solenoid control signal 370B, release solenoid control signal 370C, diaphragm solenoid control signal 370D, charging motor control signal 370E and film winding motor control signal 370F explained above, which are all low-active signals.

These control signals have following control timings:

(A) When the half-stroke switch 364 is closed, the half-stroke switch signal (i) is shifted to the low level, thereby shifting the control terminal RC of the DC-DC converter 363 to the low level state. Thus said converter 363 is activated to elevate the voltage Vdd to a predetermined value. Thus the control circuit 370 etc. are powered, and the unrepresented light metering circuit etc. start their functions. Also the control circuit 370 shifts the afore-mentioned power supply hold terminal, connected to the control terminal RC, to the low level, whereby the control circuit 370 forces the DC-DC converter 363 to continue the supply of the voltage Vdd even after the half-stroke switch 364 is opened.

(B) When the shutter release switch 371 is closed, the release switch signal (iii) is shifted to the low level. Said release switch signal (iii) is supplied to the control circuit 370, which in response enters a predetermined shutter releasing sequence (C) to (J).

(C) The control circuit 370 shifts the leading curtain solenoid control signal 370A (iv) to the low level, whereby the leading curtain solenoid drive circuit 372 energizes the leading curtain control solenoid 378. Upon being energized, said solenoid 378 attracts and supports an unrepresented lever for stopping the leading curtain of the shutter. Said lever is in advance supported mechanically by an unrepresented shutter release lever.

(D) Then the control circuit 370 shift the trailing curtain solenoid control signal 370B (v) to the low level, whereby the trailing curtain solenoid drive circuit 373 energizes the trailing curtain control solenoid 379. Upon being energized, said solenoid 379 attracts and supports an unrepresented lever for stopping the trailing curtain of the shutter. Said lever is in advance supported mechanically by an unrepresented shutter release lever.

(E) The control circuit 370 shifts the release solenoid control signal 370C (vi) to the low level for a predetermined period, whereby the release solenoid drive circuit 374 energizes the release solenoid 380 for said period. In response, said unrepresented release lever is released and starts function, whereby said stopping levers for the leading and trailing curtains are released from mechanical support. However said stopping levers for the leading and trailing curtains are still supported by the attraction of the solenoids 378, 379. Also an unrepresented quick-return mirror is released and starts to elevate. Furthermore, an unrepresented diaphragm stop lever is released, and an unrepresented diaphragm starts the aperture closing operation.

(F) Upon detecting by unrepresented aperture monitoring means that the said diaphragm has been reduced to a predetermined aperture, the control circuit 370 shifts the diaphragm solenoid control signal (vii) to the low level for a predetermined period, whereby the diaphragm solenoid drive circuit 375 energizes the diaphragm control solenoid 381 for said period, thereby activating an unrepresented diaphragm stop lever to terminate said aperture closing operation.

(G) The control circuit 370 shifts the leading curtain solenoid control signal 370A (iv) to the high level state, whereby the leading curtain solenoid drive circuit 372 deactivates the leading curtain control solenoid 373. As said leading curtain stop lever becomes no longer attracted, an unrepresented leading curtain of the shutter starts to run.

(H) After the lapse of a predetermined shutter time from (G), the control circuit 370 shifts the trailing curtain solenoid control signal 370B (v) to the high level state, whereby the trailing curtain solenoid drive circuit 373 deactivates the trailing curtain control solenoid 379. As said trailing curtain stop lever becomes no longer attracted, an unrepresented trailing curtain of the shutter starts to run.

(I) The control circuit 370 shifts the charging motor control signal 370E (viii) to the low level until unrepresented detection means detects the completion of shutter charging operation, whereby the charging motor drive circuit 376 activates the charging motor 382 during said low level state. Said charging motor 382 effects a charging operation, by moving said release lever, diaphragm, quick-return mirror, leading and trailing curtains of the shutter etc. Thus the aforementioned release lever, leading curtain, leading curtain stop lever, trailing curtain, trailing curtain stop lever, diaphragm, diaphragm stop levers, quick-return mirror etc. are returned to a state prior to the step (C), namely a state before the start of the shutter releasing sequence.

In certain cameras, the charging motor 382 is driven simply for a predetermined period, without utilizing the detection of completion of charging operation by the detection means.

(J) The control circuit 370 shifts the film winding motor control signal 370F (ix) to the low level state until unrepresented detection means detects the completion of a film winding operation, whereby the film winding motor drive circuit 377 activates the film winding motor 383 during said low level state. Said motor rotates an unrepresented sprocket, thereby advancing the film by a frame.

In certain cameras, the film winging motor 383 is activated simply for a predetermined period, without utilizing said detection means.

In FIG. 41, (x) indicates the charge-discharge converted signal (proportional to the discharge current in this case) of the secondary battery 20 in the above-explained sequence, wherein Icir indicates a current consumed by the control circuit 370 and the unrepresented light-metering circuit etc. Said current is present while these circuits are powered by the DC-DC converter 363.

The charge-discharge converted signal (discharge current) varies significantly at each release of the load control signals (iv)-(ix) from the control circuit 370. As already explained in relation to FIG. 8, such wave form will evidently result in a significant error in the calculation of remaining capacity if the sampling is conducted with a constant sampling cycle time Tc.

In the following there will be explained (1) fetch start timing control method and (2) fetch period control method.

(1) Fetch start timing control method:

While the load control timing signal is in the high level state, the calculation circuit 29 executes normal calculation of remaining capacity, with the signal intake time Tin and the signal non-intake time Tno. When said timing signal is shifted to the low level state, the calculation circuit 29 immediately interrupts the normal calculation routine for the remaining capacity (by interrupting the fetching of charge-discharge converted signal or the calculation of said signal, eventually including to discard the data of the current cycle for obtaining the dimension of current), starts immediately the fetching of the charge-discharge converted signal and executes the routine for calculating the remaining capacity in normal manner.

Figure 5:
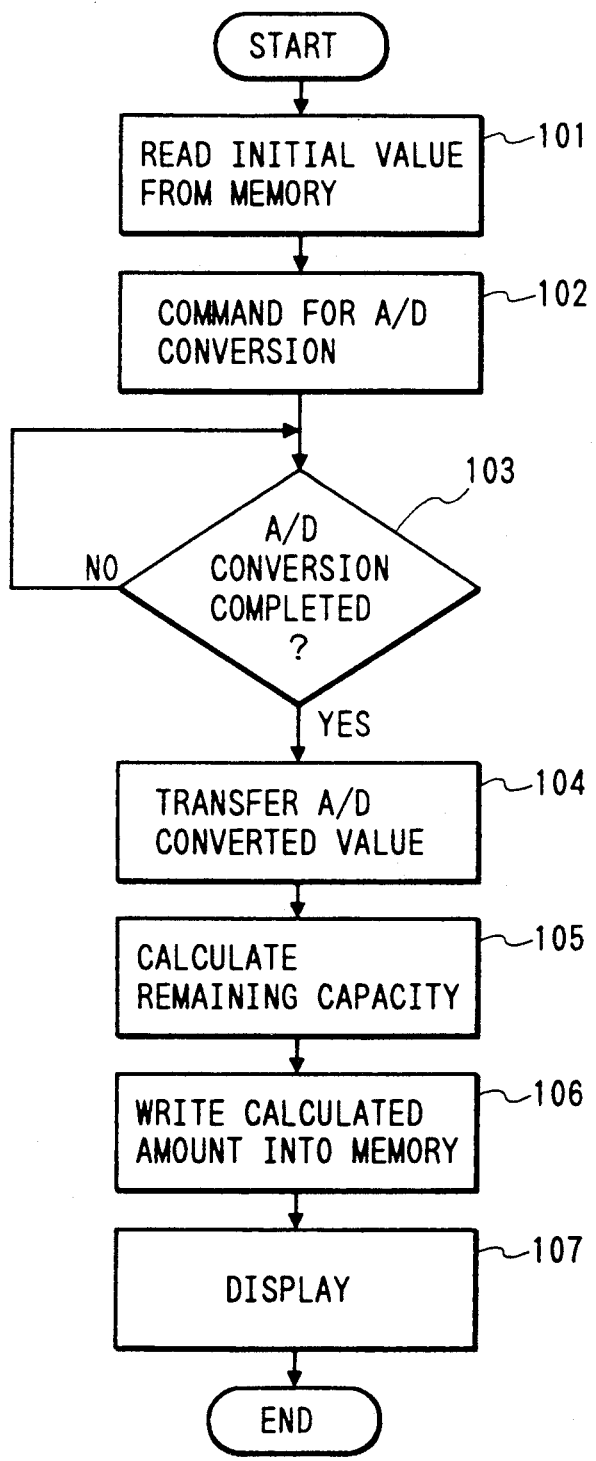
FIG. 5 is a flow chart of a sequence for calculating the remaining capacity of the secondary battery, to be executed by the microcomputer shown in FIG. 4.
Figure 6A:
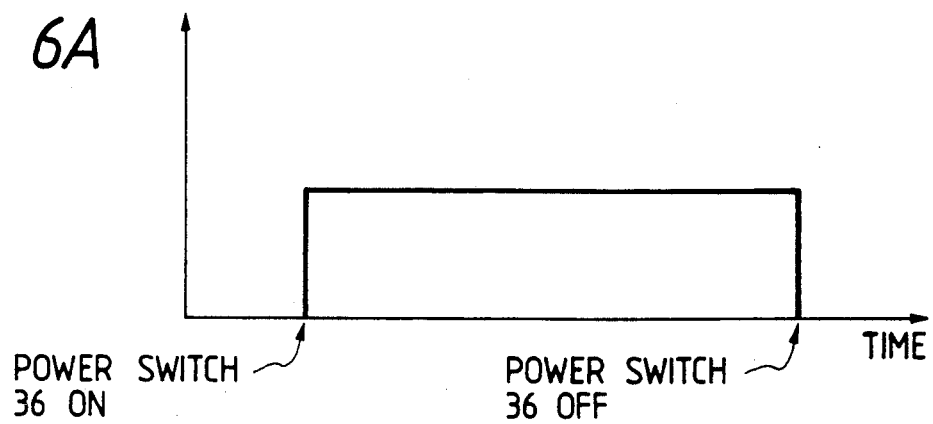
FIGS. 6A to 6C are charts showing the charge-discharge converted signal, sampling signal wave form and interpolated signal wave form in case a resistor constitutes the load.
Figure 6B:
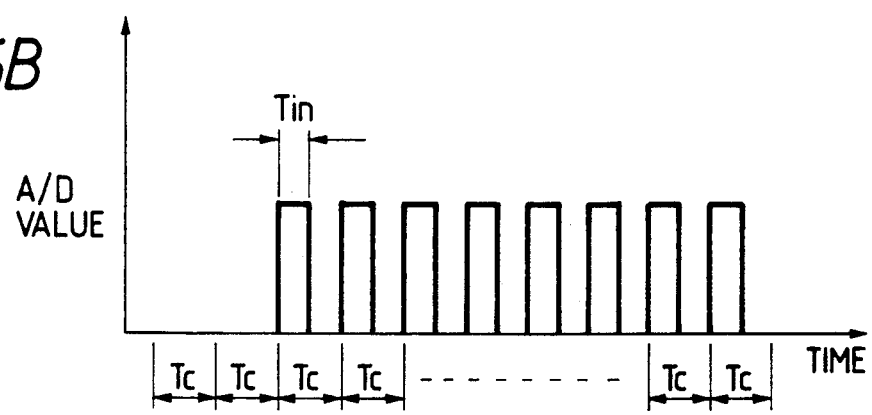
Figure 6C:
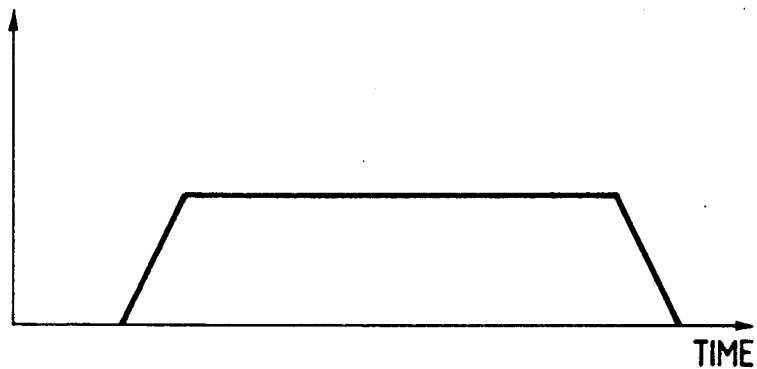
Figure 7A:
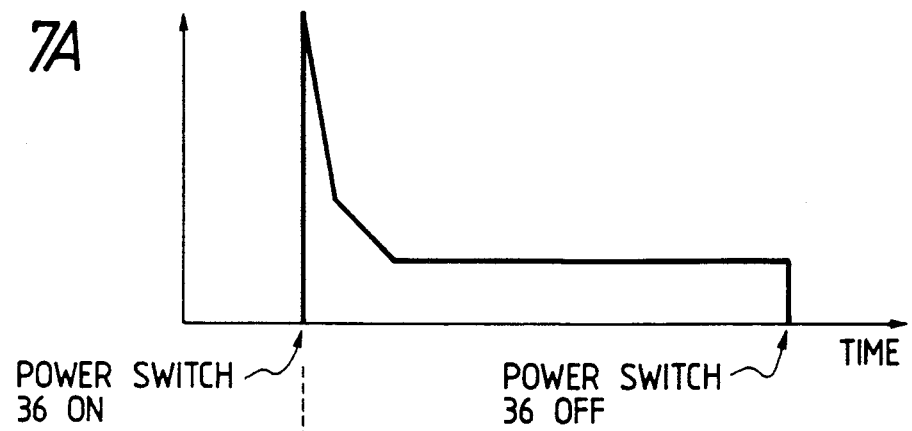
FIGS. 7A to 7C are similar charts showing an example of charge-discharge converted signal, sampling signal wave form and interpolated signal wave form in case a motor constitutes the load.
Figure 7B:
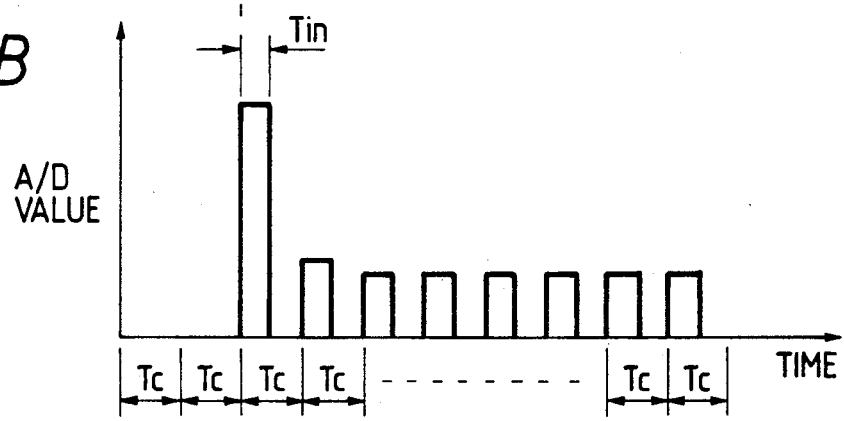
Figure 7C:
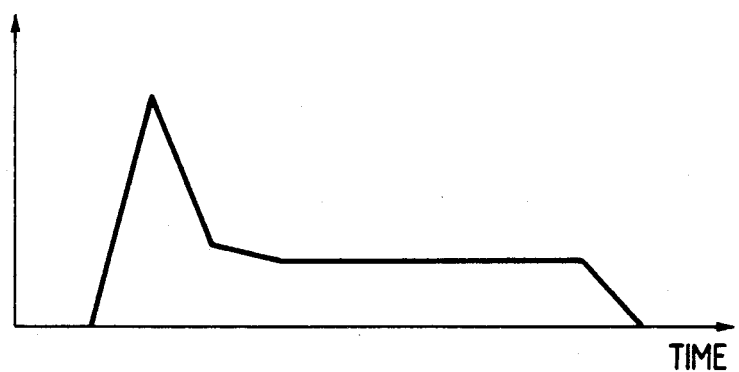
Figure 8A:
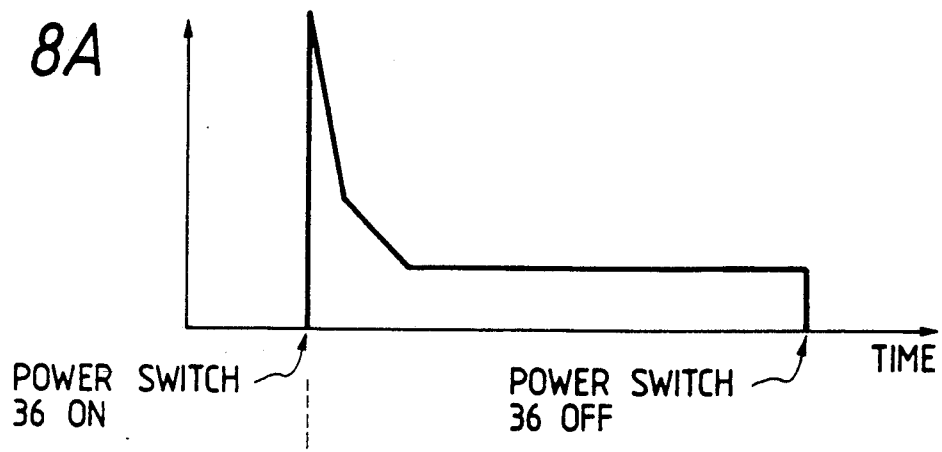
FIGS. 8A to 8C are similar charts showing another example, in case a motor constitutes the load.
Figure 8B:
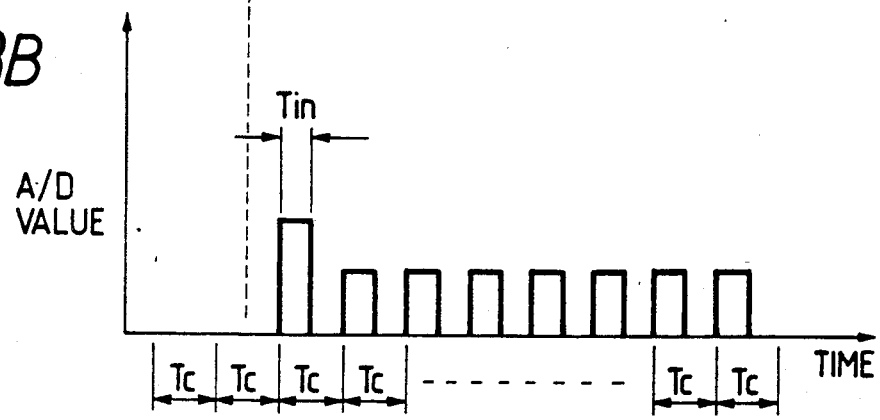
Figure 8C:
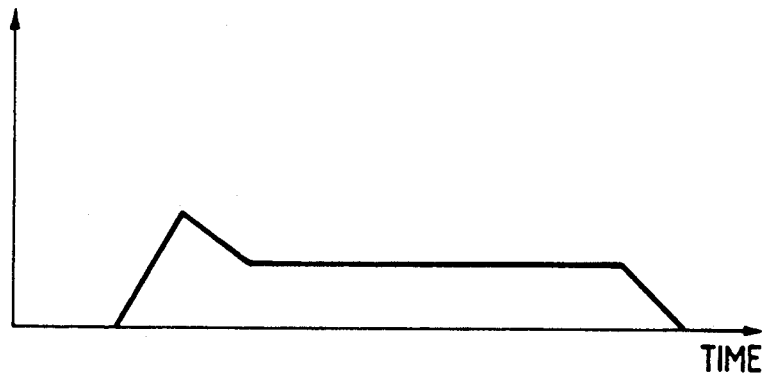

It is assumed that the calculation circuit 29 is composed of a double-integration A/D converter 41 and a microcomputer 42 as shown in FIGS. 4 and 5. While said load control timing signal is in the high level state, the calculation circuit executes, as in the aforementioned conventional configuration, the fetching of charge-discharge converted signal (signal integration), reference integration, memory reading, transmission of A/D converted value, calculation, memory writing, display etc. with a predetermined sampling cycle time Tc. When said timing signal is shifted to the low level state, the above-mentioned normal processing is interrupted, with the data of the current cycle for determining the dimension of current being discarded, and the calculation circuit 29 immediately starts the fetching of the charge-discharge converted signal and executes the routine for calculating the remaining capacity (repetition of the steps of signal fetching in a period T1, reference integration, transmission of A/D converted value, calculation, storage in memory and display) in normal manner.

In this case, therefore, there is only controlled the start timing of the normal routine for calculating the remaining capacity.

(2) Fetch period control method

During the high level state of the load control timing signal, the calculation circuit 29 executes the normal routine for calculating the remaining capacity, with the signal intake time Tin and the signal non-intake time Tno. When said timing signal is shifted to the low level state, the calculation circuit 29 immediately interrupts said normal routine (by interrupting the normal fetching of charge-discharge converted signal or the calculation, eventually discarding the data of the current cycle for determining the dimension of current), starts immediately the fetching of the charge-discharge converted signal and continues said fetching while said timing signal is in the low level state. Thus the signal fetching period is extended corresponding to said low level state. When the load control timing signal is thereafter shifted to the high level state, the calculation circuit 29 effects the calculation process on the charge-discharge converted signal fetched during the low level state of the load control timing signal, and then re-starts the normal calculation routine for the remaining capacity with the signal intake time Tin and the signal non-intake time Tno.

It is again assumed that the calculation circuit 29 is composed, as shown in FIGS. 4 and 5, of a double-integration A/D converter 41 and a microcomputer 42. During the high level state of said load control timing signal, the calculation circuit 29 executes the fetching of charge-discharge converted signal (signal integration), reference integration, memory reading, transmission of A/D converted value, calculation, memory writing, display etc. with the predetermined sampling cycle time Tc as in the conventional configuration. When said timing signal is shifted to the low level state, the calculation circuit 29 interrupts the above-mentioned normal sequence, by eventually discarding the data of the current cycle for determining the dimension of current, starts immediately the fetching of charge-discharge converted signal (signal integration) and continues said fetching during the low level state of said timing signal. When said timing signal returns to the high level state, said signal fetching (signal integration) is terminated, and there are conducted steps of reference integration, memory reading, transmission of A/D converted value, calculation, memory writing and display. Thereafter the calculation circuit 29 returns to the normal routine for calculating the remaining capacity, consisting of repetition of the steps of signal fetching in a period T1, reference integration, transmission of A/D converted value, calculation, memory writing and display.

Thus, in this method, there are controlled the start timing of the normal routine for calculating the remaining capacity and the signal fetching period thereof.

Figure 42:
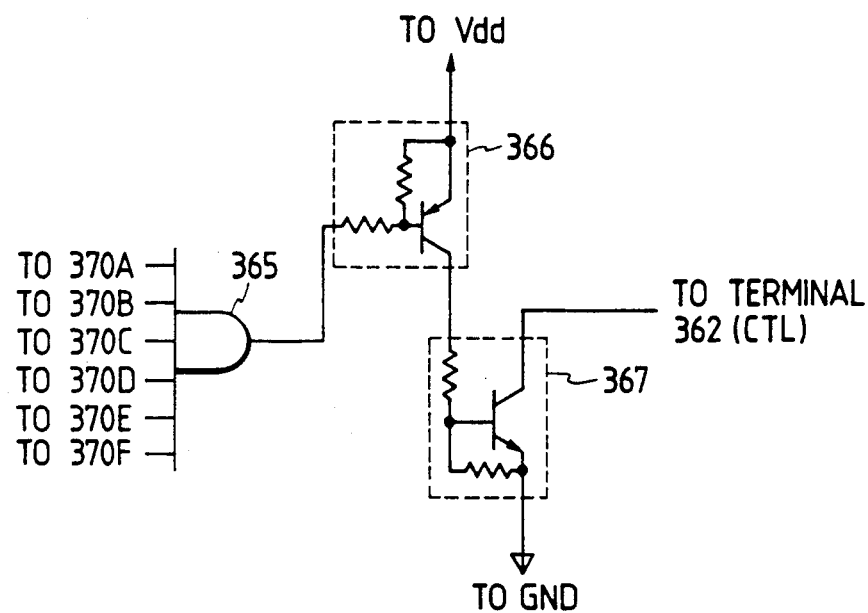
FIG. 42 is a circuit diagram of a load control timing signal generating circuit of the 12th embodiment of the present invention.

FIG. 42 shows an example of the detailed structure of the circuit 360 for generating the load control timing signal, employed in the present embodiment.

As already explained in relation to FIG. 40, the load control timing signal (indicating the duration of load control in this case) is generated in response to the load control signals supplied from the control circuit 370 to the aforementioned load drive circuits.

The voltage Vdd is supplied to the unrepresented power supply port of a 6-input AND gate 365 and to the emitter of a resistor-incorporated transistor 366.

Six input ports of the 6-input AND gate 365 respectively receive the load control signals shown in FIG. 40, namely the leading curtain solenoid control signal 370A, trailing curtain solenoid control signal 370B, release solenoid control signal 370C, diaphragm solenoid control signal 370D, charging motor control signal 370E and film winding motor control signal 370F.

The output of said AND gate 365 is supplied to the base of said resistor-incorporated transistor 366, of which collector is also connected to the base of another resistor-incorporated transistor 367. The emitter thereof is grounded, and the collector output thereof is supplied, as the load control timing signal, to the control input terminal CTRL of the calculation circuit 29 through the terminal 362 (CTL) shown in FIG. 40.

When the voltage Vdd is not supplied, the transistor 366 is not powered, whereby the transistors 366, 367 are both turned off and the load control timing signal assumes the high level state.

When Vdd is supplied by the activation of the DC-DC converter 363 in FIG. 40, six load control signals supplied to the 6-input AND gate 365 assume the high-level state, whereby said AND gate 365 releases a high-level output signal. Consequently the transistors 366, 367 remain turned off, and the load control timing signal remains in the high-level state.

Then, when the release switch 371 is closed, the control circuit 370 releases, in succession, according to the predetermined sequence, the leading curtain solenoid control signal 370A, trailing curtain solenoid control signal 370B, release solenoid control signal 370C, diaphragm solenoid control signal 370D, charging motor control signal 370E and film winding motor control signal 370F, by shifting each of said signals from the high level to low and again to high. As explained before, each load element is activated during the low level state of the corresponding load control signal.

When any of the load control signals is shifted to the low level state, the AND gate 365 provides a low level output in the corresponding period, whereby the transistors 366, 367 are turned on and the load control timing signal is shifted to the low level state.

In this manner the load control timing signal assumes the low level state while any of the load elements is driven.

In the following there will be explained the functions of the configuration shown in FIGS. 40 to 42, in each of (1) fetch start timing control method and (2) fetch period control method explained above.

(1) Case of fetch start timing control method

Figure 43:
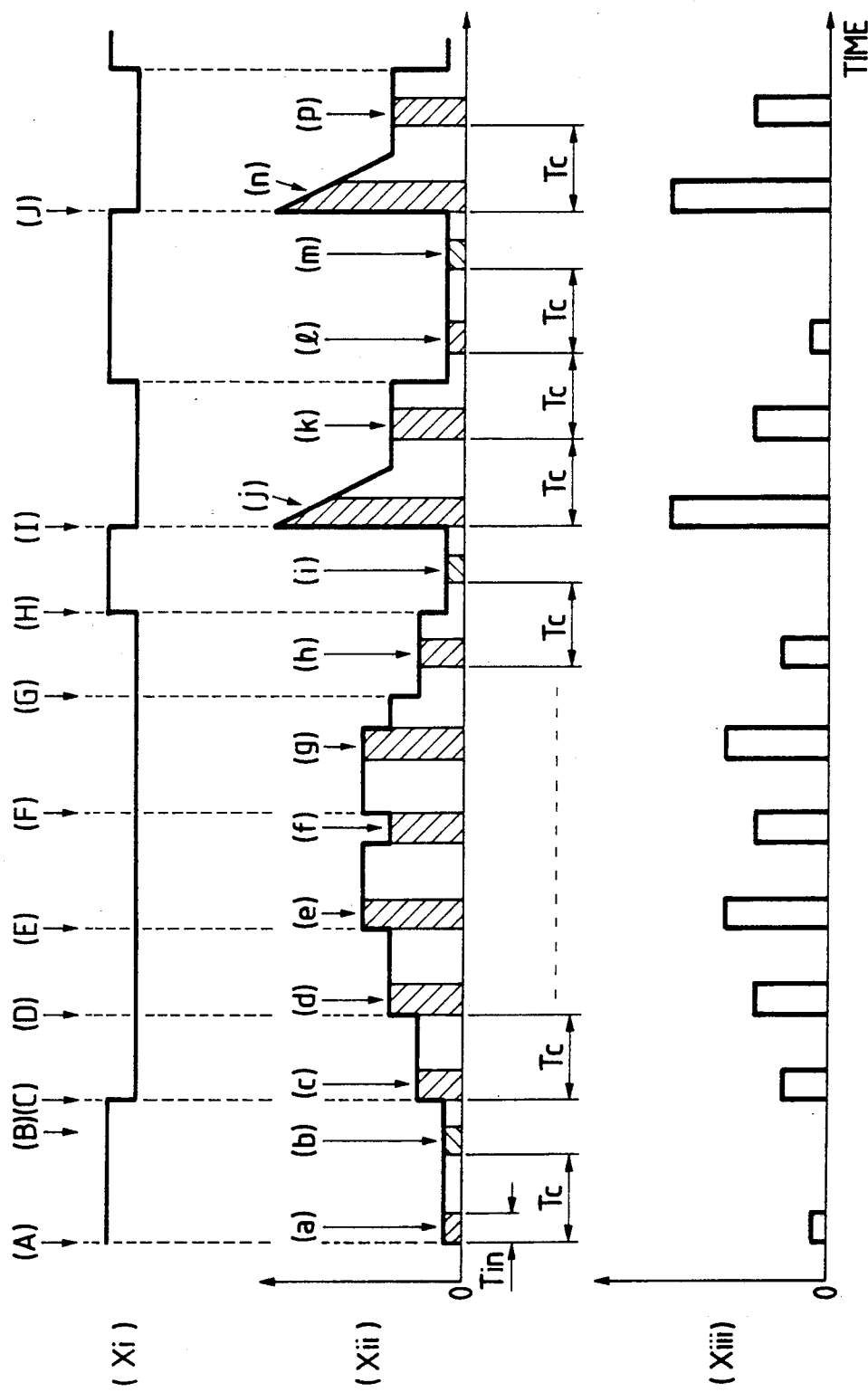
FIGS. 43 and 44 are wave form charts schematically showing examples of the charge-discharge converted signal (discharge current of secondary battery), load control timing signal in the 12th embodiment and charge-discharge converted signal after fetched in the calculation circuit.

FIG. 43 shows the load control timing signal and charge-discharge converted signal (discharge current) in case of employing the fetch start timing control method in the above-mentioned configuration, and the result of signal fetching into the calculation circuit.

In FIG. 43, (xi) indicates the load control timing signal obtained in the sequence shown in FIG. 41, employing the generating circuit 360 shown in FIG. 42. A solid-lined wave form (xii) indicates the charge-discharge converted signal (discharge current) same as (x) in FIG. 41.

In the present case, as explained in the foregoing, in response to the shift of the load control timing signal (xi) to the low level state, the normal signal fetching or calculation is interrupted and the fetching of the charge-discharge converted signal is immediately started. Then, in response to the shift of said timing signal to the high level state, there is conducted the calculation of signal fetched during said low level state, and the normal signal fetching is re-started.

Following control operations are conducted in the hatched areas in (xii):

area (a): normal fetching of charge-discharge converted signal;
area (b): normal signal fetching was intended but signal was not used because of (c);
area (c): first signal fetching by the shift of load control timing signal to low level;
areas (d)–(h): normal signal fetchings;
area (i): normal signal fetching was intended but signal was not used because of (j);
area (j): first signal fetching by the shift of load control timing signal to low level;
area (k): normal signal fetching;
area (l): normal signal fetching;
area (m): normal signal fetching was intended but signal was not used because of (n);
area (n): first signal fetching by the shift of load control timing signal to low level;
area (p): normal signal fetching.

In FIG. 43, (xiii) schematically shows the charge-discharge converted signal after being sampled into the calculation circuit.

As shown in this chart, the calculation circuit 29 can considerably exactly fetch the discharge current, which significantly varies at each release of the load control signals, particularly the surge currents of motors, so that the error in the remaining capacity can be reduced.

(2) Case of fetch period control method

Figure 44:
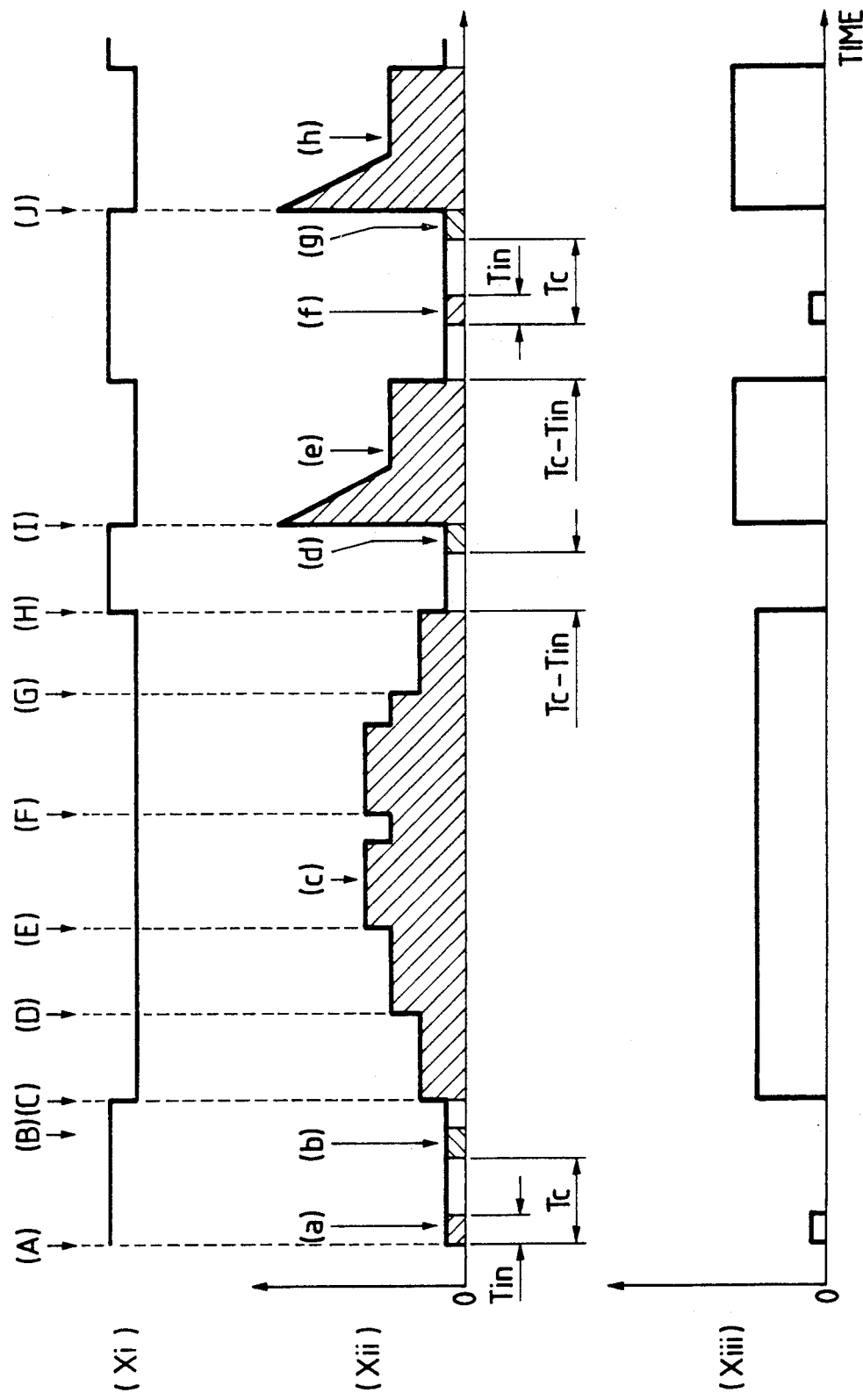

FIG. 44 shows the loaded control timing signal and charge-discharged converted signal (discharge current) in case of employing the fetch period control method in the above-mentioned configuration, and the result of signal fetching into the calculation circuit.

In FIG. 44, (xi) indicates the load control timing signal obtained in the sequence shown in FIG. 41, employing the generating circuit 360 shown in FIG. 42.

A solid-lined wave form (xii) in FIG. 44 indicates the charge-discharge converted signal (discharge current) same as (x) in FIG. 42.

In the present case, in response to the shift of the load control timing signal (xi) to the low level state, the normal signal fetching or calculation is interrupted, and there is immediately started the fetching of charge-discharge converted signal, which is continued during said low level state. Then, in response to the shift of said timing signal to the high level state, there is conducted the calculation of signal fetched during said low level state, and the normal signal fetching is then re-started.

Following control operations are conducted in the hatched areas in FIG. 44:

area (a): normal fetching of charge-discharge converted signal;
area (b): normal signal fetching was intended but signal was not used because of (c);
area (c): signal fetching continued during the low level state of load control timing signal;
area (d): normal signal fetching was intended but signal was not used because of (e);
area (e): signal fetching continued during the low level state of load control timing signal;
area (f): normal signal fetching;
area (g): normal signal fetching was intended but signal was not used because of (h);
area (h): signal fetching continued during the low level state of load control timing signal.

In FIG. 44, (xiii) schematically shows the charge-discharge converted signal after being sampled into the calculation circuit.

As shown in this chart, the calculation circuit 29 can considerably exactly fetch the discharge current, which significantly varies at each release of the load control signals, particularly the surge currents of motors, so that the error in the remaining capacity can be reduced.

While the secondary battery pack 1 is detached from the camera body 2 (the pack being left along or charged in connection with the charger 3), the calculation circuit 29 effects normal fetching of the charge-discharge converted signal, as the control input terminal CTRL is in the high level state.

In the present embodiment, the load control timing signal is generated by the logic product of six load control signals, namely the leading curtain solenoid control signal 370A, trailing curtain solenoid control signal 370B, release solenoid control signal 370C, diaphragm solenoid control signal 370D, charging motor control signal 370E and film winding motor control signal 370F, but if there are other load control signals, they are naturally included in the logic product.

Also in the present embodiment, the load control timing signal is generated by the logic product of all the load control signals, but it is also possible to disregard the load control signals except for those corresponding to loads showing a significant current variation within a short period, such as motors. Stated differently, except for the loads showing a significant current variation within a short time, the charge-discharged converted signal may be fetched in the normal routine for remaining capacity calculation.

As an example, in the configuration shown in FIG. 40, there may be considered the charging motor control signal 370E and the film winding motor control signal 370F only. Thus, in the circuit shown in FIG. 42, the 6-input AND gate 365 may be replaced by a two-input AND gate receiving said charging motor control signal 370E and film winding motor control signal 370F.

In the course of the signal fetching or the calculation explained above, the correct remaining capacity at the point is not yet determined. Therefore, in such period, the display on the display unit 12 (31) included in the display circuit 31 may be caused to intermittently flash, by a known method. This mode is likewise applicable to the 13th, 14th or 15th embodiment to be explained later.

13th Embodiment

Figure 45:
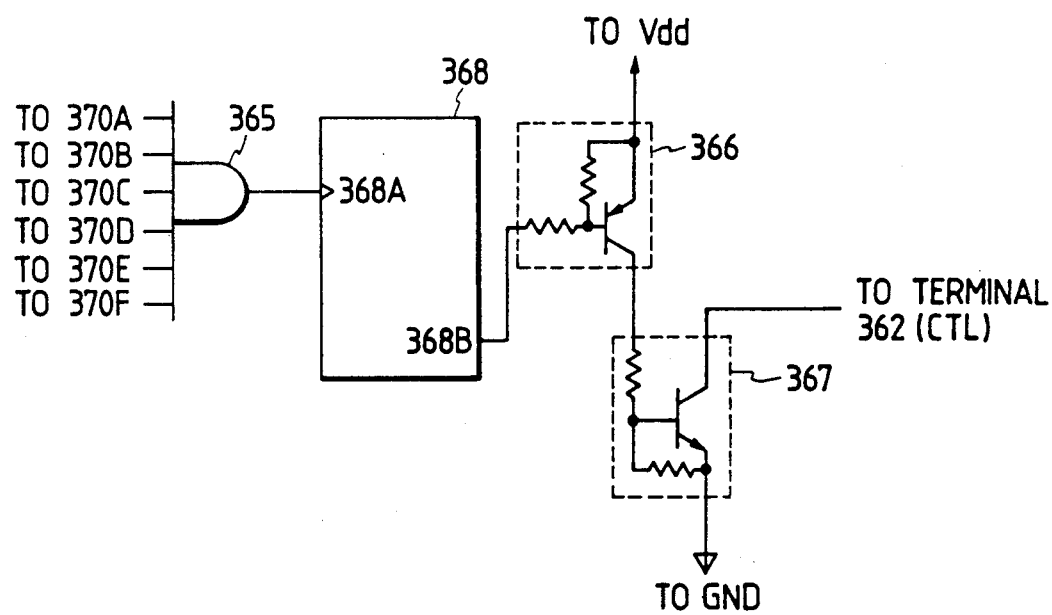
FIG. 45 is a circuit diagram of a load control timing signal generating circuit of the 13th embodiment of the present invention.
Figure 46:
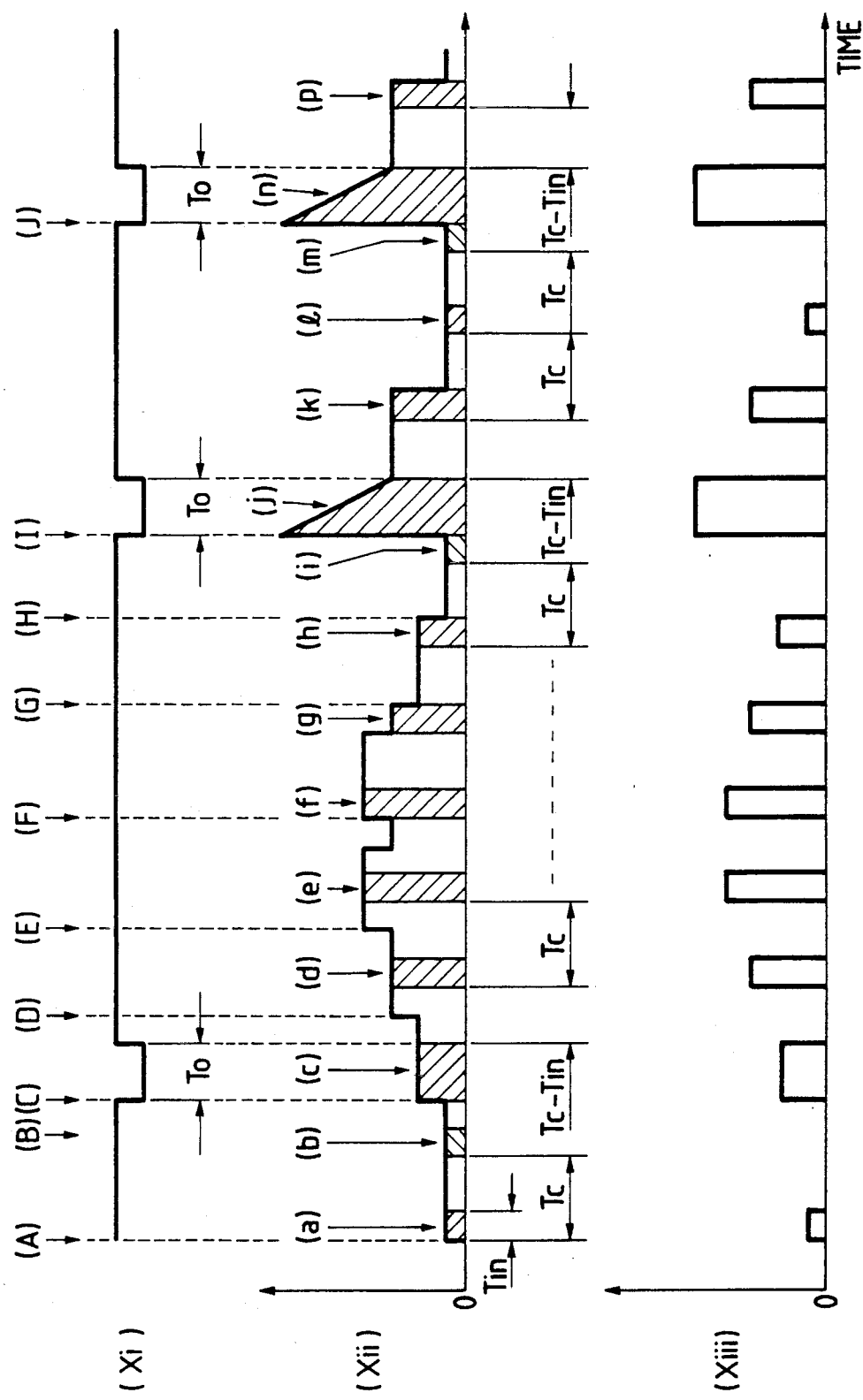
FIG. 46 is a wave form chart schematically showing the charge-discharge converted signal (discharge current of secondary battery), load control timing signal in the 13th embodiment and charge-discharge converted signal after fetched in the calculation circuit.

FIGS. 45 and 46 illustrate a 13th embodiment of the present invention.

In this embodiment, the load control timing signal is shifted to the low level state for a predetermined period To, in response to the shift of any of the load control signals from the high to low level state, in contrast to the foregoing 12th embodiment in which said load control timing signal is shifted to the low level state during the low level state of any of the load control signals.

Therefore, when any of the load elements is activated, the load control timing signal assumes the low level state only during a predetermined period To.

Figure 39:
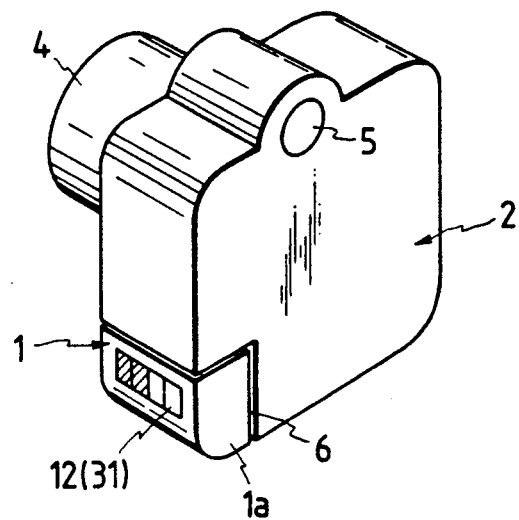
FIG. 39 is a schematic perspective view, showing a mounted state of the battery system shown in FIG. 38.

The structure of the secondary battery pack 1, camera body 2 and charger 3 will not be explained since it is same as that shown in FIGS. 38 and 39. The electrical circuit is same as that shown in FIG. 40.

FIG. 45 shows the detailed structure of an example of the circuit 360 for generating the load control timing signal shown in FIG. 40.

As already explained in relation to FIG. 40, the load control timing signal (indicating the start of load control in this case) is generated by the load control signals supplied from the control circuit 370 to the load drive circuits.

The voltage Vdd is supplied to the unrepresented power supply port of a 6-input AND gate 365 and to the emitter of a resistor-incorporated transistor 366. Six input ports of the AND gate 365 respectively receive the load control signals shown in FIG. 40, namely the leading curtain solenoid control signal 370A, trailing curtain solenoid control signal 370B, release solenoid control signal 370C, diaphragm solenoid control signal 370D, charging motor control signal 370E and film winding motor control signal 370F. The output of said 6-input AND gate 365 is supplied to an input terminal 368A of a one-shot circuit 368, of which output terminal 368B is connected to the base of the transistor 366.

As already known, the one-shot circuit generates an output signal for a predetermined period, starting from an upshift or downshift of an input signal. The one-shot circuit 368 shown in FIG. 42 shifts the normally high output signal from the output terminal 368B to the low level state for a predetermined period To, in response to the downshift of the input signal to the input terminal 368A. The voltage Vdd is supplied to the unrepresented power supply terminal of said one-shot circuit 368. The collector of the transistor 366 is connected to the base of another resistor-incorporated transistor 367, of which emitter is grounded. Thus the output of the collector of said transistor 367 is supplied, as the load control timing signal, to the control input terminal CTRL of the calculation circuit 29, through the terminal 362 (CTL) shown in FIG. 40.

In the following there will be explained the control operations, with reference also to FIG. 40.

When the voltage Vdd is not supplied, the transistor 366 is not powered, whereby the transistors 366, 367 are both turned off and the load control timing signal assumes the high level state.

When Vdd is supplied by the activation of the DC-DC converter 363, six load control signals supplied to the 6-input AND gate 365 assume the high-level state, whereby said AND gate 365 releases a high-level signal. Consequently the transistors 366, 367 remain turned off, and the load control timing signal remains in the high-level state.

Then, when the release switch 371 is closed, the control circuit 370 releases, in succession according to the predetermined sequence explained in the 12th embodiment, the load control signals, namely the leading curtain solenoid control signal 370A, trailing curtain solenoid control signal 370B, release solenoid control signal 370D, charging motor control signal 370E and film winding motor control signal 370F, by shifting each of said signals from the high level to low and again to high. As explained before, each load element is activated during the low level state of the corresponding load control signal.

The output of the AND gate 365 is shifted to the low level only when one of the load control signals varies from the high level to the low level while other five load control signals remain at the high level. In such state the input terminal 368A of the one-shot circuit 368 is shifted from the high level state to low, whereby a low-level signal is released from the output terminal 368B for the predetermined period To.

Consequently the transistors 366, 367 are both turned on during said period To, whereby the load control timing signal assumes the low level state.

Thus, when one of the load elements is driven, the load control timing signal assumes the low level state only during said predetermined period To.

FIG. 46 shows the load control timing signal and the charge-discharge converted signal (discharge current) in case of employing the aforementioned fetch period control method in the present configuration, and the result of fetching into the calculation circuit 29.

In FIG. 46, (xi) indicates the load control timing signal obtained in the sequence shown in FIG. 41, employing the generating circuit 360 shown in FIG. 45. A solid-lined wave form (xii) indicates the charge-discharge converted signal (discharge current) same as (x) in FIG. 41.

In response to the shift of the load control timing signal (xi) to the low level state, the normal signal fetching or calculation is interrupted, and there is immediately started the fetching of charge-discharge converted signal, which is continued during said low level state. Then, in response to the shift of said timing signal to the high level state, there is conducted the calculation of signal fetched during said low level state, and the normal signal fetching is then re-started.

Following control operations are conducted in the hatched areas:

area (a): normal fetching of charge-discharge converted signal;

area (b): normal signal fetching was intended but signal was not used because of (c);

area (c): signal fetching continued during the low level state of load control timing signal;

area (d)-(h): normal signal fetchings;

area (i): normal signal fetching was intended but signal was not used because of (j);

area (j): signal fetching continued during the low level state of load control timing signal;

area (k): normal signal fetching;
area (l): normal signal fetching;
area (m): normal signal fetching was intended but signal was not used because of (n);
area (n): signal fetching continued during the low level state of load control timing signal;
area (p): normal signal fetching.

In FIG. 46, (xiii) schematically shows the charge-discharge converted signal after being sampled into the calculation circuit.

As shown in this chart, the calculation circuit 29 can considerably exactly fetch the discharge current, which significantly varies at each release of the load control signals, particularly the surge currents of motors, so that the error in the remaining capacity can be reduced.

Also the aforementioned fetch start timing control method may be employed likewise, though no further explanation will be given on this case.

Also as already explained in the 12th embodiment, the load control signals may be disregarded except those corresponding to the loads showing significant current variations within a short period, such as motors. Stated differently, except for the loads showing a significant current variation within a short time, the charge-discharge converted signal may be fetched in the normal routine for remaining capacity calculation.

As an example, in the configuration shown in FIG. 40, there may be considered the charging motor control signal 370E and the film winding motor control signal 370F only. Thus, in the circuit shown in FIG. 45, the 6-input AND gate 365 may be replaced by a two-input AND gate receiving said charging motor control signal 370E and film winding motor control signal 370F.

14th Embodiment

Figure 47:
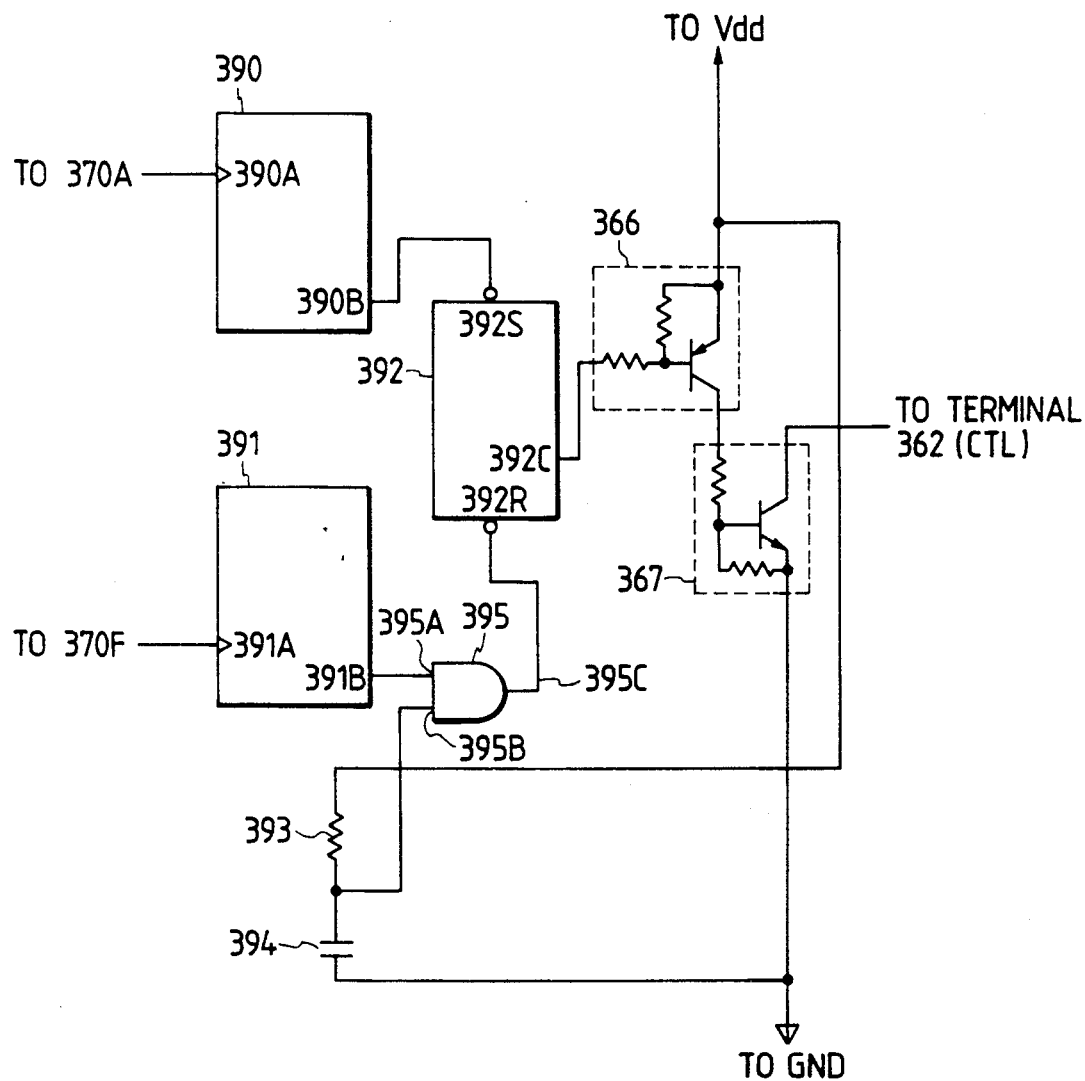
FIG. 47 is a circuit diagram of a load control timing signal generating circuit of the 14th embodiment.
Figure 48:
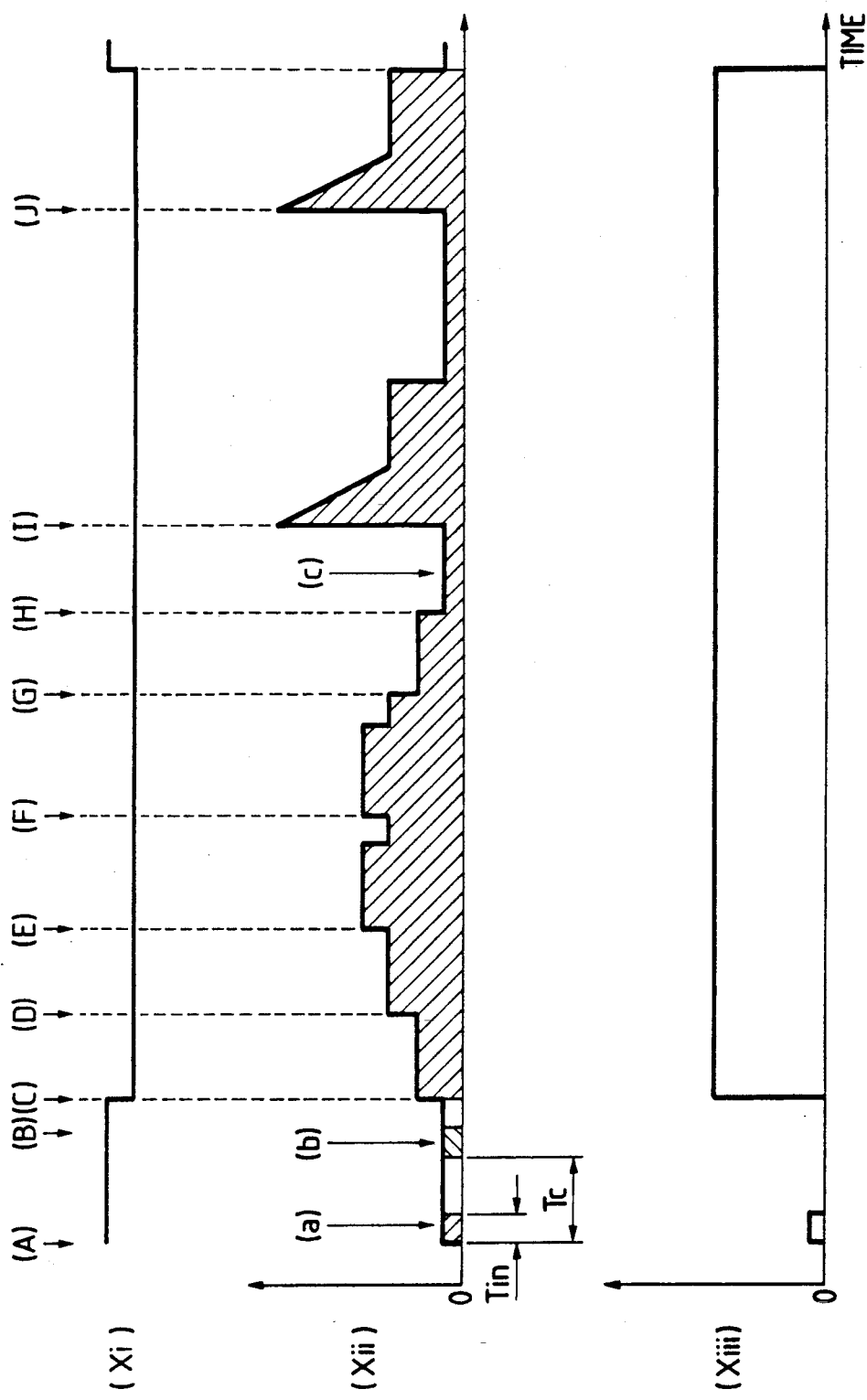
FIG. 48 is a wave form chart schematically showing the charge-discharge converted signal (discharge current of secondary battery), load control timing signal in the 14th embodiment and charge-discharge converted signal after fetched in the calculation circuit.

FIGS. 47 and 48 illustrate a 14th embodiment of the present invention, in which the load control timing signal is shifted to the low level state, not in response to the each shift of the load control signals to the low level state as in the foregoing 12th embodiment, but during the release sequence consisting of the steps (C) to (J) in the 12th embodiment.

The structure of the present embodiment is same as that shown in FIGS. 38 and 39, and the electrical circuit is same as that shown in FIG. 40, so that they will not be explained further.

FIG. 47 shows the details of an example of the circuit 360, shown in FIG. 40, for generating the load control timing signal.

In the following there will be explained the structure and control operations of said generating circuit 360, with reference also to FIG. 40.

As already explained in relation to FIG. 40, the load control timing signal (indicating the duration of release sequence in this case) is generated from the load control signals supplied from the control 370 to the load drive circuits. A voltage Vdd is supplied to the emitter of a resistor-incorporated transistor 366. The leading curtain solenoid control signal 370A, shown in FIG. 40, is supplied to an input terminal 390A of a one-shot circuit 390, which shifts are normally high output signal from an output terminal 390B to the low level state during a predetermined period To1, starting from a level downshift of the input terminal 390A. Said output terminal 390B is connected to a set terminal 392S of an RS flip-flop 392.

The input terminal 391A of a one-shot circuit 391 receives the film winding motor control signal 370F shown in FIG. 40. Said one-shot circuit 391 shifts the normally high output signal from the output terminal 391B to the low level state for a predetermined period To2, starting from a level upshift of the input terminal 391A. The output terminal 391B of said one-shot circuit 391 is connected to an input terminal 395A of a two-input AND gate 395.

The other input terminal 395B of said 2-input AND gate 395 is connected to a resistor 393 and a capacitor 394, and the other end of said resistor 393 is connected to a line supplying the voltage Vdd, while the other end of said capacitor 394 is grounded. The output terminal 395C of the 2-input AND gate 395 is connected to the reset terminal 392R of said RS flip-flop 392, of which output terminal 392C is connected to the base of the resistor-incorporated transistor 366. Said RS flip-flop 392 is low active type, and, as already know, when a low-level signal is once given to the set terminal 392S, the output terminal 392C is latched at the low-level state (setting), while when a low-level signal is once given to the reset terminal 392R, said output terminal 392C is latched at the high-level state (resetting). The voltage Vdd is supplied to unrepresented power supply terminals of the RS flip-flop 392, and one-shot circuits 390, 391. The collector of the transistor 366 is connected to the base of another resistor-incorporated transistor 367, of which emitter is grounded. Thus the collector output of said transistor 367 is supplied, as the load control timing signal, to the control input terminal CTRL of the calculation circuit 29, through the terminal 362 (CTL) shown in FIG. 40.

When the voltage Vdd is not supplied, the transistor 366 is not powered, whereby the transistors 366, 367 are both turned off and the load control timing signal assumes the high level state. When the voltage Vdd is supplied by the activation of the DC-DC converter 363, the input terminal 395B of the 2-input AND gate 395 assumes the low level state for a period determined by the time constant of the resistor 393 and the capacitor 394, whereby the reset terminal 392R of the RS flip-flop 392 is shifted to the low level state for a predetermined period and the output terminal 392C thereof assumes the high-level state. Thus the transistors 366, 367 remain turned off, and the load control timing signal remains in the high level state.

When the release switch 371 is closed, according to the predetermined release sequence, consisting of the steps (C) to (J) explained in the 12th embodiment, the control circuit 370 at first shifts the leading curtain solenoid control signal 370A to the low level state.

Thus the input terminal 390A of the one-shot circuit 390 is shifted to the low level, whereby the output terminal 390B thereof is shifted to the low level state during the period To1. This output signal maintains the set terminal 392S of the RS flip-flop 392 at the low level for said period To1, thereby setting said flip-flop 392 and obtaining a low-level signal from the output terminal 392C thereof. Consequently the transistors 366, 367 are both turned on and the load control timing signal is shifted to the low level.

Thereafter, according to said release sequence, the control circuit 370 releases the trailing curtain solenoid control signal 370B, release solenoid control signal 370C, diaphragm solenoid control signal 370D, and charging motor control signal 370E in succession, by shifting each signal from the high level state to low and again to high.

Then, at the end of the release sequence, the film winding motor control signal 370F is shifted from the high level state to low, and then to high. Thus the input terminal 391A of the one-shot circuit 391 is shifted from the low level state to high, and the output terminal 391B releases a low level signal for the period To2.

This maintains the reset terminal 392R of the RS flip-flop 392 at the low level for said period To2, thereby resetting said RS flip-flop 392 and obtaining a high level output from the output terminal 392C thereof. Consequently the transistors 366, 367 are both turned off, and the load control timing signal assumes the high level state.

FIG. 48 shows the load control timing signal and the charge-discharge converted signal (discharge current) in case of employing the aforementioned fetch period control method in the present configuration, and the result of fetching into the calculation circuit 29.

In FIG. 48, (xi) indicates the load control timing signal obtained in the sequence shown in FIG. 41, employing the generating circuit 360 shown in FIG. 47.

A solid-lined wave form (xii) indicates the charge-discharge converted signal (discharge current) same as (x) in FIG. 41.

As explained before, in response to the shift of the load control timing signal (xi) to the low level state, the normal signal fetching or calculation is interrupted, and there is immediately started the fetching of charge-discharge converted signal, which is continued during said low level state. Then, in response to the shift of said timing signal to the high level state, there is conducted the calculation of signal fetched during said low level state, and the normal signal fetching is then re-started.

Following control operations are conducted in the hatched areas:

area (a): normal fetching of charge-discharge converted signal;

area (b): normal signal fetching was intended, but signal was not used because of (c);

area (c): signal fetching continued during the low level state of load control timing signal.

In FIG. 48, (xiii) schematically shows the charge-discharge converted signal after being sampled into the calculation circuit.

As shown in this chart, the calculation circuit 29 can considerably exactly fetch the discharge current, which significantly varies at each release of the load control signals, particularly the surge currents of motors, so that the error in the remaining capacity can be reduced.

Also the aforementioned fetch start timing control method may be employed likewise, though no further explanation will be given on this case.

Also as already explained in the 12th embodiment, the load control signals may be disregarded except those corresponding to the loads showing significant current variations within a short period, such as motors. Stated differently, except for the loads showing a significant current variation within a short time, the charge-discharge converted signal may be fetched in the normal routine for remaining capacity calculation. As an example, in the configuration shown in FIG. 40, there may be considered the charging motor control signal 370E and the film winding motor control signal 370F only. Thus, in FIG. 47, the input terminal 390A of the one-shot circuit 390 may be given the charging motor control signal 370E instead of the leading curtain solenoid control signal 370A.

15th Embodiment

Figure 49:
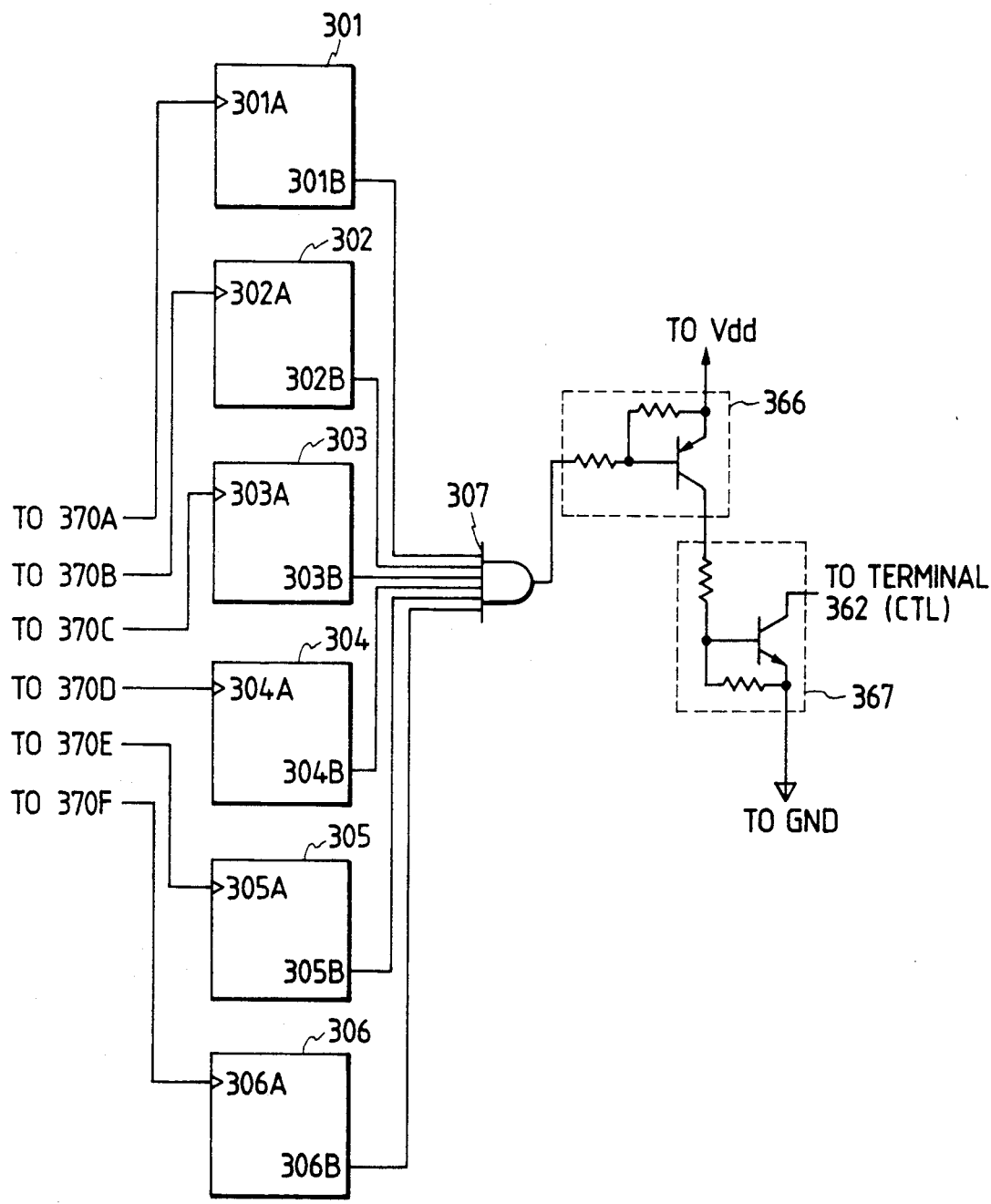
FIG. 49 is a circuit diagram of a load control timing signal generating circuit in the 15th embodiment.
Figure 50:
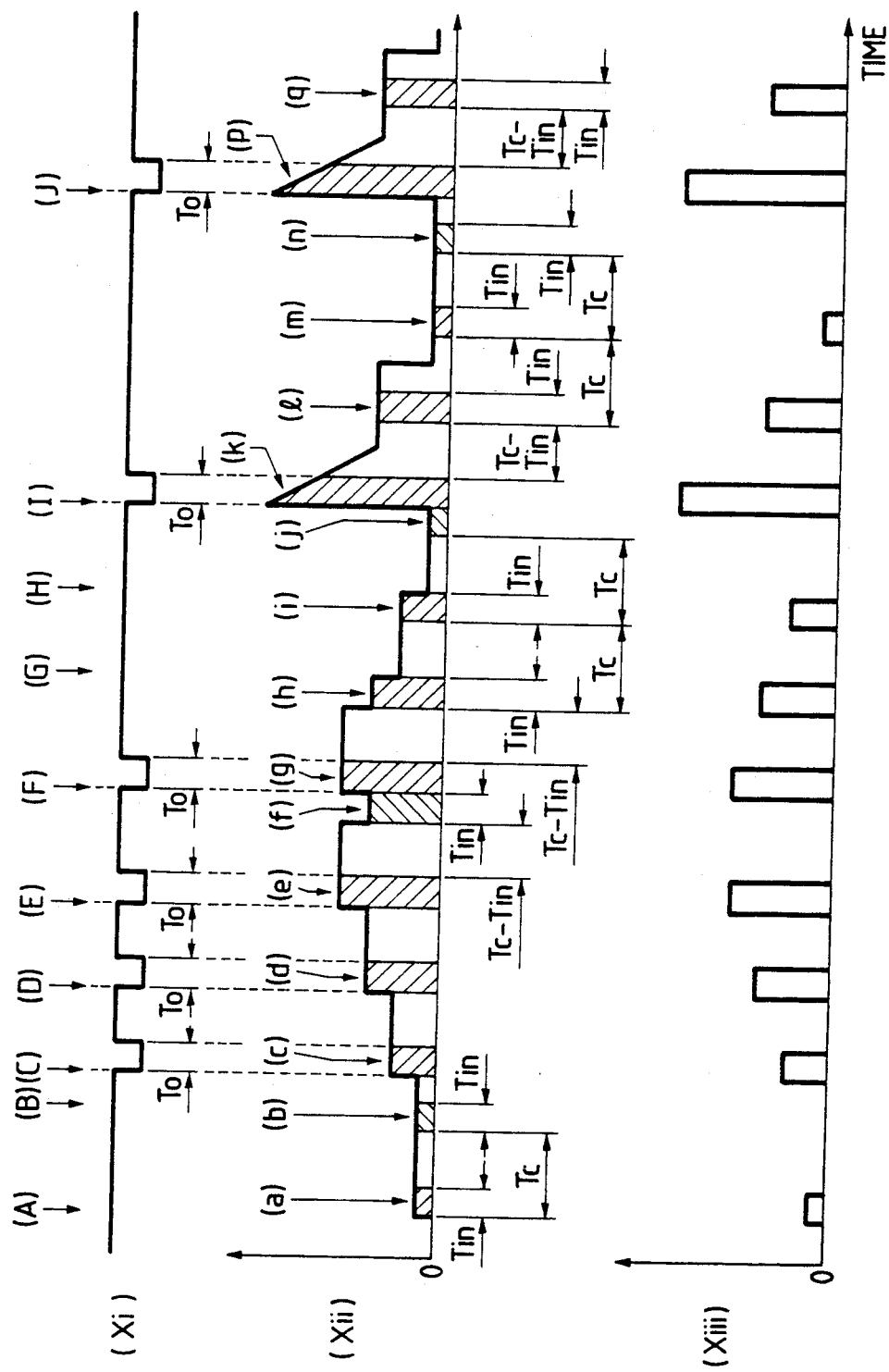
FIG. 50 is a wave form chart schematically showing the charge-discharge converted signal (discharge current of secondary battery), load control timing signal in the 15th embodiment and charge-discharge converted signal after fetched in the calculation circuit.

FIGS. 49 and 50 illustrate a 15th embodiment of the present invention, in which the load control timing signal is shifted to the low level state for a period Tol in response to the change of each load control signal to the low level state, instead of shift of the load control timing signal to the low level state for the period To in response, as in the 13th embodiment, to a shift of the logic product of the load control signals to the low level state.

Thus, in response to the activation of any of the load elements, the load control timing signal is shifted to the low level only during the predetermined period To.

The structure of the present embodiment is same as that shown in FIGS. 38 and 39, and the electrical circuit is same as that shown in FIG. 40, so that they will not be explained further.

FIG. 49 shows the details of an example of the circuit 360, shown in FIG. 40, for generating the load control timing signal.

As already explained in relation to FIG. 40, the load control timing signal (indicating the start of load control in this case) is generated from the load control signals supplied from the control circuit 370 to the load drive circuits.

A voltage Vdd is supplied to an unrepresented power supply terminal of a 6-input AND gate 307, to the emitter of a resistor incorporated transistor 366, and to unrepresented power supply terminals of one-shot circuits 301-306, of which input terminals 301A, 302A, 303A, 304A, 305A, 306A respectively receive the six load control signals shown in FIGS. 40, namely the leading curtain solenoid control signal 370A, trailing curtain solenoid control signal 370B, release solenoid control signal 370C, diaphragm solenoid control signal 370D, charging motor control signal 370E and film winding motor control signal 370F.

The output terminals 301B-306B of said one-shot circuits 301-306 are connected to input terminals of a 6-input AND gate 307, of which output terminal is connected to the base of a resistor-incorporated transistor 366.

The one-shot circuit 301 shown in FIG. 49 shifts the normally high output signal from the output terminal 301B to the low level state for a predetermined period To, from a level downshift at the input terminal 301A. Other one-shot circuits 302-306 function in a similar manner.

The collector of said transistor 366 is connected to the base of another resistor-incorporated transistor 367, of which emitter is grounded. Thus the collector output of said transistor 367 is supplied, as the load control timing signal, to the control input terminal CTRL of the calculation circuit 29, through the terminal 362 (CTL) shown in FIG. 40.

In the following there will be explained control operations, with reference also to FIG. 40.

When the voltage Vdd is not supplied, the transistor 366 is not powered, whereby the transistors 366, 367 are both turned off and the load control timing signal remains in the high level state.

When the voltage Vdd is supplied by the activation of the DC-DC converter 363, the six load control signal supplied to the input terminals 301A-306A of the one-shot circuits 301-306 are shifted to and retained at the high level state, so that they provide all high-level output signals from the output terminals 301B-306B. Thus receiving six high-level input signals, the AND gate 307 releases a high-level output signal, whereby the transistors 366, 367 remain turned off and the load control timing signal remains at the high level state.

When the release switch 371 is closed, the control circuit 370 releases in succession, according to the release sequence explained in the 12th embodiment, the load control signals, namely the leading curtain solenoid control signal 370A, trailing curtain solenoid control signal 370B, release solenoid control signal 370C, diaphragm solenoid control signal 370D, charging motor control signal 370E and film winding motor control signal 370F by shifting each signal from the high level state to low, and then to high. As explained before, each load element is activated during the low level state of the corresponding load control signal.

When any of the load control signals assumes the low level state, the input terminal of the corresponding one-shot circuit is shifted from the high level state to low, whereby the corresponding output terminal releases a low-level signal during the period To.

For example, when the leading curtain solenoid control signal 370A assumes the low level state, the input terminal 301A of the corresponding one-shot circuit 301 is correspondingly shifted, whereby the corresponding output terminal 301B releases a low-level signal during said period To. Thus the output signal of the AND gate 307 assumes the low level state during said period To, whereby the transistors 366, 367 are both turned on and the load control timing signal assumes the low level state.

Thus, when any of the load elements is activated, the load control timing signal is shifted to the low level state only during the predetermined period To.

FIG. 50 shows the load control timing signal and the charge-discharge converted signal (discharge current) in case of employing the aforementioned fetch period control method in the present configuration, and the result of fetching into the calculation circuit 29.

In FIG. 50, (xi) indicates the load control timing signal obtained in the sequence shown in FIG. 41, employing the generating circuit 360 shown in FIG. 49.

A solid-lined wave form (xii) indicates the charge-discharge converted signal (discharge current) same as (x) in FIG. 41.

As explained before, in response to the shift of the load control timing signal (xi) to the low level state, the normal signal fetching or calculation is interrupted, and there is immediately started the fetching of charge-discharge converted signal, which is continued during said low level state. Then, in response to the shift of said timing signal to the high level state, there is conducted the calculation of signal fetched during said low level state, and the normal signal fetching is then re-started.

Following control operations are conducted in the hatched areas:

(a) normal fetching of charge-discharge converted signal;

area (b): normal signal fetching was intended, but signal was not used because of (c);

area (c): signal fetching continued during the low level state of load control timing signal for a period To;

area (d): signal fetching continued during the low level state of load control timing signal for a period To;

area (e): signal fetching continued during the low level state of load control timing signal for a period To;

area (f): normal signal fetching was intended, but signal was not used because of (g);

area (g): signal fetching continued during the low level state of load control timing signal for a period To;

area (h): normal signal fetching;

area (i): normal signal fetching;

area (j): normal signal fetching was intended, but signal was not used because of (k);

area (k): signal fetching continued during the low level state of load control timing signal for a period To;

area (l): normal signal fetching;

area (m): normal signal fetching;

area (n): normal signal fetching was intended, but signal was not used because of (p);

area (p): signal fetching continued during the low level state of load control timing signal;

area (q): normal signal fetching.

In FIG. 50, (xiii) schematically shows the charge-discharge converted signal after being sampled into the calculation circuit 29.

As shown in this chart, the calculation circuit 29 can considerably exactly fetch the discharge current, which significantly varies at each release of the load control signals, particularly the surge currents of motors, so that the error in the remaining capacity can be reduced.

In the present embodiment, the low level output period To is selected equal for all the one-shot circuits, but it may also be varied from circuit to circuit. For example, the low level output period may be made longer only in the one-shot circuit 305, receiving the charging motor control signal 370E, in order to securely fetch the surge current of the charging motor.

Also in the present embodiment, the load control timing signal is generated by detecting the downshift of the load control signals, but there may be added the detection of upshift of the load control signals, by employing corresponding one-shot circuits. Such configuration allows to detect the variation in discharge current resulting from the end of load control.

Furthermore, there may also be employed the aforementioned fetch start timing control method, though such configuration will not be explained further.

Also as already explained in the 12th embodiment, the load control signals may be disregarded except those corresponding to the loads showing significant current variations within a short period, such as motors. Stated differently, except for the loads showing a significant current variation within a short time, the charge-discharge converted signal may be fetched in the normal routine for remaining capacity calculation. As an example, in the configuration shown in FIG. 40, there may be considered the charging motor control signal 370E and the film winding motor control signal 370F only. Thus, in the configuration shown in FIG. 49, the one-shot circuits 301-304 may be dispensed with, and there may be provided a one-shot circuit 305 for receiving the charging motor control signal 370E, a one-shot circuit 306 for receiving the film winding motor control signal 370F, and a 2-input AND gate receiving the outputs of said one-shot circuits, instead of the 6-input AND gate 307.

In the battery systems of the foregoing 12th to 15th embodiments, there are provided means for calculating and displaying the remaining capacity of a secondary battery, load means, load control means for on-off control of each load means; and generation means for generating a load control timing signal, indicating the control state of said load means, based on a signal supplied from the load control means to the load means, wherein said load control timing signal from said generation means is transmitted to the means for calculating the remaining capacity of secondary battery, thereby controlling the timing of detection, fetching and calculation of the charge-discharge signal in said calculating means. Thus there can be obtained an excellent effect of correctly calculating and displaying the remaining capacity of the secondary battery, despite of a simple configuration.

More specifically, according to the present invention, when the load control timing signal is shifted to the low level state, the calculation circuit interrupts the normal process of fetching of the charge-discharge converted signal or of calculation and immediately effects fetching of said converted signal. Then, when the load control timing signal is shifted to the high level state, there is conducted the calculation of said signal fetched during said low level state, and the normal signal fetching operation is then restarted. Consequently the calculation circuit can considerably exactly fetch the discharge current which significantly varies at each release of the load control signals, particularly the surge currents of motors, and the correct calculation of the remaining capacity is rendered possible.

Consequently the present invention can avoid the drawbacks that the remaining capacity is very low and is unable to drive the loads though the display circuit indicates a still large remaining capacity of the secondary battery, or that the display circuit indicates a zero remaining capacity while the secondary battery still has a sufficiently high remaining capacity.

For example, as in the 12th embodiment, the load control timing signal can be shifted to the low level state during the low level state of the load control signals. In this manner it is rendered possible to take the discharge current, significantly varying at the release of each load control signal, exactly into the calculation circuit, thereby reducing the error in the remaining capacity.

Also as in the 13th embodiment, the load control timing signal can be shifted to the low level state during a predetermined period To in response to the shift of the logic product of the load control signals to the low level state. Thus the load control timing signal can be shifted to the low level state for said predetermined period To, when any of the load elements is driven. It is thus rendered possible to take the initial varying portion of the discharge current, varying significantly at the release of each load control signal, particularly the surge currents for motors, into the calculation circuit in a considerably exact manner, thereby reducing the error in the calculation of remaining capacity.

Also as in the 14th embodiment, the load control timing signal can be shifted to the low level state during a shutter release sequence. It is thus rendered possible to take all the charge-discharge converted signal during said release sequence, in which the discharge current shows significant variations, into the calculation circuit, thereby reducing the error in the calculation of remaining capacity.

Also as in the 15th embodiment, the load control timing signal can be shifted to the low level state for a predetermined period To, in response to the shift to the low level state in any of the load control signals, whereby said load control timing signal assumes the low level state only during said period. To when any of the load element is driven. It is thus rendered possible to take the initial varying portion of the discharge current, varying significantly at the release of each load control signal, particularly the surge currents of motors, into the calculation circuit in considerably exact manner, thereby reducing the error in calculation of the remaining capacity.

The present invention is not limited to the foregoing embodiments but is subject to variations or modifications in the form and/or structure of the camera body, battery pack, charger etc. For example, the secondary battery in the foregoing embodiments is composed of nickel-cadmium battery, but similar effects can naturally be obtained with other re-usable batteries such as a lead battery.

Also the position and direction of mounting of the battery pack in the camera body are naturally not limited to the structure of the foregoing embodiments in which the pack is mounted laterally in the lower part of the camera body.

What is claimed is:

1. A battery system for use in a camera, comprising:
a camera body; and
a battery pack to be detachably mounted to the camera body;
the battery pack including:
a reusable secondary battery;
calculation means for calculating the amount of charge and discharge of said secondary battery; and
output means for releasing a signal indicating the remaining capacity of said secondary battery, obtained by said calculation; and
the camera body including:
means for receiving said signal, indicating the remaining capacity, from said output means; and
means for displaying the remaining capacity of the secondary battery, based on said signal indicating the remaining capacity.

2. A camera body to which detachably mountable is a battery pack including a reusable secondary battery, calculation means for calculating the amount of charge and discharge of said secondary battery, and output means for releasing a signal, indicating the remaining capacity of the secondary battery, obtained from the result of said calculation, the camera body comprising:
means for receiving the signal, indicating the remaining capacity, from said output means; and
means for displaying the remaining capacity of battery, based on said signal indicating the remaining capacity.

3. A battery system for use in a camera, comprising:
a camera body;
first battery means including a reusable secondary battery, calculation means for calculating the amount of charge and discharge of said secondary battery and output means for releasing a signal indicating the remaining capacity of the secondary battery obtained from the result of said calculation; and
second battery means including a non-reusable primary battery;
the first battery means and the second battery means being selectively mountable to the camera body;
the camera body including:
means for identifying the kind of mounted battery means;
check means for checking the remaining capacity of the primary battery of said second battery means and releasing a signal indicating the remaining capacity of said primary battery;

means for receiving said signal, indicating the remaining capacity of said secondary battery, from said output means; and display means for displaying the remaining capacity of said primary or secondary battery;

wherein said display means is adapted to display the remaining capacity of the secondary battery, based on said signal indicating the remaining capacity thereof, when the first battery means is mounted to said camera body, or the remaining capacity of the primary battery, based on said signal indicating the remaining capacity thereof, when the second battery means is mounted to said camera body.

4. A battery pack to be detachably mounted to a camera body, comprising:

a reusable secondary battery;

means for calculating the amount of charge and discharge of said secondary battery; and display means for displaying the remaining capacity of the secondary battery, obtained from the result of said calculation;

wherein the display of said display means being observable from the rear side of the camera body when the battery pack is mounted to the camera body.

5. A battery pack according to claim 4, further comprising:

first control means for manually controlling the function of said display means; and second control means for causing said display means to function in relation to the connecting operation of said battery pack to a camera body or a charger.

6. A camera body to which first battery means including a reusable secondary battery, calculation means for calculating the amount of charge and discharge of said battery, and display means for displaying the remaining capacity of the secondary battery obtained from the result of said calculation, and second battery means including a non-reusable primary battery are selectively mountable, the camera body comprising:

second display means adapted to said second battery means and capable of checking and displaying the remaining capacity of said primary battery;

detection means for detecting that said first battery means is mounted to the camera body; and control means for controlling said second display means in response to the output of said detection means.

7. A battery system for use in a camera, comprising:

a camera body; and a battery pack detachably mountable to the camera body and including a reusable secondary battery and information memory means;

the camera body including:

communication means for communicating with said information memory means;

calculation means for calculating the amount of charge and discharge of said secondary battery; and displaying means for displaying the remaining capacity of the secondary battery, obtained from the result of said calculation;

wherein information indicating the remaining capacity of the secondary battery and stored in said information memory means is transmitted to said calculation means through said communication means when the battery pack is mounted to the camera body, and information, indicating the remaining capacity of the secondary battery, obtained in said calculation means is transmitted to said information memory means through said communication means.

8. A battery system according to claim 7, wherein said camera body further includes means for detecting the mounting and detaching of the battery pack to and from the camera body and respectively releasing first and second timing signals in response to said detections, wherein, in response to said first timing signal, the information stored in said information memory means and indicating the remaining capacity of the secondary battery is transmitted to said calculation means, and the information indicating the remaining capacity of the secondary battery, obtained in said calculation means is transmitted to and memorized in said information memory means.

9. A battery system for use in a camera, comprising:

a camera body; and a battery pack detachably mountable to the camera body and including a reusable secondary battery and information memory means;

the camera body including;

communication means for communicating with said information memory means;

calculation means for calculating the amount of charge and discharge of said secondary battery;

displaying means for displaying the remaining capacity of the secondary battery, obtained from the result of said calculation; and clock means;

wherein, when the battery pack is mounted to the camera body, the information indicating the remaining capacity of the secondary battery and the time data, both stored in said information memory means, are transmitted through said communication means to said calculation means, which calculates the amount of spontaneous discharge of the secondary battery from said time data and the current time indicated by said clock means, and determines the remaining capacity of the secondary battery from said spontaneous discharge amount and said amount of charge and discharge; and the information indicating the remaining capacity of the secondary battery, obtained in said calculation means, and the time data are transmitted through said communication means and stored in said information memory means.

10. A battery system for use in a camera, comprising:

a camera body;

a battery pack detachably mountable to the camera body and including a reusable secondary battery chargeable with a charger, and information memory means; and a battery charger including first communication means for communicating with said information memory means, and first calculation means for calculating amount of charging of the secondary battery;

the camera body including;

second communication means for communicating with said information memory means; second calculation means for calculating the amount of discharge of said secondary battery; and display means for displaying the remaining capacity of the secondary battery, obtained by said calculation means;

wherein, when the charger is connected to the battery pack, the information indicating the remaining capacity of the secondary battery and stored in said information memory means is transmitted through said first communication means to said first calculation means, and the information indicating the remaining capacity of the secondary battery after charging, obtained from said first calculation means is transmitted to and stored in said information memory means; and when the battery pack is mounted to the camera body, the information indicating the remaining capacity of the secondary battery and stored in said information memory means is transmitted through said second communication means to said second calculation means, and the information indicating the remaining capacity of the secondary battery, obtained by said second calculation means is transmitted by said second calculation means is transmitted to and stored in said information memory means.

11. A battery system for use in a camera, comprising:
a camera body;
a battery pack detachably mountable to the camera body and including a reusable secondary battery chargeable with a charger, clock means and information memory means; and
a battery charger including first communication means for communicating with said information memory means and first calculation means for calculating the amount of charging of the secondary battery;
the camera body including;
second communication means for communicating with said information memory means;
second calculation means for calculating the amount of discharge of said secondary battery; and
display means for displaying the remaining capacity of the secondary battery, obtained by said calculation means;
wherein, when the charger is connected to the battery pack, the information indicating the remaining capacity of the secondary battery and time data, both stored in said information memory means, are transmitted through said first communication means to said first calculation means, which calculates the amount of spontaneous discharge of the secondary battery based on the time data and determines the remaining capacity of the secondary battery based on said spontaneous discharge amount and said amount of discharge, and the remaining capacity of the secondary battery obtained in said second calculation means is transmitted to and stored in said information memory means.

12. A camera system comprising:
a camera body; and
a battery pack detachably mountable to the camera body, including a reusable secondary battery, measurement means for measuring the amount of charge and discharge of said secondary battery, calculation means for calculating the remaining capacity of the secondary battery based on the result of measurement by said measurement means, and display means for displaying the remaining capacity of said secondary battery;
the camera body including;
load means for consuming the current supplied from said secondary battery;
control means for effecting on-off control of said load means; and
signal generating means for generating a timing signal indicating the control timing of said control means;
wherein the function timing of said measurement means and said calculation means is controlled according to said timing signal.

13. A camera system according to claim 12, wherein said timing signal controls the start timing of measurement of the amount of the charge and discharge by said measurement means.

14. A camera system according to claim 12, wherein said timing signal controls the timing from start to end of measurement of the amount of charge and discharge by said measurement means.

* * * * *